(12) United States Patent
Kondo et al.

(10) Patent No.: US 7,705,525 B2
(45) Date of Patent: Apr. 27, 2010

(54) MULTI-LAYER PIEZOELECTRIC ELEMENT AND METHOD FOR MANUFACTURING THE SAME

(75) Inventors: Mitsuo Kondo, Kirishima (JP); Masaki Terazono, Kirishima (JP); Takeshi Okamura, Kirishima (JP); Katsushi Sakaue, Kirishima (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 12/467,901

(22) Filed: May 18, 2009

(65) Prior Publication Data

US 2009/0224636 A1  Sep. 10, 2009

Related U.S. Application Data

(62) Division of application No. 10/598,680, filed as application No. PCT/JP2005/004097 on Mar. 9, 2005, now Pat. No. 7,554,251.

(30) Foreign Application Priority Data

| Mar. 9, 2004 | (JP) | ............................. 2004-065725 |
| Mar. 17, 2004 | (JP) | ............................. 2004-076098 |
| May 27, 2004 | (JP) | ............................. 2004-158454 |
| Jul. 28, 2004 | (JP) | ............................. 2004-220727 |
| Nov. 29, 2004 | (JP) | ............................. 2004-344821 |

(51) Int. Cl.
 *H01L 41/047* (2006.01)
 *H01L 41/083* (2006.01)
(52) U.S. Cl. .................................................... 310/366
(58) Field of Classification Search ................. 310/365, 310/366
See application file for complete search history.

(56) References Cited

U.S. PATENT DOCUMENTS

| 6,922,005 B2 * | 7/2005 | Schreiner ..................... 310/328 |
| 2006/0255695 A1 * | 11/2006 | Endriss ........................ 310/366 |
| 2007/0170818 A1 | 7/2007 | Yoshioka et al. ............. 310/328 |
| 2007/0247025 A1 | 10/2007 | Sciortino et al. ............. 310/328 |
| 2007/0278907 A1 | 12/2007 | Kondo et al. ................. 310/364 |
| 2008/0007143 A1 | 1/2008 | Nakamura et al. ........... 310/358 |
| 2008/0185938 A1 * | 8/2008 | Kastl et al. .................. 310/358 |

FOREIGN PATENT DOCUMENTS

| JP | 61-133715 | 6/1986 |
| JP | 61-182284 | 8/1986 |
| JP | 01-130568 | 9/1989 |
| JP | 2002-231558 | 8/2002 |
| JP | 2003-318458 | 11/2003 |

* cited by examiner

*Primary Examiner*—Thomas M Dougherty
(74) *Attorney, Agent, or Firm*—Hogan & Hartson LLP

(57) ABSTRACT

A multi-layer piezoelectric element having high durability which allows it to increase the amount of displacement of a piezoelectric actuator under high voltage and high pressure and does not undergo a change in the amount of displacement during continuous operation in a high electric field and under a high pressure over a long time period is provided.

The multi-layer piezoelectric element comprises a stack of at least one piezoelectric layer and a plurality of internal electrodes consisting of first and second internal electrodes placed one on another, a first external electrode formed on a first side face of the stack and connected to the first internal electrode and a second external electrode formed on a second side face of the stack and connected to the second internal electrode, wherein the bonding strength between the piezoelectric layer and the internal electrode is weaker than the bending strength of the piezoelectric layer.

5 Claims, 18 Drawing Sheets

MULTI-LAYER PIEZOELECTRIC ELEMENT AND METHOD FOR MANUFACTURING THE SAME

CROSS-REFERENCE TO THE RELATED APPLICATIONS

This application is a divisional of application Ser. No. 10/598,680 filed May 15, 2007, which is a national phase of international application No. PCT/JP2005/004097 filed Mar. 9, 2005, the entire contents of which are incorporated herein by reference. This application also claims benefit of priority under 35 U.S.C. §119 to Japanese Patent Application No. 2004-065725 filed Mar. 9, 2004, Japanese Patent Application No. 2004-076098 filed Mar. 17, 2004, Japanese Patent Application No. 2004-158454 filed May 27, 2004, Japanese Patent Application No. 2004-220727 flied Jul. 28, 2004 and Japanese Patent Application No. 2004-344821 filed Nov. 29, 2004, the entire contents of all of which are incorporated herein by reference.

TECHNICAL FIELD

The present invention relates to a multi-layer piezoelectric element (may be hereinafter referred to simply as an "element") and an injection apparatus, for example, fuel injection apparatus of automobile engine, liquid injection apparatus of ink jet printer or the like, or a drive unit used in precision positioning device or vibration preventing device for an optical apparatus, and to a multi-layer piezoelectric element used as a sensor element mounted in combustion pressure sensor, knocking sensor, acceleration sensor, load sensor, ultrasound sensor, pressure sensor, yaw rate sensor or the like, or used as a circuit component mounted in piezoelectric gyro, piezoelectric switch, piezoelectric transducer, piezoelectric breaker or the like.

BACKGROUND ART

Multi-layer piezoelectric actuators constituted from piezoelectric layers and internal electrodes stacked alternately one on another have been known. The multi-layer piezoelectric actuators can be divided into two categories: fired-at-once type and stacked type which has such a constitution as piezoelectric porcelain made of a piezoelectric material and internal electrodes having the form of sheet are stacked one on another alternately. When the requirements to reduce the operating voltage and the manufacturing cost are taken into consideration, the multi-layer piezoelectric actuator of fired-at-once type is more advantageous for the reason of smaller layer thickness and higher durability.

FIG. 24A and FIG. 24B show a multi-layer piezoelectric element of the prior art disclosed in Patent Document 1, which is constituted from a stack 103 and external electrodes 105 formed on a pair of opposing side faces thereof. The stack 103 is formed by stacking piezoelectric layers 101 and internal electrodes 102 alternately one on another. The internal electrodes 102 are not formed over the entire principal surfaces of the piezoelectric layers 101, but have a so-called partial electrode structure. In the stack of the partial electrode structure, the internal electrodes 102 are stacked in a staggered manner so as to be exposed alternately at the left in one layer and then at the right in the next layer. Thus the multi-layer piezoelectric element of fired-at-once type of the prior art has the internal electrodes of partial electrode structure, so that the internal electrode and the external electrode of different polarities do not contact with each other. There is also such a type that every other internal electrode is covered by an insulator on one side of the stack so as to be insulated from the external electrode. In this way, with any of the types described above, the external electrodes 105 are formed so as to be connected to the internal electrode that is exposed on either of a pair of opposing side faces of the stack 103 in every other layer. Inactive layers 104 are stacked on both end faces of the stack 103 in the direction of stacking.

The multi-layer piezoelectric element of the prior art is manufactured as follows. A paste for the internal electrode is printed on a plurality of ceramic green sheets that include the substance used for making the piezoelectric material, and are stacked and fired so as to form the stack 103. Then the external electrodes 105 are formed on a pair of side faces of the stack 103 thereby to make the multi-layer piezoelectric element (refer to, for example, Patent Document 1). The paste for the internal electrode is printed on ceramic green sheets in a predetermined pattern as shown in FIG. 24B.

When manufacturing the multi-layer piezoelectric element of fired-at-once type, it is required to fire the internal electrode 102 and the piezoelectric material 101 to sinter at the same temperature, in order to bond the internal electrode 102 and the piezoelectric material 101 firmly. Optimum compositions of the internal electrode 102 and the piezoelectric material 101 are being studied for satisfying this requirement.

The internal electrode 102 is usually formed from an alloy of silver and palladium and, in order to fire the piezoelectric layers 101 and the internal electrodes 102 at the same time, composition of metals included in the internal electrode 102 has been set typically to 70% by weight of silver and 30% by weight of palladium (refer to, for example, Patent Document 2).

The internal electrode 102 made of a metal compound that includes silver-palladium alloy is capable of suppressing the so-called silver migration in which silver atoms migrate along the device surface. In the case of composition constituted from pure silver, when a voltage is applied between a pair of opposing internal electrodes 102, the silver migration occurs in which silver atoms migrate from the positive electrode to the negative electrode along the device surface. Silver migration occurs conspicuously particularly in an atmosphere of high temperature and high humidity.

In the field of multi-layer ceramic capacitor, it has been proposed in Patent Document 3 to provide voids in an end portion of the internal electrode. This is for the purpose of mitigating the stress generated in the interface between the dielectric layer and the internal electrode layer, thereby to provide a multi-layer ceramic capacitor that is excellent in reliability including the resistance against bending of the substrate and has stability in electrical properties and high performance.

However, unlike the conventional multi-layer electronics components (multi-layer ceramic capacitor, etc.), the multi-layer piezoelectric element experiences a significant deformation (displacement) of the piezoelectric porcelain under an electric field when electric power is supplied. The number of operation cycles is the same as the number of times the piezoelectric porcelain deforms.

Taking this point into consideration, a multi-layer piezoelectric element that frequently undergoes displacement has been constituted to have internal electrode formed in dense structure in order to ensure durability of the internal electrode.

The multi-layer piezoelectric element having such a constitution as described above can be used as a piezoelectric actuator by securing lead wires onto the external electrodes 105 by soldering, and applying a predetermined voltage across the external electrodes 105.

| Patent Document 1: | Japanese Unexamined Patent Publication (Kokai) No. 61-133715 |
|---|---|
| Patent Document 2: | Japanese Unexamined Utility Model Publication (Kokai) No. 1-130568 |
| Patent Document 3: | Japanese Unexamined Patent Publication (Kokai) No. 2002-231558 |

DISCLOSURE OF THE INVENTION

Problems to be Solved by the Invention

In recent years, the multi-layer piezoelectric element used in a small-sized piezoelectric actuator is required to undergo a large amount of displacement under a high pressure. However, the multi-layer piezoelectric element of the prior art has such a problem that the piezoelectric layer 101 is clamped by the internal electrode 102, thus making it impossible to increase the amount of displacement of the piezoelectric layer 101.

In the case of internal electrode having dense structure, there arises such a problem that it is difficult to efficiently achieve a large amount of displacement that is required in recent years.

There has also been a problem that, when the multi-layer piezoelectric element is operated for a long period of time, the device temperature rises and if it becomes too high to control by heat dissipation, thermal excursion occurs which results in breakage and the amount of displacement deteriorates rapidly.

In case the conventional multi-layer piezoelectric element is used as an actuator for driving a fuel injection apparatus or the like, there has been such a problem that the amount of displacement changes with time leading to malfunction of the apparatus. Thus it has been called for to suppress the change in the amount of displacement over a long period of operation and improve the durability.

When the multi-layer piezoelectric element is subjected to continuous operation in a high electric field and under a high pressure over a long period of time, there has also been a problem that the amount of displacement increases locally at a particular portion due to the partial electrode structure, thus causing the stacked layers to peel off starting at the particular portion and leading to destruction.

There has also been such a problem that resonance occurs due to the displacement at the particular portion, thus resulting in the occurrence of beat tone or harmonics signals having frequencies that are integral multiples of power frequency. In the case of an actuator, the beat or harmonics signal acts as noise that leads to malfunction.

In the partial electrode structure, only the piezoelectric layer sandwiched by the internal electrodes of different polarities undergoes displacement, while other piezoelectric layers which are not sandwiched by the internal electrodes do not undergo displacement. Therefore, when the device is subjected to continuous operation in a high electric field and under a high pressure over a long period of time, stress is concentrated in the interface between the internal electrode and the insulation region. The stress causes cracks in the piezoelectric layer that acts as the insulation region, thus giving rise to the possibility of short-circuiting through the crack occurring between the internal electrode of different polarity and the external electrode, eventually resulting in destruction of the multi-layer piezoelectric element.

When such a crack as described above occurs, it leads to deterioration of the displacing function of the piezoelectric layer and a change in the amount of displacement of the multi-layer piezoelectric element during operation and deterioration in reliability and in durability.

Accordingly, the present invention aims at providing a multi-layer piezoelectric element having high durability which allows it to increase the amount of displacement of a piezoelectric actuator under high voltage and high pressure, and does not undergo a change in the amount of displacement during continuous operation in a high voltage and under a high pressure over a long period of time, and a fuel injection apparatus.

Means for Solving the Problems

A first multi-layer piezoelectric element according to the present invention has been completed on the basis of finding that, even when the piezoelectric layer is clamped by the internal electrodes, the clamping force can be decreased by setting the bonding strength between the piezoelectric layer and the internal electrode in a proper range relative to the bending strength of the piezoelectric layer.

The first multi-layer piezoelectric element according to the present invention comprises a stack of at least one piezoelectric layer and a plurality of internal electrodes consisting of first and second internal electrodes placed one on another, a first external electrode which is formed on a first side face of the stack and is connected to the first internal electrode and a second external electrode which is formed on a second side face of the stack and is connected to the second internal electrode, wherein the bonding strength between the piezoelectric layer and the internal electrode is controlled to be weaker than the bending strength of the piezoelectric layer.

A second multi-layer piezoelectric element and a third multi-layer piezoelectric element according to the present invention have been completed on the basis of finding that, contrary to the conventional wisdom, the amount of displacement can be greatly increased and durability can be improved at the same time by intentionally providing voids in the internal electrode.

The second multi-layer piezoelectric element according to the present invention comprises a stack of at least one piezoelectric layer and a plurality of internal electrodes consisting of first and second internal electrodes placed one on another, a first external electrode which is formed on a first side face of the stack and is connected to the first internal electrode and a second external electrode which is formed on a second side face of the stack and is connected to the second internal electrode, wherein the internal electrode includes voids and proportion of the area occupied by the voids to the total area of a cross section of the internal electrode is in a range from 5 to 70%.

The third multi-layer piezoelectric element according to the present invention comprises a stack of at least one piezoelectric layer and a plurality of internal electrodes consisting of first and second internal electrodes placed one on another, a first external electrode which is formed on a first side face of the stack and is connected to the first internal electrode and a second external electrode which is formed on a second side face of the stack and is connected to the second internal electrode, wherein voids are formed to penetrate through the internal electrode in the direction of stacking.

A fourth multi-layer piezoelectric element according to the present invention has been completed on the basis of the following finding.

The multi-layer piezoelectric element undergoes continuous dimensional change of the device during operation, unlike other multi-layer electronics components such as capacitor. As a result, only a portion where the internal electrodes of different polarities that overlap each other via the piezoelectric layer effectively undergoes piezoelectric displacement when subjected to continuous operation in a high electric field and under a high pressure over a long period of time. When the portion where the internal electrodes of different polarities that overlap each other via the piezoelectric layer has a configuration of line symmetry, largest displacement occurs along the straight line that is the axis of symmetry, and the stacked layers peel off starting in the side face of the device at a point located on the straight line, eventually resulting in destruction.

In addition, the existence of the straight line along which displacement occurs similarly leads to the occurrence of beat or harmonics signals having frequencies that are integral multiples of the power frequency which, in the case of an actuator, act as noise that leads to malfunction.

The existence of the portion that undergoes large amount of displacement also leads to change in the amount of displacement which lowers durability.

The fourth multi-layer piezoelectric element according to the present invention, that was completed on the basis of the finding described above, comprises a stack of at least one piezoelectric layer and a plurality of internal electrodes consisting of first and second internal electrodes placed one on another, a first external electrode which is formed on a first side face of the stack and is connected to the first internal electrode and a second external electrode which formed on a second side face of the stack and is connected to the second internal electrode, wherein the portion in which the first inner electrode and the second inner electrode oppose each other has a configuration not in line symmetry.

A fifth multi-layer piezoelectric element according to the present invention has been completed on the basis of the following finding obtained by the inventor of the present application.

The piezoelectric layer located in an insulated region, where the internal electrode is not formed for the purpose of insulation from the external electrode of different polarity, is not sandwiched by the internal electrodes of different polarities, and therefore does not undergo displacement when the multi-layer piezoelectric element is operated.

Thus when the device is subjected to continuous operation in a high electric field and under a high pressure over a long period of time, only the piezoelectric layer sandwiched by the internal electrodes of different polarities undergoes displacement while the other piezoelectric layers which are not sandwiched by the internal electrodes of different polarities do not undergo displacement, thus resulting in stress concentrated in the interface between the internal electrode and the insulation region. The stress causes cracks in the piezoelectric layer, thus giving rise to the possibility of short-circuiting through the crack occurring between the internal electrode of different polarity and the external electrode, thus resulting in destruction of the device.

Also because the piezoelectric layer is an insulator, current does not flow between the internal electrodes of different polarities. Consequently, the so-called edge effect occurs in which the voltage applied to drive the multi-layer piezoelectric element concentrates in an edge portion of the electrode pattern. As a result, a large displacement occurs particularly in a portion of the piezoelectric layer sandwiched by the edge portions of the electrode pattern, in the piezoelectric layer sandwiched by the internal electrodes of different polarities. However, since the piezoelectric layer which is not sandwiched by the internal electrodes of different polarities does not undergo displacement, greater stress is generated in the interface between these layers.

In this case, if the border between the internal electrode and the insulation region is straight, a crack generated at a point of the border can grow from the point linearly eventually leading to the destruction of the multi-layer piezoelectric element. In case the internal electrode pattern includes such an edge portion formed therein as straight lines are butted each other with an arbitrary angle therebetween in the border between the internal electrode and the insulation region, stress is concentrated at the edge of the straight lines that are butted each other with an arbitrary angle, thus resulting in a crack generated in the piezoelectric layer which is an insulator.

A fifth multi-layer piezoelectric element according to the present invention, that was completed on the basis of the finding described above, comprises a stack of at least one piezoelectric layer and a plurality of internal electrodes consisting of first and second internal electrodes placed one on another, a first external electrode which is formed on a first side face of the stack and is connected to the first internal electrode and a second external electrode which formed on a second side face of the stack and is connected to the second internal electrode, wherein an edge of the first internal electrode which opposes the second external electrode has an arc shape and an edge of the second internal electrode which opposes the first external electrode has an arc shape.

The interface between the arc-shaped edge of the first internal electrode and the second external electrode and the interface between the arc-shaped edge of the second internal electrode and the first external electrode are the insulation regions described above.

Effect of the Invention

In the first multi-layer piezoelectric element of the present invention, since the bonding strength between the piezoelectric layer and the internal electrode is made weaker than the strength of the piezoelectric layer, the force of the internal electrode to clamp the piezoelectric layer can be decreased thus enabling it to increase the amount of displacement of the multi-layer piezoelectric element. Moreover, since the residual stress between the piezoelectric layer and the internal electrode can be decreased, it is made possible to provide a piezoelectric actuator having high durability and high reliability which maintains the amount of displacement constant during operation.

Also in the first multi-layer piezoelectric element of the present invention, the force of the internal electrode to clamp the piezoelectric layer can be made relatively small and the residual stress can be decreased, even when the internal electrode is formed from a metal of high hardness. As a result, change in the amount of displacement can be decreased during continuous operation, and the device temperature can be suppressed from rising too high when the multi-layer piezoelectric element with the large residual stress is operated over a long period of time. This makes it possible to prevent thermal excursion from occurring that would otherwise occur when the device temperature becomes too high to control by heat dissipation, thereby preventing the amount of displacement from deteriorating.

In the second multi-layer piezoelectric element according to the present invention, the clamping force of the internal electrodes to restrict the piezoelectric layer from making displacement under an electric field is decreased by forming voids in the internal electrode with a proportion of the area occupied by the voids to the total area of a cross section of the internal electrode in a range from 5 to 70%. This enables the piezoelectric layer to easily deform so that a larger amount of displacement can be achieved, and the stress generated in the internal electrode is mitigated, thus achieving higher durability.

In the third multi-layer piezoelectric element according to the present invention, since the voids are formed so as to penetrate through the internal electrode in the direction of stacking, the clamping force of the internal electrodes to restrict the piezoelectric layer from making displacement under an electric field is decreased. This enables the piezoelectric layer to easily deform resulting in a larger amount of displacement, and the stress generated in the internal electrode is also mitigated so that higher durability is achieved.

In the fourth multi-layer piezoelectric element according to the present invention, since the portion where the internal electrodes of different polarities that overlap each other via the piezoelectric layer is formed in a configuration which does not have line symmetry, the stacked layers are suppressed from peeling off even when the multi-layer piezoelectric element undergoes continuous dimensional change of the device during operation. Also because resonance which occurs when the displacement takes place similarly can be suppressed, not only the occurrence of beat tone can be prevented but also the generation of harmonics signal can be prevented. Thus it is made possible to suppress noise from affecting the control signal and suppress the actuator from malfunctioning.

Also because the internal electrodes of different polarities are exposed on all the device side faces, stress generated in the device when operated as an actuator can be propagated to the outside of the device, thus it is made possible to provide a piezoelectric actuator having high durability and high reliability.

In addition, since the pattern for insulating the internal electrodes and the external electrode of different polarities is formed on the internal electrode, it is not necessary to provide a region for preventing insulation on the outside of the device. As a result, dimensional change of the device due to displacement does not cause the insulation prevention portion to peel off or spark due to peel off, thus it is made possible to provide a piezoelectric actuator having high durability and high reliability.

Moreover, since C plane or R plane is formed in the internal electrode pattern, stress can be suppressed from being concentrated in the edge of the electrode pattern during displacement of the device, thus it is made possible to provide a piezoelectric actuator having high durability and high reliability.

In the fifth multi-layer piezoelectric element according to the present invention, as the edge of the first internal electrode which opposes the second external electrode is formed in arc shape and the edge of the second internal electrode which opposes the first external electrode is formed in arc shape, namely the border between the internal electrode and the insulation region is formed in R shape, stress can be prevented from being concentrated in the border between the insulation region formed between the internal electrode and the external electrode of different polarity and the internal electrode. As a result, crack generated between the internal electrode and the external electrode of different polarities can be suppressed from growing even when the multi-layer piezoelectric element is operated continuously over a long period of time under a high pressure in a high electric field, thus preventing short-circuiting from occurring between the internal electrode and the external electrode of different polarities.

In addition, when the portion where the internal electrodes of different polarities that overlap each other via the piezoelectric layer has rounded corners, concentration of stress does not occur in the border between the insulation region and the internal electrode formed between the internal electrode and the external electrode of different polarities. Thus stress concentration in the border can be prevented from occurring. This enables it to prevent cracks from occurring in the direction of stacking in the border between the upper and lower internal electrodes of different polarities, even when the multi-layer piezoelectric element is operated continuously over a long period of time under a high pressure in a high electric field and the multi-layer piezoelectric element is caused to expand and contract in the direction of stacking, thereby improving the durability of the device.

Moreover, area of the portion of the piezoelectric layer that is sandwiched by the internal electrodes can be made larger by exposing the internal electrode on the side face of the stack, thus making it possible to increase the area of the piezoelectric layer that undergoes displacement and causing the stress generated in the device during operation to be propagated to the outside of the device. As a result, the multi-layer piezoelectric element having larger displacement capability and high reliability is provided.

Thus it is made possible to provide a fuel injection apparatus having high durability and high reliability that does not substantially undergo a change in the amount of displacement and does not malfunction when the multi-layer piezoelectric element is operated continuously.

In the first through fifth multi-layer piezoelectric element of the present invention, when the thermal expansion coefficient $\alpha_1$ of the metal that constitutes the internal electrode and thermal expansion coefficient $\alpha_2$ of the metal that constitutes the external electrode are set so that the ratio $(\alpha_1/\alpha_2)$ is not less than 0.9 and is below 1, contact failure between the internal electrode and the external electrode can be prevented from occurring even when the multi-layer piezoelectric element undergoes a large number of operation cycles in continuous operation which would lead to a high temperature of the device, since the internal electrode and the external electrode have a small difference in thermal expansion coefficient therebetween. As a result, peel off and wire breakage can be suppressed from occurring during continuous operation, thus making it possible to prevent the problem of the device destruction from occurring due to spark generated in the portion that peeled off. This eliminates malfunction of the device and achieves high durability without thermal excursion.

In the first through fifth multi-layer piezoelectric element of the present invention, stress generated by the difference in thermal expansion coefficient between the internal electrode and the external electrode can be mitigated so as to prevent the electrodes from peeling off and improve the durability during operation, by providing an intermediate layer in the junction between the internal electrode and the external electrode.

Furthermore, the internal electrode and the piezoelectric layer can be suppressed from peeling off by adding an inorganic composition together with the metallic compound in the internal electrode, which increases the bonding strength between the internal electrode and the piezoelectric layer.

As described above, the multi-layer piezoelectric element of the present invention enables it to provide a fuel injection apparatus having high durability and high reliability that is capable of exhibiting a large amount of displacement and does not undergo a change in the amount of displacement even when the multi-layer piezoelectric element is operated continuously.

Figure 1A:
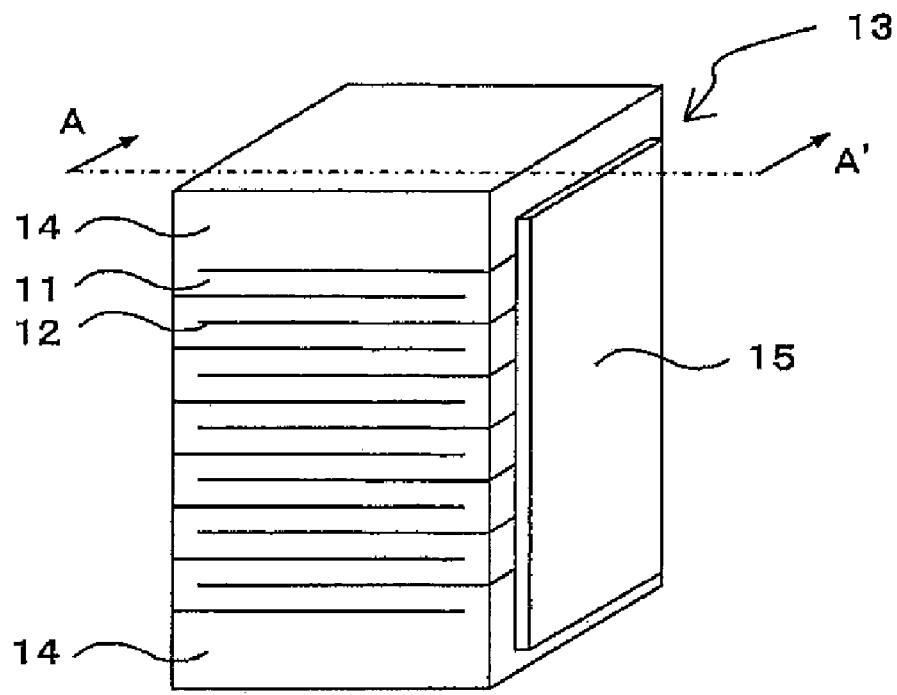
FIG. 1A is a perspective view showing the multi-layer piezoelectric element according to the first embodiment of the present invention.

| Description of Reference Numerals | |
|---|---|
| 1, 11: | Piezoelectric layer |
| 13: | Stack |
| 2, 12, 82, 92: | Internal electrode |
| 2a, 82a, 92a: | Electrode portion |
| 3: | Groove |
| 4, 15, 85: | External electrode |
| 6: | Lead wire |
| 9, 14: | Inactive layer |
| 31: | Housing |
| 33: | Injection hole |
| 35: | Valve |
| 43: | Piezoelectric actuator |
| 10: | Multi-layer piezoelectric element |
| 20: | Void |
| 31: | Housing |
| 33: | Injection hole |
| 35: | Valve |
| 43: | Piezoelectric actuator |

BEST MODE FOR CARRYING OUT THE INVENTION

The present invention will now be described by way of preferred embodiments with reference to the accompanying drawings.

First Embodiment

Figure 1B:
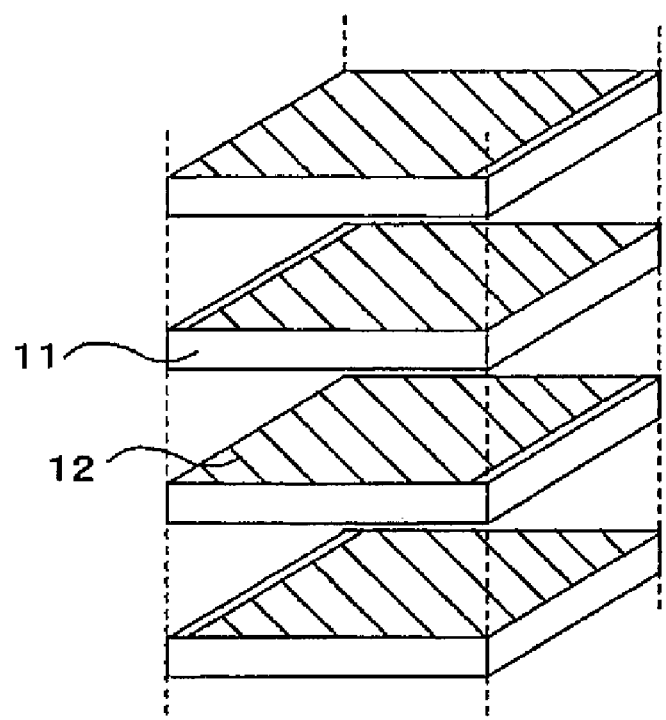
FIG. 1B is an exploded perspective view showing the piezoelectric layer and the internal electrodes being stacked in the multi-layer piezoelectric element of the first embodiment.

FIG. 1 shows the constitution of the multi-layer piezoelectric element according to the first embodiment of the present invention, where FIG. 1A is a perspective view thereof, and FIG. 1B is an exploded perspective view showing the constitution of stacking piezoelectric layer and internal electrode layers.

In the multi-layer piezoelectric element according to the first embodiment, as shown in FIG. 1A and FIG. 1B, the external electrodes are formed on a pair of opposing side faces of a stack 13 constituted from the piezoelectric layer 11 and the internal electrodes 12 placed alternately one on another, and the internal electrodes 12 are connected to the external electrodes 15 in every other layer. That is, the internal electrode 12 is exposed on the side face of the stack where the external electrodes 15 is formed, and the external electrode 15 is connected to the exposed internal electrode 12 so as to establish electrical continuity. On both ends of the stack 13 in the direction of stacking, inactive layers 14 are formed by stacking a plurality of the piezoelectric layers 11 (without including the internal electrodes 12). When the multi-layer piezoelectric element of the present invention is used as the multi-layer piezoelectric actuator, lead wires may be connected to the external electrodes 15 by soldering, with the lead wires being connected to a power source installed outside.

The internal electrode 12 disposed between the piezoelectric layers 11 is formed from a metallic material such as silver-palladium, and a predetermined voltage is applied to the piezoelectric layers 11 via the internal electrode 12, so that the piezoelectric layers 11 undergo a displacement by the reverse piezoelectric effect.

The inactive layers 14, in contrast, do not undergo a displacement even when a voltage is applied, since they are a plurality of layers of the piezoelectric material 11 where the internal electrodes 12 are not provided.

The first embodiment of the present invention is characterized in that the bonding strength between the piezoelectric layer 11 and the internal electrode 12 is made weaker than the strength of the piezoelectric layer 11. In case the bonding strength between the piezoelectric layer 11 and the internal electrode 12 is higher than the strength of the piezoelectric layer 11 in the structure where the piezoelectric layer 11 is clamped by the internal electrode 12, displacement of the multi-layer piezoelectric element becomes smaller since the portion of the piezoelectric layer 11 bonded onto the internal electrode 12 cannot undergo displacement even when a voltage is applied thereto. When the bonding strength between the piezoelectric layer 11 and the internal electrode 12 is weaker than the strength of the piezoelectric layer 11, in contrast, the amount of displacement of the multi-layer piezoelectric element can be made larger than that in the case where the bonding strength between the piezoelectric layer 11 and the internal electrode 12 is higher than the strength of the piezoelectric layer 11.

As described above, increasing the amount of displacement of the multi-layer piezoelectric element requires it to decrease the bonding strength between the piezoelectric layer 11 and the internal electrode 12. The bonding strength is preferably not larger than 70%, more preferably not larger than 50%, and most preferably not larger than 40% of the strength of the piezoelectric layer 11. When the bonding strength is 70% of the strength of the piezoelectric layer 11 or less, residual stress in the interface between the piezoelectric layer 11 and the internal electrodes 12 can be made smaller and the amount of displacement of the multi-layer piezoelectric element can be made larger. When the bonding strength between the piezoelectric layer 11 and the internal electrodes 12 is not larger than 50% or 40% of the strength of the piezoelectric layer 11, durability during continuous operation can be improved.

According to the present invention (the first embodiment), bonding strength between the piezoelectric layer 11 and the internal electrode 12 is preferably 70 MPa or less. When the bonding strength is higher than 70 MPa, the internal electrode clamps the piezoelectric layer 11 with a larger force which decreases the amount of displacement. When the bonding strength is 0 MPa, however, the multi-layer piezoelectric element cannot keep itself in shape. Therefore, in order to achieve a large displacement of the multi-layer piezoelectric element, it is preferable that the bonding strength between the piezoelectric layer 11 and the internal electrode 12 is weaker than the strength of the piezoelectric layer 11, preferably larger than 0 MPa and not larger than 70 MPa.

In order to achieve a large displacement of the multi-layer piezoelectric element, the bonding strength between the piezoelectric layer 11 and the internal electrode 12 is preferably not larger than 50 MPa. In order to achieve a large displacement and improve durability of the multi-layer piezoelectric element, the bonding strength between the piezoelectric layer 11 and the internal electrode 12 is more preferably not larger than 40 MPa, and furthermore preferably in a range from 10 MPa to 35 MPa in order to improve durability further.

Strength of the piezoelectric layer 11 and bonding strength between the piezoelectric layer 11 and the internal electrode 12 were evaluated and compared as described below.

The multi-layer piezoelectric element is cut to dimensions of, for example, 3 mm by 4 mm by 36 mm, so that the electrode surface of the internal electrode 12 is disposed substantially perpendicular to the longitudinal direction of the test piece. Bending strength of the test piece is measured by applying a load substantially perpendicular to the longitudinal direction according to the procedure of 4-point bending strength test specified in JIS R1601. The load that causes the test piece to break in the interface between the piezoelectric layer 11 and the internal electrodes 12 is taken as the bonding strength between the piezoelectric layer and the internal electrode, and the load that causes the test piece to break in the piezoelectric layer 11 is taken as the bending strength of the piezoelectric layer.

In a more preferable form of the first embodiment of the present invention, bonding strength between the external electrode 15 and the internal electrode 12 is made higher than the bonding strength between the piezoelectric layer 11 and the internal electrode 12. When the bonding strength between the piezoelectric layer 11 and the internal electrode 12 is equal to or larger than the bonding strength between the external electrode 15 and the internal electrode 12, durability of the multi-layer piezoelectric element during continuous operation can be improved.

According to the present invention, bonding strength between the piezoelectric layer 11 and the internal electrode 12 can be made weaker than the strength of the piezoelectric layer 11 by various methods such as (1) decreasing the surface roughness of the piezoelectric layer 11 so as to suppress the anchoring effect when bonding the piezoelectric layer 11 and the internal electrode 12; (2) selecting such material compositions that the starting temperature of sintering of the internal electrode 12 becomes lower than the starting temperature of sintering of the piezoelectric layer 11 so as to suppress the crystal growth in the junction between the piezoelectric layer 11 and the internal electrode 12; (3) decreasing the area occupied by the internal electrode so as to decrease the area of the junction between the piezoelectric layer 11 and the internal electrode 12; and (4) forming a glass layer between the piezoelectric layer 11 and the internal electrode 12.

In one example, an electrode pattern is printed from a mixture of a powder of metal that constitutes the internal electrode 12 and a powder of the oxide of the metal, so that a liquid phase can be formed having a lower temperature than the starting temperature of sintering of the piezoelectric layer 11, in the interface between the piezoelectric layer 11 and the internal electrode 12.

When the starting temperature of sintering of the internal electrode 12 is set lower than the starting temperature of sintering of the piezoelectric layer 11 as described above, liquid phase is first formed in the internal electrode 12 when fired at the same time, so that sintering of only the internal electrode 12 proceeds. When the glass layer is formed between the piezoelectric layer 11 and the internal electrode 12, cooling rate is made faster than 100° C. per hour so that the liquid phase turns into glass layer.

Also the internal electrode 12 is formed from a metal of low hardness, since bonding strength between the piezoelectric layer 11 and the internal electrode 12 increases when the internal electrode 12 is formed from a metal of high hardness.

A method of manufacturing the multi-layer piezoelectric element of the present invention will now be described below.

In order to make the multi-layer piezoelectric element of the first embodiment, first, a calcined powder of a piezoelectric ceramic material constituted from perovskite type oxide consisting of $PbZrO_3$—$PbTiO_3$ or the like, a binder made of an organic polymer such as acrylic resin or butyral resin and a plasticizer such as DBP (dibutyl phthalate) or DOP (dioctyl phthalate) are mixed to form a slurry. The slurry is formed into ceramic green sheets, that would become the piezoelectric layers 11, by a known method such as doctor blade process or calendar roll process or other tape molding method.

Then a metal powder such as silver-palladium that constitutes the internal electrode 12, a metal oxide such as silver oxide, a binder and a plasticizer or the like are mixed to prepare an electrically conductive paste which is applied onto the top surface of the ceramic green sheet by screen printing method or the like to a thickness of 1 to 40 μm.

A plurality of the green sheets having the electrically conductive paste printed on the top surface thereof are stacked one on another, with the stack being heated at a predetermined temperature to remove the binder. The stack is then fired at a temperature in a range from 900 to 1200° C. thereby to make the stack 13.

When the metal powder such as silver-palladium that constitutes the internal electrode 12 is added to the green sheet that forms the portion of the inactive layer 14 or the green sheet that forms the portion of the inactive layer 14 is stacked, shrinking behavior and shrinking rate can be matched between the inactive layer 14 and the other portions during sintering, by printing the slurry comprising the metal powder such as silver-palladium that constitutes the internal electrode, the inorganic compound, the binder and the plasticizer onto the green sheet, thus making it possible to form a dense stack.

The method of making the stack 13 is not limited to that described above, and any manufacturing method may be employed as long as the stack 13 can be made in such a constitution as a plurality of the piezoelectric layers 11 and a plurality of the internal electrodes 12 are stacked alternately one on another.

The internal electrodes 12 of which ends are exposed on the side face of the multi-layer piezoelectric element and the internal electrodes 12 of which ends are not exposed are stacked alternately, and a groove is formed in the piezoelectric material located between the internal electrode 12 of which end is not exposed and the external electrode 15, with the groove being filled with an insulating material such as resin or rubber that has Young's modulus lower than that of the piezoelectric material 11. The groove is formed on the side face of the stack 13 by means of a dicing apparatus or the like.

The electrically conductive material that constitutes the external electrode 15 is preferably silver that has a low value of Young's modulus or an alloy based on silver, in consideration of the capability to sufficiently absorb the stress generated by the expansion and contraction of the actuator (stack).

The external electrode 15 is formed, for example, as follows.

An electrically conductive silver-glass paste is prepared by adding a binder to a mixture of a powder of silver or an alloy based on silver and a glass powder, and the paste is formed into a sheet that is dried to remove solvent while controlling the density of the green sheet in a range from 6 to 9 g/cm$^3$. The sheet is transferred onto the external electrode forming surface of the column-like stack 13.

The stack is baked at a temperature that is higher than the softening point of the glass and is not higher than the melting point (965° C.) of silver and is not higher than ⅘ of the firing temperature (° C.). In this process, the binder included in the sheet that is formed from the electrically conductive silver-glass paste is evaporated and removed, so that the external electrode 15 is formed from a porous electrical conductor having three-dimensional mesh structure.

The temperature at which the electrically conductive silver-glass paste is bonded by baking is preferably in a range from 550 to 700° C. for the purpose of joining the silver content that is included in the electrically conductive silver-glass paste and the internal electrode 12 through diffusion bonding so as to effectively form a neck portion, thus effectively causing the voids existing in the external electrode 15 to remain and partially joining the external electrode 15 and the side face of the column-like stack 13. Softening point of the glass component included in the electrically conductive silver-glass paste is preferably in a range from 500 to 700° C.

When the baking temperature is higher than 700° C, sintering of the silver powder of the electrically conductive silver-glass paste would proceed excessively, such that the porous electrical conductor of three-dimensional mesh structure cannot be effectively formed and the external electrodes 15 become too dense. As a result, the value of Young's modulus of the external electrode 15 becomes too high to effectively absorb the stress generated during operation, eventually leading to breakage of the external electrode 15. Baking is preferably carried out at a temperature that is not higher than 1.2 times the softening point of the glass.

When the baking temperature is lower than 550° C., on the other hand, the end of the internal electrode 12 and the external electrode 15 cannot be joined sufficiently through diffusion bonding, and therefore the neck portion cannot be formed thus giving rise to the possibility of spark occurring between the internal electrode 12 and the external electrode 15 during operation.

The thickness of the sheet formed from the electrically conductive silver-glass paste is preferably smaller than the thickness of the piezoelectric layer 11. More preferably, the thickness is 50 μm or less in order to accommodate the contraction and expansion of the actuator.

Then the stack 13 having the external electrodes 15 formed thereon is immersed in a silicone rubber solution while deaerating the silicone rubber solution by evacuation, so as to fill the groove of the stack 13 with the silicone rubber. Then the stack 13 is pulled out of the silicone rubber solution, with the stack 13 coated with the silicone rubber on the side faces thereof. Then the silicon rubber that fills the groove and covers the side faces of the column-like stack 13 is cured, thereby to complete the multi-layer piezoelectric element of the present invention.

Then lead wires are connected to the external electrodes 15, and DC voltage of 0.1 to 3 kV/mm is applied between the pair of external electrodes 15 via the lead wires so as to apply polarization treatment to the stack 13, thereby to complete the multi-layer piezoelectric actuator that utilizes the multi-layer piezoelectric element of the present invention. When the lead wires of the multi-layer piezoelectric actuator are connected to an external voltage source and the voltage is supplied via the lead wires and the external electrodes 15 to the internal electrodes 12, the piezoelectric layers 11 undergo a significant amount of displacement by the reverse piezoelectric effect. The multi-layer piezoelectric actuator can be used, for example, as an automobile fuel injection valve that supplies fuel to an engine.

The multi-layer piezoelectric element of the present invention is not limited to the examples described above, and various modifications may be made within the scope of the present invention.

An example of forming the external electrodes 15 on the opposing side faces of the stack 13 has been described above, while a pair of external electrodes may also be formed, for example, on adjacent side faces according to the present invention.

Second Embodiment

Figure 2A:
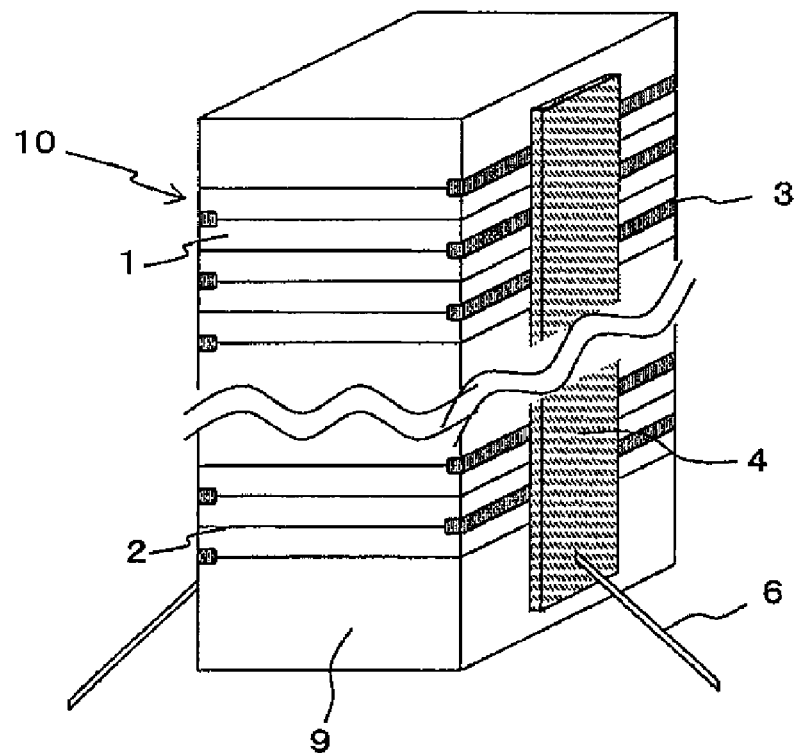
FIG. 2A is a perspective view showing the multi-layer piezoelectric element according to the second embodiment of the present invention.
Figure 2B:
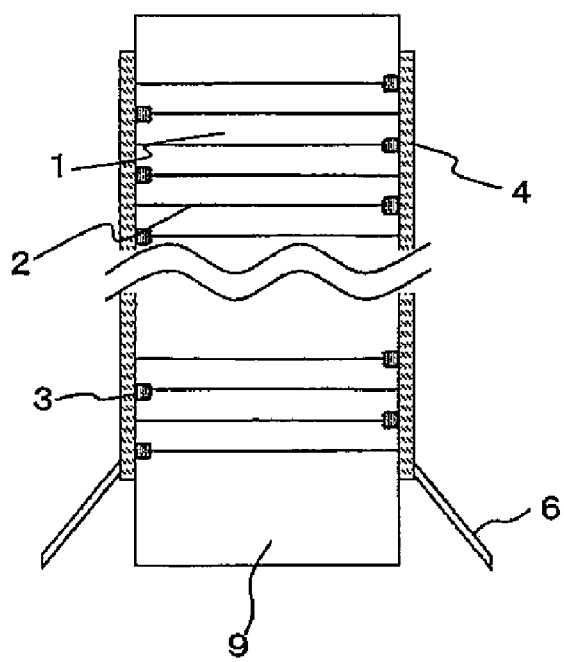
FIG. 2B is an exploded perspective view showing the piezoelectric layer and the internal electrodes being stacked in the multi-layer piezoelectric element of the second embodiment.
Figure 3:
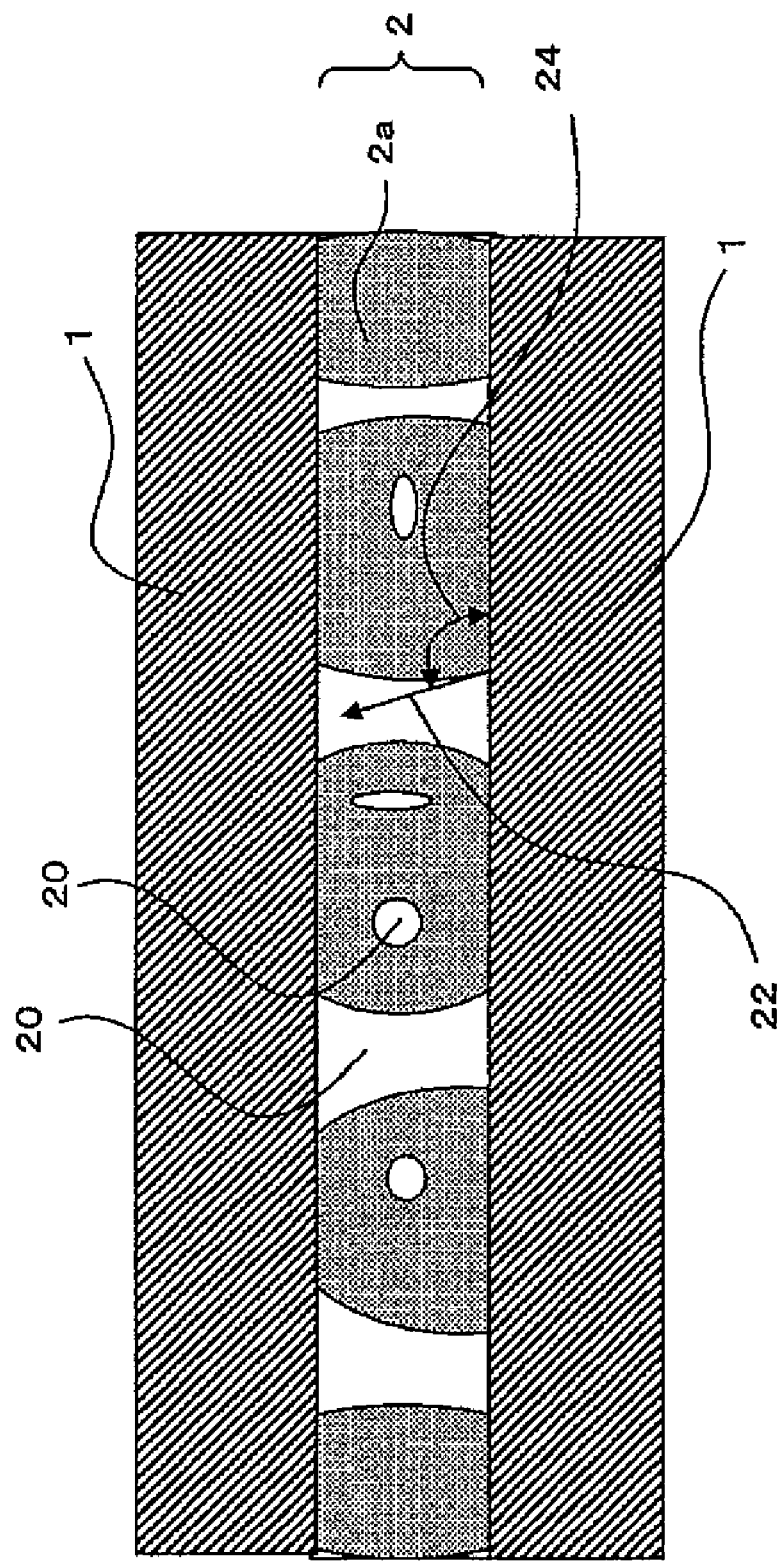
FIG. 3 is an enlarged sectional view of the internal electrode disposed between the piezoelectric layers of the multi-layer piezoelectric element according to the second embodiment.
Figure 4A:
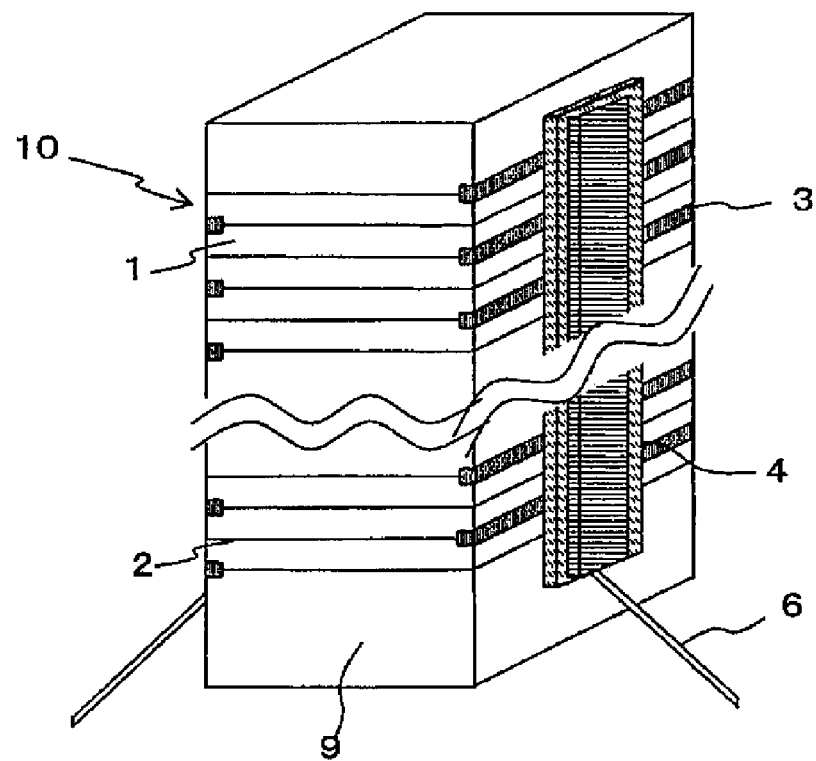
FIG. 4A is a perspective view showing a variation of the multi-layer piezoelectric element of the present invention.
Figure 4B:
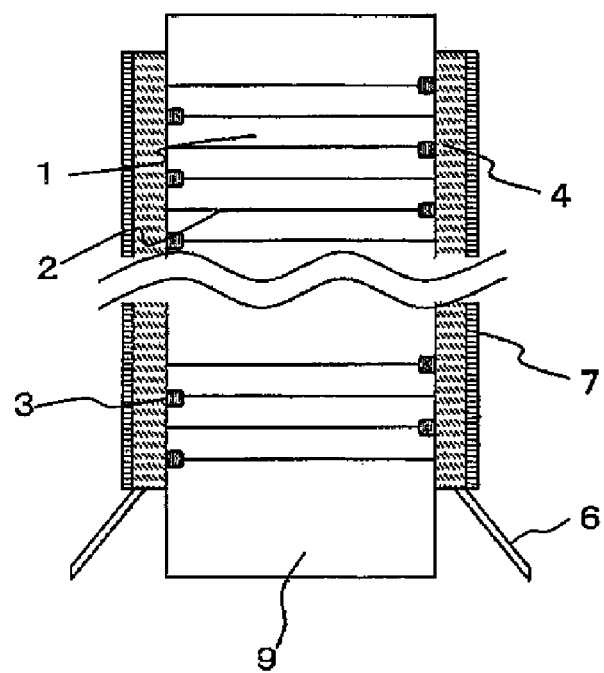
FIG. 4B is a sectional view showing a variation of the multi-layer piezoelectric element of the present invention.

FIGS. 2A and 2B show the constitution of the multi-layer piezoelectric element according to second embodiment of the present invention, where FIG. 2A is a perspective view and FIG. 2B is a sectional view. FIG. 3 is an enlarged sectional view of a portion near the internal electrode of the multi-layer piezoelectric element shown in FIG. 2.

The multi-layer piezoelectric element 10 according to the second embodiment is characterized in that the internal electrode 2 has controlled voids 20, and has a structure substantially similar to that of the multi-layer piezoelectric element of the first embodiment with other respects.

That is, as shown in FIG. 2, the multi-layer piezoelectric element 10 according to the second embodiment has such a constitution as the external electrodes 4 are formed on a pair of opposing side faces of a stack which is formed by stacking the piezoelectric layers 1 and the internal electrodes 2 alternately, while the external electrodes 4 are connected to the ends of the internal electrodes 2 which are exposed in every other layer, so as to establish electrical continuity. Similarly to the first embodiment, inactive layers 9 are provided on both ends of the multi-layer piezoelectric element 10. When the multi-layer piezoelectric element 10 of the second embodiment is used as the multi-layer piezoelectric actuator, lead wires 6 are connected to the external electrodes 4 by soldering, with the lead wires 6 being connected to a power source installed outside, so that the piezoelectric layers 1 undergo a displacement by the reverse piezoelectric effect.

In the multi-layer piezoelectric element 10 of the second embodiment, voids 20 are formed in the internal electrode 2 which is sandwiched by the piezoelectric layers 1 as shown in FIG. 3, with a proportion of the area occupied by is the voids 20 to the total area of a cross section of the internal electrode 2 controlled within a range from 5 to 70%. This constitution is based on the finding by the inventor of the present application that the multi-layer piezoelectric element of high performance with a large amount of displacement can be made by forming the voids 20 with a proportion in a predetermined range in the internal electrode 2 which is sandwiched by the piezoelectric layers 1 as shown in FIG. 3.

In the multi-layer piezoelectric element of the prior art of which the internal electrode 2 does not include the controlled voids 20, the amount of displacement which the piezoelectric layer 1 undergoes in an electric field becomes smaller due to the restriction by the internal electrode 2, resulting in the multi-layer piezoelectric element unable to undergo sufficient amount of displacement.

In the multi-layer piezoelectric element of the second embodiment wherein the internal electrodes 2 include the controlled voids 20, in contrast, the piezoelectric layer can deform freely thus making it possible to make the amount of displacement larger than in the prior art.

The proportion (void ratio) of the area occupied by the voids to the total area of the internal electrode 2 will now be described. The void ratio is determined in a section cut in the stacking direction of the multi-layer piezoelectric element. After measuring the area of the voids existing in the section of the internal electrode, total area of the voids is divided the area (including the voids) of the internal electrode 2, and 100 times the result of division is taken as the void ratio.

When the void ratio is less than 5%, deformation of the piezoelectric layers 1 under the influence of the electric field is restricted by the internal electrode 2, thus resulting in smaller amount of displacement of the multi-layer piezoelectric element. This also affects adversely on durability, since the stress generated inside increases.

When the void ratio is higher than 70%, there arise extremely narrow portions 2a in the electrode between the voids 20. This is not desirable since it decreases the strength of the internal electrode 2, making cracks more likely to occur in the internal electrode 2 and, in the worst case, leads to wire breakage or other trouble. Also it makes the internal electrode 2 less electrically conductive, thus making it difficult to apply a voltage to the piezoelectric layers 1, resulting in such a trouble as, in some cases, sufficient amount of displacement may not be achieved.

The voids 20 may also be included in the electrode portion 2a, besides being provided between the electrode portions 2a as shown in FIG. 3.

The void ratio is preferably in a range from 7 to 70%, more preferably in a range from 10 to 60%. When the void ratio is in this range, the piezoelectric layers 1 can be deformed smoothly and, since the internal electrode 2 has sufficiently high electrical conductivity, the amount of displacement of the multi-layer piezoelectric element 10 can be increased.

The voids 20 preferably have maximum dimension of 1 μm or larger.

When the maximum dimension of the voids is 1 μm or larger, the internal electrode restricts the piezoelectric layer with smaller force so that it becomes easier for the piezoelectric layer to deform, thus resulting in larger amount of displacement and decreased stress. As a result, the multi-layer piezoelectric element of high durability can be provided.

The maximum dimension is determined by drawing a line parallel to the electrode in a section of the multi-layer piezoelectric element in the stacking direction and measuring the length of line segment lying across each of the voids which are included in a cross section of the internal, and taking the largest length. The maximum dimension of the voids 20 is preferably 2 μm and more preferably 3 μm in order to decrease the internal stress and improve the durability.

Angle 24 which the piezoelectric layer 1 forms with tangent 22 of the electrode portion 2a in a portion where the interface between the electrode portion 2a and the void 20 makes contact with the piezoelectric layer 1 in a section of the internal electrode 2 is preferably 60 degrees or more. The angle 24 is defined by drawing the tangent 22 from the point, where the interface between the electrode portion 2a and the void 20 makes contact with the piezoelectric layer 1, so as to make contact with the electrode portion 2a, and as the angle between the tangent 22 and the piezoelectric layer 1 in a section of the multi-layer piezoelectric element in the stacking direction as shown in FIG. 3.

When the angle 24 is less than 60 degrees, the portion of meniscus formed by the contact of the electrode portion 2a in the internal electrode 2 with the piezoelectric layer 1 becomes larger, and therefore the force with which the internal electrode 2 restricts the piezoelectric layer 1 may become larger, thus resulting in smaller amount of displacement. The angle 24 is preferably 70 degrees or more, and more preferably 80 degrees or more, so that the force with which the internal electrode 2 restricts the piezoelectric layer 1 becomes smaller so as to allow a larger amount of displacement, decrease the internal stress and improve durability.

The metal compound in the internal electrode 2 preferably includes a metal of group 8 to 10 and/or a metal of group 11 as the main component. This is because the metals of groups 8 through 10 and group 11 have poor wettability with the piezoelectric layer 1 and are likely to cause voids to be formed in the interface between the piezoelectric layer 1 and the internal electrodes 2, such that firing the stack in this state enables it to form the internal electrodes 2 having a relatively high void ratio.

Moreover, it is preferable to add an inorganic composition that has poor wettability with the material that forms the electrode portion 2a to the internal electrode 2. This is because the existence of the inorganic composition that has poor wettability in the internal electrode 2 causes the electrode portion 2a to be repelled from the vicinity of the inorganic composition that has poor wettability with the material that forms the electrode portion, so that the voids 20 are formed as the space where the electrode portion 2a is absent. Thus the addition of the inorganic composition has an advantage for forming the voids, and therefore enables it to increase the amount of displacement. It is preferable that the inorganic composition includes nitride such as BN, TiN or ZrN as the main component, and EN is more preferably used as the main component. The inorganic composition may also be formed on the surface of the piezoelectric layer 1.

A method of manufacturing the multi-layer piezoelectric element 10 of the second embodiment will now be described.

According to this manufacturing method, first the green sheets which become the piezoelectric layers 1 are made similarly to the first embodiment.

The green sheets are cut to proper size and secured on a frame.

Then a metal powder such as silver-palladium that constitutes the internal electrode 2, a binder and a plasticizer are mixed to prepare an electrically conductive paste which is applied onto the top surface of the ceramic green sheet by screen printing method or the like to a thickness of 1 to 40 μm. Here it is important to use two or more kinds of material having different melting points for the metal powder that constitutes the internal electrode 2 so that voids are formed in the internal electrode 2 after firing, and these materials are preferably metals or alloys. When fired at a temperature not lower than the lowest melting point of the metals or alloys that constitute the internal electrode 2 and not higher than the melting point of the other metal, the metal or alloy that is melted moves into cavities in the internal electrode by the capillary effects thus leaving voids behind. In this way the internal electrodes 2 having the voids of the present invention can be made. The cavities can be formed as small clearance between the particles of the metal powder when preparing the electrically conductive paste or the clearance generated by removing the binder.

Besides the method described above, the voids 20 may also be formed by adding a material that has poor wettability with the internal electrode 2 to the material that constitutes the internal electrode 2. Furthermore, the voids 20 may also be formed by providing a material that has poor wettability with the internal electrode 2 on the surface of the green sheet whereon the internal electrode 2 is to be printed.

Then a dummy layer that includes a sintering assisting agent such as silver-palladium is formed on the top surface of the green sheet by screen printing method or the like to a thickness of 1 to 40 μm, thereby to prepare the green sheets to make the inactive layers 9.

The green sheets having the electrically conductive paste printed on the top surface thereof and the green sheets to make the inactive layers 9 are stacked in plurality so that the inactive layers 9 are disposed at the ends of the multi-layer piezoelectric element, and are bonded together by applying a pressure.

The green sheets are cut to a proper size and are heated to a predetermined temperature to remove the binder, before being fired at a temperature from 900 to 1050° C. thereby to make the multi-layer piezoelectric element 10. When firing, it is important to heat to the firing temperature after holding at a temperature which is not lower than the lowest melting point of the metal or alloy among the metals or alloys that constitute the internal electrode 2 and is lower than the melting point of the metal or alloy that has the second lowest melting point.

The multi-layer piezoelectric element 10 is not limited to that made by the manufacturing method described above, but may be made by any manufacturing method as long as the voids are formed in the internal electrode.

Thereafter, similar procedure as the first embodiment is followed thereby to complete the multi-layer piezoelectric element 10 of the second embodiment.

While an example of forming the external electrodes 4 on the opposing side faces of the multi-layer piezoelectric element 10 has been described above, a pair of external electrodes may also be formed on adjacent side faces according to the present invention.

Third Embodiment

Figure 5A:
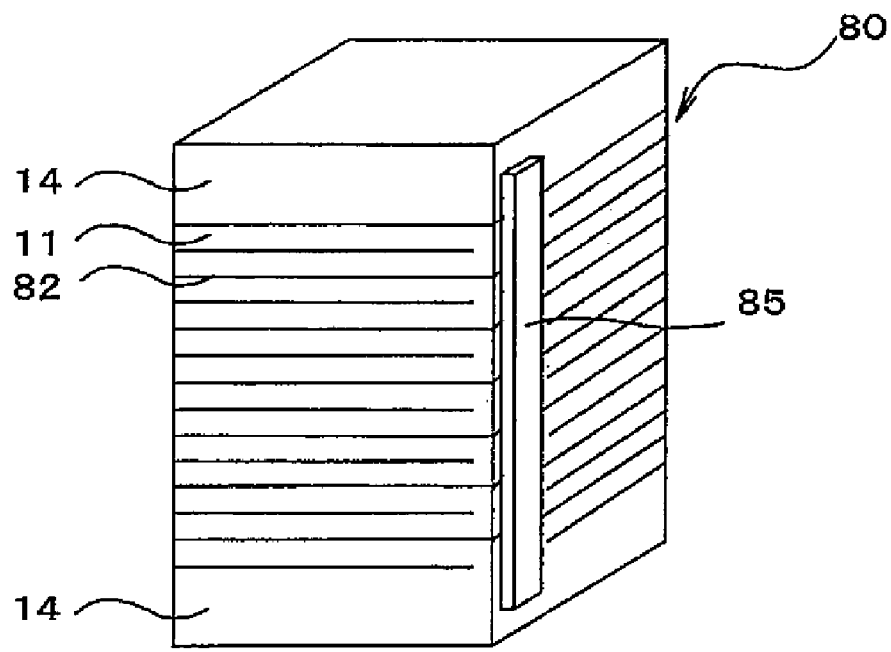
FIG. 5A is a perspective view showing the multi-layer piezoelectric element according to third embodiment of the present invention.
Figure 5B:
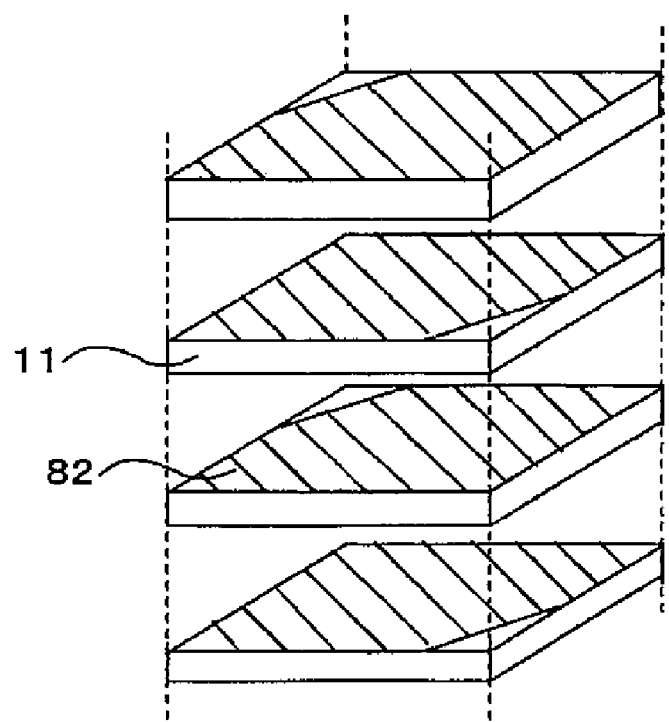
FIG. 5B is an exploded perspective view showing the piezoelectric layer and the internal electrodes being stacked in the multi-layer piezoelectric element of the third embodiment.
Figure 6A:
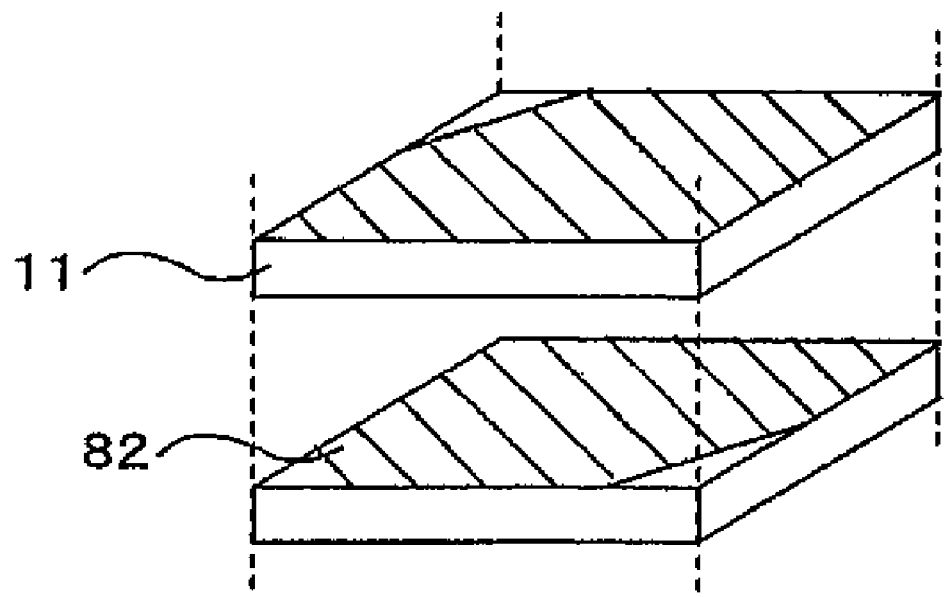
FIG. 6A is an exploded perspective view showing the piezoelectric layer and the internal electrodes being stacked in the multi-layer piezoelectric element of the third embodiment.
Figure 6B:
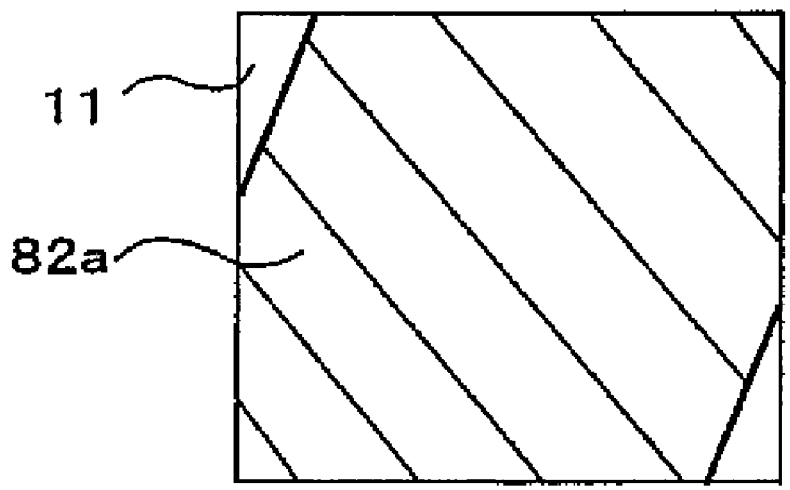
FIG. 6B shows a portion where the internal electrodes of different polarities overlap each other via the piezoelectric layer in the multi-layer piezoelectric element of the third embodiment.

The multi-layer piezoelectric element according to third embodiment of the present invention will now be described. FIGS. 5A and 5B show the constitution of the multi-layer piezoelectric element according to the third embodiment, where FIG. 5A is a perspective view and FIG. 5B is an exploded perspective view showing the piezoelectric layers and the internal electrodes being stacked one on another. FIGS. 6A and 6B are enlarged view showing the internal electrode pattern of the multi-layer piezoelectric element according to the third embodiment, where FIG. 6A is an exploded perspective view showing the piezoelectric layers and the internal electrodes being stacked one on another, and FIG. 6B is a projection view showing a portion 82a where the internal electrode and the external electrode of different polarities overlap via the piezoelectric layer 11.

The multi-layer piezoelectric element of the third embodiment has the internal electrode and the external electrode which are different from those of the first and second embodiments, but has a constitution similar to those of the first and second embodiments with other respects.

The multi-layer piezoelectric element of the third embodiment is characterized in that the portion 82a where the internal electrodes of different polarities overlap via the piezoelectric layer 11 has a configuration that is not line symmetry. The portion 82a where the internal electrodes of different polarities overlap via the piezoelectric layer 11 refers to a region where the electrode patterns of the internal electrodes 82 which are formed via the piezoelectric layer 11 of the multi-layer piezoelectric element to which voltages of different polarities are applied overlap each other. In actuality, the piezoelectric layer 11 undergoes effective displacement in the region sandwiched by the internal electrodes 82 to which voltages of different polarities applied (the portion 82a where the internal electrode and the external electrode of different polarities overlap via the piezoelectric layer 11), so as to achieve the operation of the multi-layer piezoelectric element. Accordingly, when the portion 82a where the internal electrode and the external electrode of different polarities overlap via the piezoelectric layer 11 has a configuration of line symmetry, displacement occurs with the largest amplitude along the line of symmetry like the ridge line of mountains, thus giving rise to the possibility of the stacked layers peeling off starting at a point where the axis of symmetry passes the side face of the device, thus leading to the destruction of the device. Moreover, existence of the straight line along which the same amount of displacement occurs causes resonance to occur leading to beat or harmonics signals having frequencies that are integral multiples of power frequency that acts as noise and may lead to malfunction.

When the portion 82a where the internal electrodes of different polarities overlap via the piezoelectric layer 11 has a configuration that is not line symmetry, in contrast, the stacked layers can be prevented from peeling off even when the device undergoes changes in the dimension continuously when the multi-layer piezoelectric element is operated. Also because it is made possible to suppress the occurrence of resonance that would occur when the device undergoes the same amount of displacement, not only beat tone can be prevented from occurring but also the generation of harmonics signal can be prevented. Thus noise in the control signal can be suppressed so that the actuator can be prevented from malfunctioning. The configuration not in line symmetry here means a configuration that does not have line symmetry.

According to the present invention, it is preferable that the portion 82a where the internal electrodes of different polarities overlap via the piezoelectric layer 11 has a configuration of point symmetry. When the portion 82a where the internal electrodes of different polarities overlap via the piezoelectric layer 11 has a configuration that is not point symmetry, displacement of the device leads to deviation of the axis of displacement because of non-alignment of the axis of displacement. By forming the internal electrode 82 in the configuration of point symmetry, the axis of displacement of the device is aligned in a straight line so that the device does not experience deviation of the axis of displacement, thus making it possible to provide the piezoelectric actuator having high durability and high reliability so that the device does not experience deviation of the axis of displacement.

Here the term "point symmetry" means a shape that has a center of symmetry. According to the present invention, a point is arbitrarily set within a plane of the portion 82a where the internal electrodes of different polarities overlap via the piezoelectric layer 11 and, when the portion 82a where the internal electrodes of different polarities overlap via the piezoelectric layer 11 is rotated around the point so as to become parallel to the surface, the shape is identical before and after the rotation with an angle of rotation not larger than 180 degrees. The center of rotation in this operation is the center of symmetry. While typical shapes having point symmetry include symmetry with respect to 180 degrees rotation, symmetry with respect to 120 degrees rotation and symmetry with respect to 90 degrees rotation, it is preferable to employ symmetry with respect to 180 degrees rotation which enables it to minimize the path required to establish continuity between the internal electrodes 82 and the external electrodes 85, so that the multi-layer piezoelectric element can be manufactured with a simple structure and high precision.

In case the center of symmetry is located at the center of gravity of the portion 82a where the internal electrodes of different polarities overlap via the piezoelectric layer 11, the centers of gravity of the portions 82a where all of the internal electrodes of different polarities overlap via the piezoelectric layers 11 are arranged along a straight line in the direction of stacking. As a result, not only the center axis of displacement is aligned on a straight line but also the center of gravity corresponds with the center axis of displacement, thus making it possible to provide the piezoelectric actuator having high durability and high reliability.

Also according to the present invention, it is preferable that the internal electrodes 82 of different polarities are exposed on all side faces of the device. Since a portion where the internal electrode 82 is not exposed on the side face of the device cannot undergo displacement during operation, the region which undergoes displacement during operation is confined within the device, and therefore stress undergo displacement during operation generated by displacement is concentrated in the border between a portion having the electrode and a portion without electrode, thus causing an undesirable effect on durability. As the internal electrodes 82 of different polarities are exposed on all side faces of the device, stress generated in the device when operated as an actuator can be propagated to the outside of the device, thus it is made possible to provide a piezoelectric actuator having high durability and high reliability.

Also according to the present invention, it is preferable that the pattern for insulating the external electrodes 85 of different polarities is formed on the internal electrode 82. Unless the pattern for insulating the external electrodes 85 of different polarities is formed on the internal electrode 82, there is a possibility of short-circuiting. When the pattern for insulating the external electrodes 85 of different polarities is formed on the internal electrode 82, it is not necessary to provide a region for preventing insulation on the outside of the device. As a result, dimensional change of the device due to displacement does not cause the insulation prevention portion to peel off or spark due to peel off, thus it is made possible to provide a piezoelectric actuator having high durability and high reliability.

According to the present invention, it is made possible to provide the piezoelectric actuator having high durability and high reliability that achieves both a large amount of displacement and prevention of insulation breakdown, by setting the distance L1 between the internal electrode 82 and the external electrode 85 of different polarities in a range from 0.1 to 5 mm. When the distance is larger than 5 mm, area of the internal electrode decreases and, accordingly, drive region of the piezoelectric layer 11 becomes smaller which is not desirable. When the distance is less than 0.1 mm, insulation property sharply deteriorates.

In order to increase the size of the drive region and improve durability, the distance is preferably in a range from 0.1 mm to 3 mm, and more preferably in a range from 0.5 mm to 1 mm. The distance L1 is the insulation distance between the internal electrode 82 and the external electrode 85 on the piezoelectric layer 11 where the internal electrode 82 is provided, and represents the shortest distance of insulation.

Figure 7:
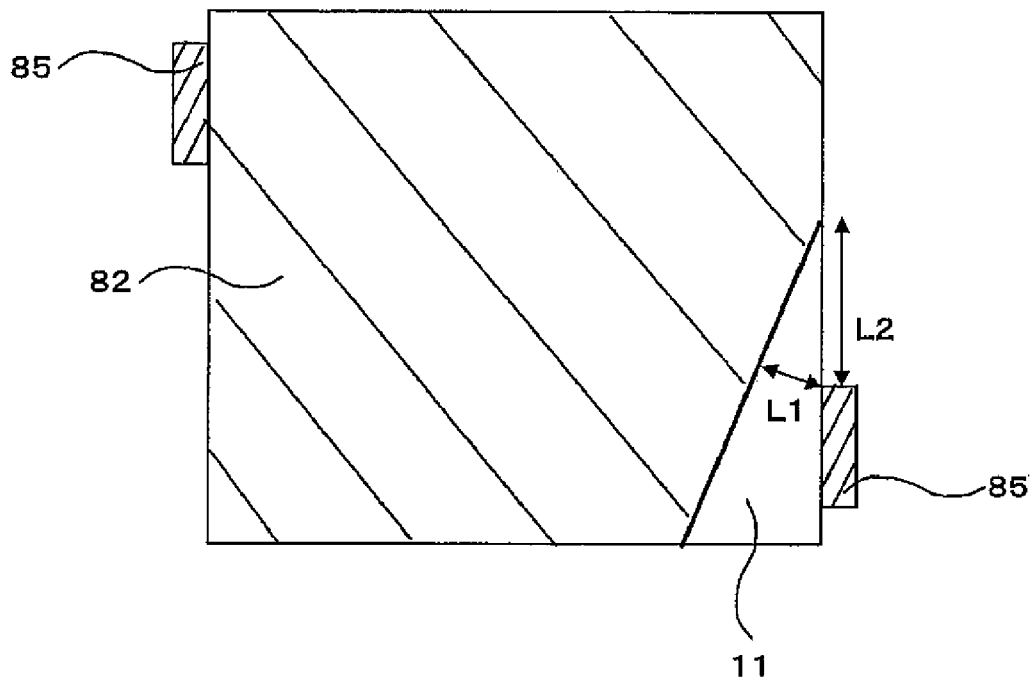
FIG. 7 is a cross sectional view showing the distance between the internal electrode and the external electrode in the multi-layer piezoelectric element of the third embodiment.

Also according to the present invention, it is made possible to provide the piezoelectric actuator having high durability and high reliability that achieves both a large amount of displacement and prevention of insulation breakdown, by setting the distance L2 between the internal electrode 82 and the external electrode 85 of different polarities on the device surface in a range from 0.1 to 5 mm as shown in FIG. 7. When the distance is larger than 5 mm, area of the internal electrode decreases and, accordingly, drive region of the piezoelectric layer 11 becomes smaller which is not desirable. When the distance is less than 0.1 mm, insulation property sharply deteriorates.

In order to increase the size of the drive region and improve durability, the distance is preferably in a range from 0.1 mm to 3 mm, and more preferably in a range from 0.5 mm to 1 mm. The distance L2 is the insulation distance between one of the internal electrodes 82 and the external electrode 85 on the side face of the stack 80, and represents the shortest distance of insulation.

Also according to the present invention, since C plane or R plane is formed in the internal electrode pattern 82, stress can be suppressed from being concentrated in the edge of the electrode pattern during displacement of the device, thus it is made possible to provide a piezoelectric actuator having high durability and high reliability. It is preferable that C plane or R plane is formed in the entire internal electrode pattern 82, since this improves durability. Also it is preferable that C plane or R plane is formed in the piezoelectric layer 11, since this improves durability further. It is further preferable to form the entire periphery of the electrode pattern with curves, since this increases the amount of displacement and this improves durability further.

A method of manufacturing the multi-layer piezoelectric element of the third embodiment will now be described.

According to this manufacturing method, first ceramic green sheets and an electrically conductive paste for the internal electrode 82 are made similarly to the first and second embodiments.

The electrically conductive paste is applied onto the top surfaces of the green sheets by screen printing method or the like to a thickness of 1 to 40 µm.

At this time, the internal electrode pattern is formed so that the portion 82a where the internal electrodes of different polarities overlap via the piezoelectric layer 11 has a configuration that is not line symmetry.

A plurality of the green sheets having the electrically conductive paste applied on the top surfaces thereof are stacked one on another, and the stack is heated to a predetermined temperature to remove the binder, before being fired at a temperature from 900 to 1200° C. thereby to make the stack 80.

It is preferable, similarly to the first and second embodiments, to apply a slurry comprising a metal powder such as silver-palladium or the like that constitutes the internal electrode 82, an inorganic compound, a binder and a plasticizer onto the green sheet so as to match the shrinking behavior and shrinking rate between the inactive layer 14 and the other portions during sintering, when adding the metal powder such as silver-palladium that constitutes the internal electrode 82 to the green sheet for making the inactive layer 14 or stacking the green sheet for making the inactive layer 14.

The stack 80 is not limited to that made by the manufacturing method described above, but may be made by any manufacturing method as long as the stack 80 constituted from a plurality of piezoelectric layers 11 and a plurality of internal electrodes 82 stacked alternately one on another can be made.

Thereafter, similar procedure as the first or second embodiment is followed so as to complete the multi-layer piezoelectric element of the third embodiment.

The multi-layer piezoelectric element of the present invention is not limited to the examples described above, and various modifications may be made within the scope of the present invention.

While an example of forming the external electrodes 85 on the opposing side faces of the stack 80 has been described above, a pair of external electrodes may also be formed on adjacent side faces according to the present invention.

Fourth Embodiment

Figure 10A:
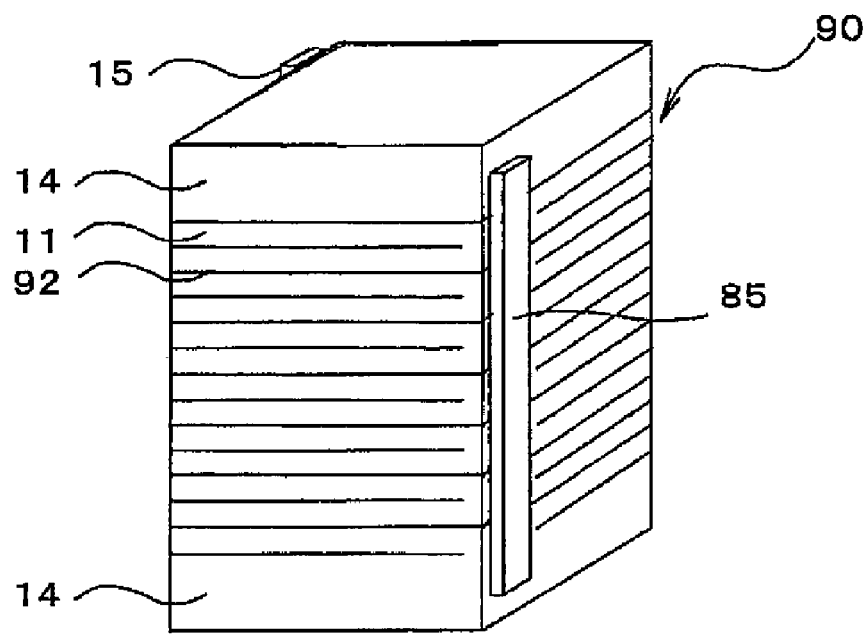
FIG. 10A is a perspective view showing the multi-layer piezoelectric element according to the fourth embodiment of the present invention.
Figure 10B:
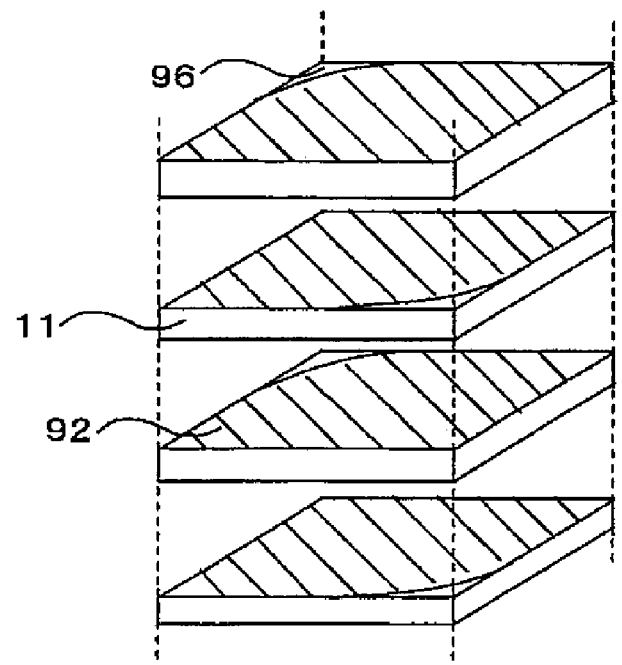
FIG. 10B is an exploded perspective view showing the piezoelectric layer and the internal electrodes being stacked in the multi-layer piezoelectric element of the fourth embodiment.
Figure 11A:
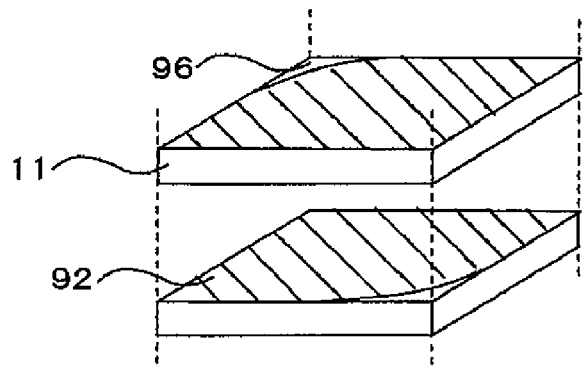
FIG. 11A is an exploded perspective view showing the piezoelectric layer and the internal electrodes being stacked in the multi-layer piezoelectric element of the fourth embodiment.
Figure 11B:
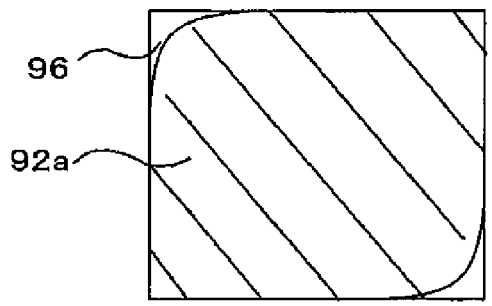
FIG. 11B shows a portion where the internal electrodes of different polarities lap over each other via the piezoelectric layer in the multi-layer piezoelectric element of the fourth embodiment.

The multi-layer piezoelectric element according to fourth embodiment of the present invention will now be described. FIGS. 10A and 10B show the constitution of the multi-layer piezoelectric element according to the fourth embodiment, where FIG. 10A is a perspective view and FIG. 10B is an exploded perspective view showing the piezoelectric layers and the internal electrodes being stacked one on another. FIG. 11 is an enlarged view showing the internal electrode pattern of the multi-layer piezoelectric element according to the present invention, where FIG. 11A is an exploded perspective view showing the piezoelectric layers and the internal electrodes being stacked one on another, and FIG. 11B is a projection view showing a portion 92a where the internal electrodes of different polarities overlap via the piezoelectric layer 11.

The multi-layer piezoelectric element according to the fourth embodiment has a constitution similar to that of the third embodiment, except for the internal electrode which has a constitution different from that of the third embodiment.

That is, the multi-layer piezoelectric element according to the fourth embodiment has the external electrodes 85 formed on the opposing side faces of the stack 13 constituted from the piezoelectric layers 11 and the internal electrodes 92 stacked alternately one on another, where the external electrodes 85 and the internal electrodes 92 are connected as described below. The external electrode 85 formed on one of the opposing side faces is a positive external electrode, and the external electrode formed on the other side is a negative or ground electrode. In the stack 90, the positive internal electrodes 92 and the negative internal electrodes 92 are placed alternately, while the external electrode 85 is connected to the positive internal electrodes 92 on one side face and is insulated from the negative internal electrodes 92 by means of an insulating region 96. On the other hand, the external electrode 85 is connected to the negative internal electrodes 92 on the other side face and is insulated from the positive internal electrodes 92 by means of the insulating region 96.

The multi-layer piezoelectric element according to the fourth embodiment is characterized in that the border between the insulation region 96 and the internal electrode 92 formed on the principal surface of the piezoelectric material 11 has an arc shape (R) as shown in FIG. 10B. The reason for forming the border between the insulation region 96 and the internal electrode 92 in arc shape is that a straight border between the insulation region 96 and the internal electrode 92 allows a crack, if ever occurs in a part of the border, to grow from the starting point along the border leading to destruction of the device. In case the internal electrode pattern includes such an edge portion formed therein as straight lines are butted each other with an arbitrary angle therebetween in the border between the internal electrode 92 and the insulation region 96, stress may be concentrated at the edge, thus resulting in crack generated in the insulation region 96. Generation of such a crack allows short-circuiting to occur between the external electrode 85 and the internal electrodes 92 of different polarities along the crack, thus resulting in significant deterioration in the durability of the multi-layer piezoelectric element.

Figure 10C:
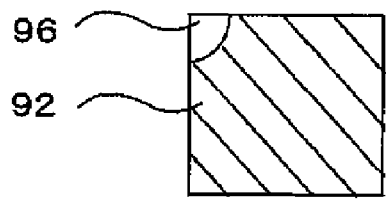
FIG. 10C is a plan view showing the internal electrode pattern of one polarity in the multi-layer piezoelectric element of a variation of the fourth embodiment.
Figure 10D:
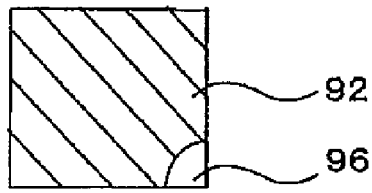
FIG. 10D is a plan view showing the internal electrode pattern of the other polarity in the multi-layer piezoelectric element of the variation of the fourth embodiment.
Figure 10E:
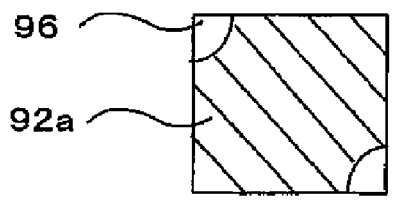
FIG. 10E shows a portion where the internal electrodes of different polarities overlap each other via the piezoelectric layer in the multi-layer piezoelectric element of the variation of the fourth embodiment.

While the pattern of the internal electrode 92 is formed in a convex R shape protruding toward the insulation region 96 in FIG. 10B, it is not required to be convex since the only requirement according to the present invention is that the border between the internal electrodes 92 and the insulation region 96 has R shape. For example, the pattern of the internal electrode 92 may be formed in concave shape toward the insulation region 96, or convex shape and concave shape having R shape may be alternately formed consecutively (refer to, for example, FIGS. 10C, 10D and 10E).

Also as will be apparent from the above discussion, in order to further improve durability of the multi-layer piezoelectric element, convex or concave configuration of R shape is preferable, and it is preferable that the border is formed from a curve of the same radius of curvature, rather than a series of curved sections of different radii of curvature, for the reason of higher durability. Moreover, concave shape is preferable in order to further improve durability, since the internal electrode receives compressive stress from the side face of the device when voltage is removed after causing the device to undergo displacement by applying the voltage to the multi-layer piezoelectric element.

The portion where the internal electrodes 92 of different polarities overlap via the piezoelectric layer 11 preferably has R shape. This is because, since it is the region of the piezoelectric layer 11 sandwiched by the internal electrodes of different polarities where effective displacement occurs, stress would be concentrated in the border making crack likely to occur there when the overlapping portion has straight edge. As a result, since the piezoelectric layer 11 sandwiched by the internal electrodes of different polarities oscillates to expand and contract in the stacking direction of the multi-layer piezoelectric element, the crack tends to grow from the border in the stacking direction, thus giving rise to the possibility of crack being generated so as to connect the internal electrodes 92 of different polarities resulting in short-circuiting.

Therefore, it is preferable that the portion 92a where the internal electrodes of different polarities overlap via the piezoelectric layer 11 has a shape of point symmetry. This is because, when the portion 92a where the internal electrodes of different polarities overlap via the piezoelectric layer 11 has a configuration that is not point symmetry, displacement of the device leads to deviation of the axis of displacement because of non-alignment of the axis of displacement. By forming the internal electrode 92 in the configuration of point symmetry, the axis of displacement of the device is aligned in a straight line so that the device does not experience deviation of the axis of displacement, thus making it possible to provide the piezoelectric actuator having high durability and high reliability where the axis of displacement of the device is aligned in a straight line so that the device does not experience deviation of the axis of displacement.

Here the term "point symmetry" means a shape that has a center of symmetry. As a point is arbitrarily set within a plane of the portion 92a where the internal electrodes of different polarities overlap via the piezoelectric layer 11 and, when the portion 92a where the internal electrodes of different polarities overlap via the piezoelectric layer 11 is rotated around the point so as to become parallel to the surface, the shape is identical before and after the rotation with an angle of rotation not larger than 180 degrees. The center of rotation in this operation is the center of symmetry. While typical shapes having point symmetry include symmetry with respect to 180 degrees rotation, symmetry with respect to 120 degrees rotation and symmetry with respect to 90 degrees rotation, it is preferable to employ symmetry with respect to 180 degrees rotation which enables it to minimize the path required to establish continuity between the internal electrodes 92 and the external electrodes 85, so that the multi-layer piezoelectric element can be manufactured with a simple structure and high precision.

It is further preferable that the center of symmetry is located at the center of gravity of the portion 92a where the internal electrodes of different polarities overlap via the piezoelectric layer 11, since the centers of gravity of the portions 92a where all of the internal electrodes of different polarities overlap via the piezoelectric layers 11 are arranged along a straight line in the direction of stacking. As a result, not only the center axis of displacement is aligned on a straight line but also the center of gravity corresponds with the center axis of displacement, thus making it possible to provide the piezoelectric actuator having high durability and high reliability.

Also it is preferable that the internal electrode 92 is exposed on the side face of the stack 13. This is because, since a portion where the internal electrode 92 is not exposed on the side face of the device cannot undergo displacement during operation, the region which undergoes displacement during operation is confined within the device, and therefore stress tends to be concentrated in the border, thus causing an undesirable effect on durability.

The portion 92a where the internal electrodes of different polarities overlap via the piezoelectric layer 11 is the region where the electrode patterns of the internal electrodes 92 with voltages of different polarities applied thereto overlap each other as shown in FIG. 11A, and the electrode patterns overlap each other via the piezoelectric layer 11 as shown in FIG. 11B. In actuality, the piezoelectric layer 11 undergoes effective displacement in the region sandwiched by the internal electrodes 92 to which voltages of different polarities are applied (the portion 92a where the internal electrodes 92 of different polarities overlap via the piezoelectric layer 11), so as to achieve the operation of the multi-layer piezoelectric element.

It is preferable that radius of curvature of the R shape is in a range from 0.5 to 10 mm. When the radius of curvature of the R shape is less than 0.5 mm, this is equivalent to such a situation as a corner formed by straight lines butted each other is formed as the border between the internal electrode 92 and the insulation region 96 in the internal electrode pattern, which makes it likely for the stress to be concentrated at the edge leading to the generation of crack in the piezoelectric layer that is the insulation region. When radius of curvature is in a range from 0.5 to 10 mm, growth of crack straight along the border can be suppressed even when the crack is generated in a part of the border between the internal electrode and the insulation region. Generation of such a crack may cause short-circuiting to occur between the internal electrodes of different polarities along the crack, thus resulting in significant deterioration in the durability of the multi-layer piezoelectric element.

When radius of curvature is larger than 10 mm, the situation becomes similar to the case where the border between the internal electrode 92 and the insulation region 96 is straight and, when a crack is generated in a part of the border, the crack grows along the border and eventually leading to destruction of the device.

The radius of curvature of the R shape is preferably in a range from 1 to 5 mm in order to improve durability, and more preferably in a range from 1 to 3 mm in order to make the multi-layer piezoelectric element having high durability smaller in size.

It is preferable to provide voids 21 in the internal electrode 92 and set the proportion of the area occupied by the voids 21 to the total area of a cross section of the internal electrode 92 within a range from 5 to 70%. This is because the multi-layer piezoelectric element of high performance with a large amount of displacement can be made by forming the voids 21 with a proportion in the range from 5 to 70% of the area of the internal electrode 92.

In case the internal electrode 92 does not include the voids 21, the amount of displacement which the piezoelectric layer 11 undergoes in an electric field becomes smaller due to the restriction by the internal electrode 92, resulting in the multi-layer piezoelectric element unable to undergo sufficient amount of displacement. In the multi-layer piezoelectric element wherein the internal electrodes 92 include the voids 21, in contrast, the piezoelectric layer can deform freely thus making it possible to make the amount of displacement larger.

The proportion (void ratio) of the area occupied by the voids 21 to the total area of the internal electrode 92 is determined in a section cut in the stacking direction of the multi-layer piezoelectric element. After measuring the area of the voids existing in the section of the internal electrode, total area of the voids is divided the area (including the voids) of the internal electrode 2, and 100 times the result of division is taken as the void ratio.

When the void ratio is less than 5%, deformation of the piezoelectric layers 11 under the influence of the electric field is restricted by the internal electrode 92, thus resulting in smaller amount of displacement of the multi-layer piezoelectric element. This also affects adversely on durability, since the stress generated inside increases.

When the void ratio is higher than 70%, there arise extremely narrow portions in the electrode located between the voids 21. This is not desirable since it decreases the strength of the internal electrode 92, making cracks more likely to occur in the internal electrode 92 and, in the worst case, leads to wire breakage or other trouble. Also it makes the internal electrode 92 less electrically conductive, thus making it difficult to apply a voltage to the piezoelectric layers 11, resulting in such a trouble as, in some cases, sufficient amount of displacement may not be achieved.

The voids 21 may also be included in the electrode portion, besides being provided between the electrode portions.

The void ratio is preferably in a range from 7 to 70%, more preferably in a range from 10 to 60%. When the void ratio is in this range, the piezoelectric layers 11 can be deformed smoothly and, since the internal-electrode 92 has sufficiently high electrical conductivity, the amount of displacement of the multi-layer piezoelectric element can be increased.

The voids 21 preferably have maximum dimension of 1 μm or larger in the section. The maximum dimension is determined by drawing a line parallel to the electrode in a section of the multi-layer piezoelectric element in the stacking direction and measuring the length of line segment lying across each of the voids which are included in a cross section of the internal electrode, and taking the largest length. The maximum dimension of the voids 21 is preferably 2 μm and more preferably 3 μm in order to decrease the internal stress and improve the durability.

Angle 23 which the piezoelectric layer 11 forms with tangent 22 of the electrode portion, in a portion where the interface between the electrode portion and the void makes contact with the piezoelectric layer 11 in a section of the internal electrode 92, is preferably 60 degrees or more. This angle is the angle 23 between the tangent 22 which is drawn from the point, where the interface between the electrode portion and the void 21 makes contact with the piezoelectric layer 11, so as to make contact with the electrode portion, and the piezoelectric layer 11 in a section of the multi-layer piezoelectric element in the stacking direction.

When the angle 23 is less than 60 degrees, the portion of meniscus formed by the contact of the electrode portion in the internal electrode 92 with the piezoelectric layer 11 becomes larger and therefore the force with which the internal electrode 92 restricts the piezoelectric layer 11 may become larger, thus resulting in smaller amount of displacement. The angle is preferably 70 degrees or more, and more preferably 80 degrees or more, so that the force with which the internal electrode 92 restricts the piezoelectric layer 11 becomes smaller so as to allow a larger amount of displacement, decrease the internal stress and improve durability.

The stack 13 is preferably a polygonal prism. This is because, in case the stack 13 has a cylindrical shape, layers formed in a shape of true circle must be stacked since deviation from true circle results in misalignment of the central axis. Thus it is difficult to employ a manufacturing method designed for mass production based on fire-at-once process. Layers formed in substantially circular shape may be stacked and, after being fired when it is preferred, ground on the circumference into cylindrical shape. But this process makes it difficult to align the center axes of the internal electrodes with high precision. Polygonal prism, in contrast, enables it to form the internal electrodes on the piezoelectric layer having a predetermined datum line, and stack the layers in alignment with the datum line. As a result, the center axis of the operation can be formed by a manufacturing method designed for mass production so as to make a device having high durability.

It is made possible to provide the piezoelectric actuator having high durability and high reliability that achieves both a large amount of displacement and prevention of insulation breakdown, by setting the distance L1 between the internal electrodes 92 and the external electrodes 85 of different polarities in a range from 0.1 to 5 mm. When the distance is larger than 5 mm, area of the internal electrode decreases and, accordingly, drive region of the piezoelectric layer 11 becomes smaller which is not desirable. When the distance is less than 0.1 mm, insulation property sharply deteriorates.

Figure 12:
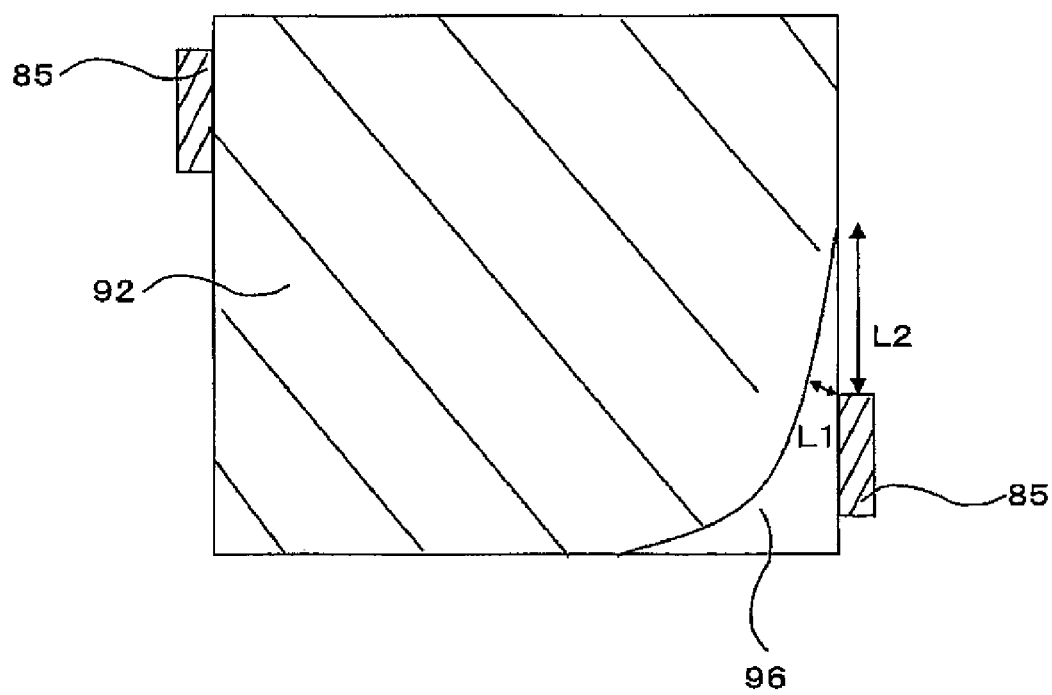
FIG. 12 is a cross sectional view showing the distance between the internal electrode and the external electrode in the multi-layer piezoelectric element of the fourth embodiment.

In order to increase the size of the drive region and improve durability, the distance is preferably in a range from 0.1 mm to 3 mm, and more preferably in a range from 0.5 mm to 1 mm. The distance L1 is the insulation distance between the internal electrode 92 and the external electrode 85 on the piezoelectric layer 11 where the internal electrode 92 is provided, and represents the shortest distance of insulation (shown in FIG. 12).

Also according to the present invention, it is made possible to provide the piezoelectric actuator having high durability and high reliability that achieves both a large amount of displacement and prevention of insulation breakdown, by setting the distance L2 (shown in FIG. 12) between the internal electrode 92 and the external electrode 85 of different polarities on the device surface in a range from 0.1 to 5 mm. When the distance is larger than 5 mm, area of the internal electrode decreases and, accordingly, drive region of the piezoelectric layer 11 becomes smaller which is not desirable. When the distance is less than 0.1 mm, insulation property sharply deteriorates.

In order to increase the size of the drive region and improve durability, the distance is preferably in a range from 0.1 mm to 3 mm, and more preferably in a range from 0.5 mm to 1 mm. The distance L2 is the insulation distance between one of the internal electrodes 92 and the external electrode 85 on the side face of the stack 13, and represents the shortest distance of insulation.

A method of manufacturing the multi-layer piezoelectric element of the fourth embodiment will now be described.

According to this manufacturing method, ceramic green sheets are first made and an electrically conductive paste to form the internal electrodes 92 is prepared similarly to the first through third embodiments.

The electrically conductive paste is applied onto the top surfaces of the green sheets by screen printing method or the like to a thickness of 1 to 40 μm. In order to form the internal electrodes 92 in R shape, a printing plate having R-shaped pattern formed thereon in advance is used in the screen printing process. When the electrodes are formed by thin film technology, a mask pattern represented by metal mask having the R-shaped pattern formed thereon is placed on the green sheet, thereby to form the electrode pattern.

A plurality of the green sheets having the electrically conductive paste applied on the top surfaces thereof are stacked one on another, and the stack is heated to a predetermined temperature to remove the binder, before being fired at a temperature from 900 to 1200° C. thereby to make the stack 13.

Thereafter, similar procedure as the third embodiment is followed so as to complete the multi-layer piezoelectric element of the fourth embodiment and the multi-layer piezoelectric actuator that employs the former.

The multi-layer piezoelectric element of the present invention is not limited to the examples described above, and various modifications may be made within the scope of the present invention.

While an example of forming the external electrodes 85 on the opposing side faces of the stack 13 has been described above, a pair of external electrodes may also be formed on adjacent side faces according to the present invention.

Fifth Embodiment

The multi-layer piezoelectric element according to the fifth embodiment of the present invention is constituted similarly to the multi-layer piezoelectric element of the first embodiment, except that the thermal expansion coefficient $\alpha_1$ of the metal that constitutes the internal electrode 12 and the thermal expansion coefficient $\alpha_2$ of the metal that constitutes the external electrode 15 are set so that the ratio ($\alpha_1/\alpha_2$) is 0.9 or larger and is below 1. Except for controlling the thermal expansion coefficient of the internal electrode 12 and the thermal expansion coefficient of the external electrode 15 to satisfy a particular relationship, the multi-layer piezoelectric element of the fifth embodiment is constituted similarly to the multi-layer piezoelectric element of the first embodiment.

The reason for controlling the thermal expansion coefficient of the internal electrode 12 and the thermal expansion coefficient of the external electrode 15 to satisfy the particular relationship is as follows. When the ratio ($\alpha_1/\alpha_2$) is less than 0.9, the difference between the thermal expansion coefficient of the metal in the internal electrode 12 and the thermal expansion coefficient of the metal in the external electrode 15 becomes too large and, when the device undergoes a large number of operation cycles in continuous operation leading to a high temperature of the device, contact failure in the junction between the internal electrode 12 and the external electrode 15 may occur resulting in a decrease in the effective amount of displacement of the multi-layer piezoelectric element, or peel off of the electrodes and wire breakage in the junction between the internal electrode 12 and the external electrode 15 may occur during continuous operation. When the ratio ($\alpha_1/\alpha_2$) becomes 1 or larger, dimensional change of the piezoelectric porcelain in addition to the thermal expansion of the internal electrodes 12 imposes a greater load on the junction between the internal electrode 12 and the external electrode 15. As a result, in addition to the decrease in durability of the multi-layer piezoelectric element and the decrease in the amount of displacement, peel off of the electrodes and wire breakage such as described above may occur during continuous operation.

By setting the ratio ($\alpha_1/\alpha_2$) of thermal expansion coefficients to 0.9 or larger and below 1, the problems of decrease in the amount of displacement of the multi-layer piezoelectric element and destruction of the device due to spark in the peel-off can be eliminated. This also eliminates malfunction of the device and achieves high durability without thermal excursion.

In the multi-layer piezoelectric element of the present invention described above, the ratio ($\alpha_1/\alpha_2$) of thermal expansion coefficients can be controlled to 0.9 or larger and below 1 as follows.

The conventional multi-layer piezoelectric elements have been manufactured by stacking the piezoelectric layers 11 and the internal electrodes 12 alternately one on another, firing the stack so as to sinter the piezoelectric porcelain and the internal electrode 12, and providing the external electrodes 15. In this process, in order to sinter the piezoelectric layers 11 and the internal electrodes 12 at the same time, silver-palladium alloy that has a sintering temperature higher than that of pure silver and lower than those of palladium and platinum has been used to form the internal electrodes 12. On the other hand, the external electrodes 15 have been made by printing and firing a silver paste prepared by adding glass flit to silver, in order to form it by firing at a temperature lower than the temperature at which the piezoelectric layers 11 and the internal electrodes 12 are fired at the same time. However, the mismatch between the metals that are used in the internal electrodes 12 and the external electrodes 15 results in the difference in thermal expansion, which leads to a decrease in durability of the device. The ratio ($\alpha_1/\alpha_2$) of thermal expansion coefficients in this case is less than 0.9.

According to the present invention, in order to control the ratio ($\alpha_1/\alpha_2$) of thermal expansion coefficients within a range from 0.9 or larger and below 1, it is necessary to form the internal electrodes 12 and the external electrodes 15 from materials that have thermal expansion coefficients of proximate values or add inorganic compound having thermal expansion coefficients of proximate values to the internal electrodes 12 and the external electrodes 15. Particularly it is effective in decreasing the resistance of the internal electrode and suppress the device temperature from rising, to place the metal component with higher concentration in the portion where the internal electrodes 12 and the external electrodes 15 are bonded together, rather than mixing the metal and the inorganic compound uniformly in the electrodes. For this purpose, the rate of cooling down from the maximum firing temperature may be made slower after firing the external electrodes 15. Specifically, the cooling rate may be set to 600° C. per hour or lower, and preferably 300° C. per hour or lower. In order to improve the durability of the device, the ratio ($\alpha_1/\alpha_2$) of thermal expansion coefficients is preferably controlled within a range from 0.95 or larger and below 1, and more preferably within a range from 0.97 or larger and below 1.

Figure 15:
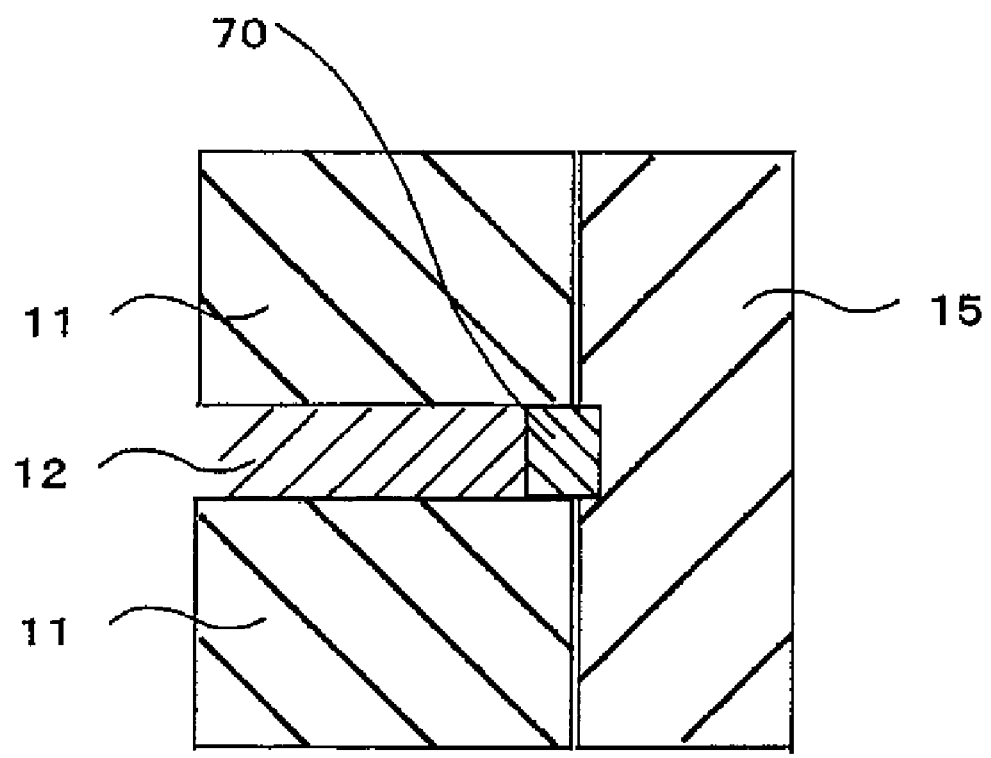
FIG. 15 is an enlarged sectional view of a part of junction between the internal electrode and the external electrode in the multi-layer piezoelectric element of the fifth embodiment of the present invention.

The multi-layer piezoelectric element of the sixth embodiment preferably has an intermediate layer 70 in the junction between the internal electrode 12 and the external electrode 15 as shown in FIG. 15.

This is because, when the external electrodes 15 are formed by a thin film forming technology such as sputtering in which case the internal electrode cannot be formed, stress generated by the difference in thermal expansion coefficient between the internal electrodes 12 and the external electrodes 15 is concentrated in the junction between the internal electrodes 12 and the external electrodes 15 and makes it likely that, when the multi-layer piezoelectric element is operated, breakage occurs in the junction between the internal electrodes 12 and the external electrodes 15 thus causing a spark in the rupture surface or the device stops operation.

In order to form the intermediate layer 70, the external electrodes 15 may be formed by baking so that the metal components included in the internal electrodes 12 and the external electrodes 15 diffuse mutually.

Specifically, a paste for the external electrode including a glass flit that has a low melting point added thereto is used so that liquid phase can be formed in the external electrode at a temperature lower than the firing temperature of the internal electrode. However, since the intermediate layer 70 cannot be formed by merely employing the method described above, oxide of the metal that constitutes the external electrode 15 may be added to the paste used to form the external electrode, so as to accelerate the dispersion of the metal that constitutes the external electrode in the liquid phase. This makes it possible to accelerate the sintering process of the external electrode 15 and, at the same time, to form the intermediate layer 70 in the junction between the internal electrodes and the external electrodes via the liquid phase in the internal electrodes 12 which contacts the external electrodes 15. At this time, while only the oxide of the metal that constitutes the external electrode 15 may be added to the paste used to form the external electrode, it is preferable to add the oxide of a metal that constitutes the external electrode in a mixture with another glass component or as a component of the glass flit, in order to form the liquid phase at a lower temperature.

Formation of the intermediate layer 70 may be confirmed by observing under an optical microscope, preferably an SEM.

The multi-layer piezoelectric element having very high durability can be made by setting the thermal expansion coefficient $\alpha_1$ of the metal that constitutes the internal electrode 12 and the thermal expansion coefficient $\alpha_2$ of the metal that constitutes the external electrode 15 so that the ratio $(\alpha_1/\alpha_2)$ is 0.9 or larger and is below 1 and providing the intermediate layer 70 in the junction between the internal electrodes 12 and the external electrodes 15.

At this time, very high bonding strength can be achieved between the internal electrodes and the external electrodes, by causing the main component of the metal compound that constitutes the external electrodes 15 to represent 80% by weight or more of the metal compound that constitutes the internal electrodes 12, so that the metal of the internal electrodes 12 and the metal of the external electrodes 15 diffuse mutually. In this case, such a trouble does not occur as the internal electrodes and the external electrodes have a difference in thermal expansion coefficients thereof that would cause peel off. Also because a new intermetallic compound is not formed between the internal electrodes and the external electrodes, portions having uneven composition which may become the start point of stress destruction during operation of the multi-layer piezoelectric element can be prevented from being formed. When the proportion by which the main component of the metal compound that constitutes the external electrodes 15 exists in the metal compound that constitutes the internal electrodes 12 is less than 80% by weight, a new intermetallic compound or an alloy may be formed between the internal electrodes 12 and the external electrodes 15, thus making the portion where it is formed harder and more brittle. Also because the multi-layer piezoelectric element is a device of which dimensions change during operation, stress is generated in the junction between the internal electrodes 12 and the external electrodes 15 as the dimension changes. When the new intermetallic compound or alloy that is hard and brittle is formed in the junction, the peel off or wire breakage described above may occur in the junction. When the internal electrodes 12 are constituted solely from the main component of the metal compound that constitutes the external electrodes 15, on the other hand, it is made impossible to form the intermediate layer 70 through mutual diffusion. As a result, since a stress relieving layer is not formed in the junction between the internal electrodes 12 and the external electrodes 15, durability cannot be maintained when the multi-layer piezoelectric element undergoes displacement during continuous operation.

In order to improve durability of the device, it is preferable that the proportion by which the main component of the metal compound that constitutes the external electrodes 15 exists in the metal compound that constitutes the internal electrodes 12 is 85% by weight or more, more preferably 90% by weight or more, and most preferably 95% by weight or more.

In the multi-layer piezoelectric element of the present invention, it is preferable to form the intermediate layer 70 from the metal component of the internal electrodes 12 and the metal component of the external electrodes 15. This constitution achieves very high bonding strength through mutual diffusion of the internal electrodes 12 and the external electrodes 15. Also because an intermetallic compound or glass component is not formed between the internal electrodes 12 and the intermediate layer 70 and between the external electrodes 15 and the intermediate layer 70, hard and brittle portion which may become the start point of stress destruction can be prevented from being formed.

Also because the atmosphere in which the internal electrodes 12 is fired and the atmosphere in which the external electrodes 15 is fired can be made identical, chemical reactions such as oxidation and reduction of the metals that constitute the electrodes can be prevented from occurring as the firing atmosphere changes. As a result, peel off and wire breakage can be suppressed from occurring during continuous operation due to contact failure between the internal electrode 12 and the external electrode 15, thus making it possible to prevent the problem of malfunction of the device and achieves high durability without thermal excursion.

In this case, when an inorganic compound such as glass exists in the intermediate layer 70, since stress generated by the difference in thermal expansion coefficient between the internal electrodes 12 and the external electrodes 15 is concentrated in the intermediate layer 70, the inorganic compound that is harder and more brittle than metal acts as the start point of destruction, and peel off or wire breakage described above may occur during continuous operation which accompanies deformation of the device.

In order to form the intermediate layer 70 from the metal component that constitutes the internal electrodes 12 and the metal component that constitutes the external electrodes 15, liquid phase including the oxide of the external electrode is formed when forming the external electrode so as to selectively grow the crystal of the metal component between the internal electrodes and the external electrodes, thereby to expel the liquid phase component to the outside of the intermediate layer 70 and form the intermediate layer 70. For this purpose, it is necessary to form the liquid phase when holding the external electrode firing temperature and not to allow the inorganic compound in the intermediate layer 70 in the cooling phase. When the oxide of the external electrode is added to the glass flit, the metal component of the oxide of the external electrode is taken into the intermediate layer 70 during cooling step after firing, thus enabling the liquid phase to precipitate as a glass layer around the intermediate layer 70. When the cooling rate is fast at this time, the oxide of the external electrode is formed within the intermediate layer 70 before the metal component of the oxide of the external electrode is taken into the intermediate layer 70. Therefore, the rate of cooling from the firing holding temperature to 600° C. may be set slower than 500° C. per hour.

Whether the thermal expansion coefficient $\alpha_3$ of the intermediate layer 70 is larger or smaller than $\alpha_1$ and $\alpha_2$, stress generated during operation of the multi-layer piezoelectric element of the present invention is concentrated in the intermediate layer 70, thus leading to destruction during operation of the device. In case the coefficients satisfy the relation $\alpha_2 < \alpha_3 < \alpha_1$, dimensional change of the piezoelectric porcelain in addition to the thermal expansion of the internal electrodes 12 imposes a greater load on the junction between the internal electrode 12 and the external electrode 15 when the multi-layer piezoelectric element is put into continuous operation, thus resulting in lowering of durability, smaller effective amount of displacement and peel off or wire breakage during continuous operation. When the thermal expansion coefficients are set so as to satisfy the relationship $\alpha_1<\alpha_3<\alpha_2$, it is made possible to achieve very high bonding strength through mutual diffusion of metal components of the internal electrodes 12 and the external electrodes 15 and, since stress generated by the difference in thermal expansion coefficient between the internal electrodes 12 and the external electrodes 15 is concentrated in the intermediate layer 70, concentration of stress at one point can be avoided, and peel off or wire breakage described above can be prevented from occurring due to contact failure between the internal electrode 12 and the external electrode 15 during continuous operation, thus making it possible to prevent the problem of malfunction of the device and achieve high durability without thermal excursion. Thermal expansion coefficient of the intermediate layer 70 can be determined by heating it while measuring the temperature and measuring the dimensions of the intermediate layer 70 under SEM. Thermal expansion coefficient may also be determined by a test piece of the same composition.

In the multi-layer piezoelectric element of the present invention, it is preferable that composition of the intermediate layer 70 changes gradually from the composition of the metal of the internal electrodes 12 to the composition of the metal component of the external electrodes 15. Such a constitution enables it to mitigate the stress while suppressing the stress generated by the difference in thermal expansion coefficient between the internal electrodes 12 and the external electrodes 15 from being concentrated at one point in the intermediate layer, and therefore it is made possible to prevent the electrodes from peeling off, increase the bonding strength between the internal electrode and the external electrode and improve durability further. That is, stress can be suppressed from being concentrated between the internal electrodes 12 and the intermediate layer 70 and between the external electrodes 15 and the intermediate layer 70 even when dimensional change occurs in the piezoelectric porcelain in addition to the thermal expansion of the internal electrodes 12 during continuous operation of the multi-layer piezoelectric element, and the stress can be absorbed by the intermediate layer 70 as a whole. Thus it is made possible to suppress peel off or wire breakage from occurring due to contact failure between the internal electrode 12 and the external electrode 15 during continuous operation, eliminate malfunction of the device and achieve high durability without thermal excursion. In order to form such a gradient layer, it is necessary to apply heat treatment when providing the external electrodes to the device. However, the heat treatment must be carried out at a temperature lower than the melting point or liquidus temperature for the metal compound of the internal electrode and the metal compound of the external electrode, in order to suppress the metal compound of the internal electrode and the metal compound of the external electrode from undergoing mutual diffusion and turn into uniform composition. The heat treatment is preferably carried out at a temperature in a range from 50% to 95%, more preferably from 80% to 95% of the melting point or liquidus temperature in terms of absolute temperature, which enables the composition of the intermediate layer 70 to change gradually from the composition of the metal component of the internal electrodes 12 to the composition of the metal component of the external electrodes 15.

The multi-layer piezoelectric element of the fifth embodiment can be made similarly to the first embodiment, except for forming the intermediate layer as described above.

Preferred forms of the internal electrode, the external electrode and the piezoelectric layer according to the first through fifth embodiments of the present invention will now be described.

(Internal Electrode)

It is preferable that the metal compound in the internal electrode 2 includes group 8 to group 10 metal and/or group 11 metal as the main components. This is because these metal compounds have high heat resistance and therefore allow the piezoelectric layer 1 which has a higher firing temperature and the internal electrode 2 to be fired at the same time, in addition to the capability of these metals to suppress migration. When the piezoelectric layer and the internal electrode are fired at the same time, not only firm bonding can be achieved in the interface, but also stress concentration can be prevented from occurring by the expansion and contraction of the internal electrode when stress is generated in the internal electrode due to displacement of the device, thus suppressing the occurrence of cracks. Also as described in the second embodiment, poor wettability with the piezoelectric layer 1 makes voids likely to be generated in the interface between the piezoelectric layer 1 and the internal electrode 2. When such layers are stacked and fired, the internal electrodes 2 having relatively high void ratio can be formed.

It is preferable that such a metal compound is included in the internal electrode 2 as the main component that proportion M1 (% by weight) of the group 8 to group 10 metal and proportion M2 (% by weight) of the group 11 metal satisfy the relations $0<M1\leq15$, $85\leq M2<100$ and $M1+M2=100$. This is because proportion of the group 8 to group 10 metal higher than 15% by weight results in high specific resistance of the internal electrode 2 which causes the internal electrodes 2 to generate heat when the multi-layer piezoelectric element is operated continuously. Thus it is made possible to suppress temperature of the multi-layer piezoelectric element from rising and stabilize the amount of displacement. In order to suppress the group 11 metal included in the internal electrode 2 from migrating into the piezoelectric layers 1, it is preferable to control the proportion of the group 8 to group 10 metal in a range from 0.001 to 15% by weight. For the purpose of improving the durability of the multi-layer piezoelectric element 10, proportion of the group 8 to group 10 metal is preferably in a range from 0.1 to 10% by weight. In case excellent heat conductivity and higher durability are required, proportion of the group 8 to group 10 metal is preferably in a range from 0.5 to 10% by weight. In order to improve the durability further, proportion of the group 8 to group 10 metal is preferably in a range from 1 to 8% by weight.

Proportion of the group 11 metal is preferably 85% by weight or more because proportion of the group 11 metal lower than 85% by weight results in high specific resistance of the internal electrode 2 which causes the internal electrodes 2 to generate heat when the multi-layer piezoelectric element 10 is operated continuously. In order to suppress the group 11 metal included in the internal electrode 2 from migrating into the piezoelectric layers 1, it is preferable to control the proportion of the group 11 metal in a range from 85 to 99.999% by weight. For the purpose of improving the durability of the multi-layer piezoelectric element 10, proportion of the group 11 metal is preferably in a range from 90 to 99.9% by weight. In case higher durability is required, proportion of the group 11 metal is preferably in a range from 90.5 to 99.5% by weight. In order to improve the durability further, proportion of the group 11 metal is preferably in a range from 92 to 98% by weight.

Concentrations of the group 8 to group 10 metal and the group 11 metal in the internal electrode 2 can be determined by analytical method such as EPMA (Electron Probe Micro Analysis).

Metal elements included in the internal electrode 2 of the present invention are preferably the group 8 to group 10 metal that is at least one kind selected from among Ni, Pt, Pd, Rh, Ir, Ru and Os, and the group 11 metal that is at least one kind selected from among Cu, Ag and Au, since such a metal composition is advantageous in volume production when the alloy powder synthesizing technology available today is employed.

Further, it is preferable that the group 8 to group 10 metal included in the internal electrode 2 is at least one kind selected from among Pt and Pd, and the group 11 metal is at least one kind selected from among Ag and Au. This composition makes it possible to form the internal electrode 2 which has high heat resistance and low specific resistance.

Further, it is preferable that the group 11 metal of the metal component of the internal electrode 2 is Cu. This composition makes it possible to form the internal electrode 2 which has high heat conductivity with a possibility of mitigating the stress generated therein.

In a fuel injection apparatus that employs the multi-layer piezoelectric element of which the internal electrode 2 includes the group 11 metal of Cu as the main component, the fuel injection apparatus can be prevented from running out of control even when, for example, the pressure of discharging the fuel suddenly increases. Specifically, when the pressure of discharging the fuel suddenly increases and the device provided in the fuel injection apparatus is exposed to vapor of the fuel, a device that employs electrode formed from Ag may stop operation due to corrosion of Ag because S (phosphorus) included in the fuel can form AgS. In case the internal electrode is formed from Cu which is inactive to S, operation will not be affected if such a trouble should occur.

The group 8 to group 10 metal included in the internal electrode 2 is preferably Ni. This constitution may enable it to form the internal electrode 2 that is high in heat resistance and in oxidation resistance.

Moreover, it is preferable to add an inorganic composition, that has poor wet ability with the material that constitutes the internal electrode, to the internal electrode. This is because the existence of the inorganic composition that has poor wet ability with the internal electrode 2 causes the electrode portion 2a to be repelled from the vicinity of the inorganic composition that has poor wet ability with the material that forms the electrode portion, so that the voids 20 are formed as the space where the electrode portion 2a is absent. Thus the addition of the inorganic composition has an advantage for forming the voids, and therefore enables it to increase the amount of displacement. It is preferable that the inorganic composition includes nitride such as BN, TiN or ZrN as the main component, and BN is more preferably used as the main component. The inorganic composition may also be formed on the surface of the piezoelectric layer 1.

(Piezoelectric Layer)

It is preferable that the piezoelectric layer 1 includes perovskite type oxide as the main component. This is because the piezoelectric layer 1 formed from perovskite type piezoelectric ceramic material such as barium titanate ($BaTiO_3$) has high piezoelectric strain constant $d_{33}$ which enables it to increase the amount of displacement. This constitution also enables the piezoelectric layer 1 and the internal electrode 2 to be fired at the same time. It is also preferable that the piezoelectric layer 1 includes perovskite type oxide consisting of $PbZrO_3$—$PbTiO_3$, that has a relatively high value of piezoelectric strain constant $d_{33}$, as the main component.

The firing temperature of the piezoelectric material is preferably in a range from 900 to 1050° C. When the firing temperature is lower than 900° C., the firing process does not fully proceed, and it becomes difficult to make dense piezoelectric material 1. When the firing temperature is higher than 1050° C., larger stress is generated due to the difference in contraction between the internal electrode 2 and the piezoelectric material 1 when fired, thus resulting in cracks occurring during continuous operation of the multi-layer piezoelectric element 10.

The deviation in the composition of the internal electrode 2 that is caused by the firing operation, which is related to the firing temperature of the piezoelectric material 1, is preferably not larger than 5%. This is because a deviation larger than 5% in the composition of the internal electrode 2 caused by the firing operation causes a greater amount of the metallic component included in the internal electrode 12 to diffuse into the piezoelectric material 11, thus making it impossible for the internal electrode 2 to deform in conformity with the expansion and contraction of the multi-layer piezoelectric element 10 during operation.

The deviation in the composition of the internal electrode 2 refers to the variation in the composition of the internal electrode 2 caused by evaporation of the elements that constitute the internal electrode 2 due to firing or diffusion thereof into the piezoelectric layer 1.

(External Electrode)

The external electrodes are preferably formed from a porous electrical conductor having three-dimensional mesh structure. Unless the external electrodes 4 are formed from a porous electrical conductor having three-dimensional mesh structure, the external electrodes 4 do not have flexibility and cannot follow the expansion and contraction of the multi-layer piezoelectric actuator, eventually causing breakage of the external electrodes 4 and/or contact failure between the external electrode 4 and the internal electrode 2. The three-dimensional mesh structure means, rather than such a state as spherical voids are included in the external electrodes 4, that the powders of electrically conductive material and glass that constitute the external electrodes 4 are baked at a relatively low temperature and therefore sintering reaction does not fully proceed so that the voids are connected to each other to a certain extent, thereby forming three-dimensional configuration of the powders of electrically conductive material and glass that constitute the external electrodes 4 being bonded with each other.

Void ratio in the external electrode 4 is preferably in a range from 30 to 70% by volume. The void ratio means the proportion of the volume occupied by the voids 4a in the external electrodes 4. When the void ratio in the external electrode 4 is less than 30%, the external electrodes 4 may not be capable of enduring the stress generated by the expansion and contraction of the multi-layer piezoelectric actuator, eventually leading to breakage of the external electrode 4. When the void ratio in the external electrode 4 is higher than 70%, resistance of the external electrode 4 becomes higher and the external electrode 4 may be broken due to localized heating when a large current is supplied.

It is also preferable that softening point of the glass that constitutes the external electrode 4 is not higher than $4/5$ times the melting point (° C.) of the electrically conductive material that constitutes the internal electrode 2. This is because, when the softening point (° C.) of the glass that constitutes the external electrode 4 is higher than $4/5$ times the melting point of the electrically conductive material that constitutes the internal electrode 2, the softening point of the glass that constitutes the external electrode 4 and the melting point of the electrically conductive material that constitutes the internal electrode 2 become proximate to each other. Such a condition results in coagulation of the electrically conductive material of the internal electrodes 2 and the external electrodes 4 that impedes the joining through diffusion from taking place. Also it makes it impossible to set the baking temperature at a proper temperature for the glass component of the external electrode 4 to soften, resulting in failure to achieve sufficient strength of bonding by the softened glass.

It is also preferable that a glass-rich layer is formed on the surface of the external electrode 4 on the side of the surface of the piezoelectric layer 1. This is because, without the glass-rich layer, it is difficult to bond the glass component in the external electrodes 4, and firm bonding between the external electrode 4 and the piezoelectric layer 1 cannot be easily achieved.

The glass that constitutes the external electrodes 4 is preferably amorphous. This is because the external electrode 4 constituted from crystalline glass is not capable of absorbing the stress generated by the expansion and contraction of the multi-layer piezoelectric actuator, and may be cracked.

It is also preferable that thickness of the external electrode 4 is smaller than the thickness of the piezoelectric layer 1. This is because the external electrodes 4 thicker than the piezoelectric layer 1 has higher strength, resulting in increasing load on the junction between the external electrodes 4 and the internal electrode 2, eventually causing contact failure when the stack 10 undergoes expansion and shrinkage.

It is preferable that an electrical conductivity assisting member 7 formed from an electrically conductive adhesive, including a metal mesh or a mesh-like metal sheet embedded therein, is provided on the external surface of the external electrode 4. Unless the electrical conductivity assisting member 7 is provided on the external surface of the external electrode 4, the external electrodes 4 is not capable of tolerating a large current flowing through the multi-layer piezoelectric element 10 thus resulting in localized heat generation and wire breakage.

Also unless the metal mesh or mesh-like metal sheet is provided on the external surface of the external electrode 4, the external electrode 4 may peel off from the side face of the multi-layer piezoelectric element 10 due to fatigue during the operation since the stress generated by the expansion and contraction of the multi-layer piezoelectric element 10 exerts directly on the external electrode 4.

The metal mesh refers to a structure of entwined metal wires, and the mesh-like metal sheet refers to a metal sheet with a number of holes punched therethrough.

It is further preferable that the electrically conductive adhesive that constitutes the electrical conductivity assisting member is polyimide resin including electrically conductive particles dispersed therein. Use of polyimide resin which has relatively high heat resistance makes it easier for the electrically conductive adhesive to maintain high bonding strength even when the multi-layer piezoelectric element 10 is operated at a high temperature.

The electrically conductive particles are preferably silver powder. This is because the use of silver powder that has relatively low specific resistance as the electrically conductive particles makes it easier to suppress localized heat generation by the electrically conductive adhesive.

When silver powder that has relatively low specific resistance is dispersed in polyimide resin that has high heat resistance, the electrical conductivity assisting member 7 can be formed that maintains low resistivity and high bonding strength even when used at high temperatures. More preferably, the electrically conductive particles are non-spherical particles having such shapes as flakes or acicular particles. When the electrically conductive particles are non-spherical particles such as flakes or acicular particles, the electrically conductive particles can be firmly entwined with each other, thereby increasing the shear strength of the electrically conductive adhesive.

It is preferable that the multi-layer piezoelectric element 10 of the present invention comprises a single plate or a stack of one or more layers. This constitution enables it to both transform a pressure applied to the device into a voltage and cause the device to undergo displacement by applying a voltage to the device. As a result, even when an unexpected stress is generated during operation, the stress can be mitigated by distributing the stress and converting it into voltage, thus making it possible to provide a piezoelectric actuator having excellent durability and high reliability.

The multi-layer piezoelectric element 10 of the present invention preferably has such a constitution as an end of one of the internal electrode 2 is exposed on the side face of the multi-layer piezoelectric element and an end of the other internal electrode 2 located in the next layer is not exposed, while a groove 3 is formed in the piezoelectric material 1 located between the internal electrode 2 of which end is not exposed and the external electrode 4, with the groove being filled with an insulating material such as resin or rubber that has Young's modulus lower than that of the piezoelectric material 1. This constitution enables the multi-layer piezoelectric element 10 to mitigate the stress generated by the displacement so that heat can be suppressed from being generated in the internal electrode 2 during continuous operation.

Sixth Embodiment

Figure 16:
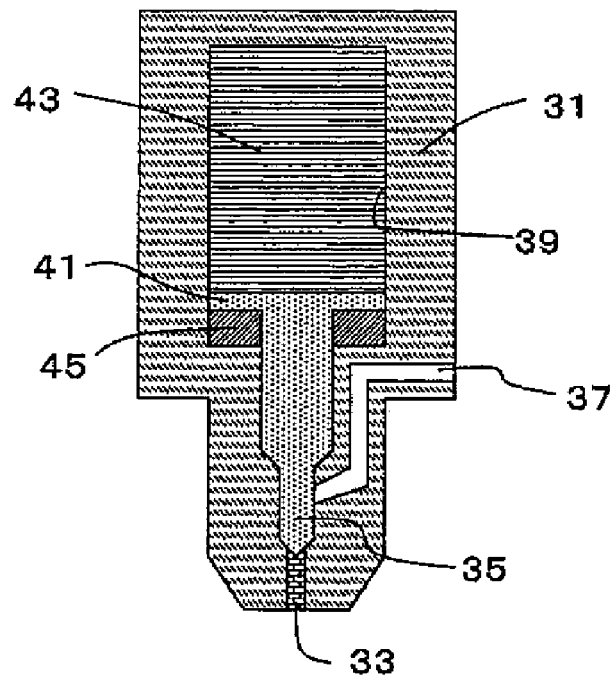
FIG. 16 is a sectional view of a fuel injection apparatus according to the sixth embodiment of the present invention.

FIG. 16 shows an injection apparatus according to the sixth embodiment of the present invention, where a container 31 has an injection hole 33 formed at one end thereof, and a needle valve 35 that can open and close the injection hole 33 is housed in the container 31.

The injection hole 33 is provided with a fuel passage 37 disposed in communication therewith. The fuel passage 37 is connected to a fuel source that is provided outside of the apparatus, so as to receive supply of fuel at a high pressure that remains always constant. When the needle valve 35 opens the injection hole 33, the fuel that fills the fuel passage 37 is injected at a predetermined level of high pressure into a fuel chamber of an internal combustion engine that is not shown in the drawings.

The needle valve 35 has an enlarged top portion of a larger diameter so as to serve as a piston 41 that makes sliding motion in a cylinder 39 which is formed in the container 31. The piezoelectric actuator 43 is housed in the container 31.

With the injection apparatus as described above, when the piezoelectric actuator 43 is caused to expand by a voltage applied thereto, the piston 41 is pressed so that the needle valve 35 plugs the injection hole 33 and shuts off the fuel supply. When the voltage is removed, the piezoelectric actuator 43 contracts and a Belleville spring 4S presses back the piston 41 so that the injection hole 33 communicates with the fuel passage 37 thereby allowing the fuel to be injected.

The multi-layer piezoelectric element and the injection apparatus according to preferred embodiments of the present invention have described, but the present invention is not limited to the embodiments described above. For example, the present invention can be applied to a fuel injection apparatus of automobile engine, liquid ejecting apparatus of ink jet printer or the like or a drive unit used in precision positioning device or vibration preventing device for an optical apparatus, or to sensor devices such as a sensor element mounted in combustion pressure sensor, knocking sensor, acceleration sensor, load sensor, ultrasound sensor, pressure sensor, yaw rate sensor or the like, or used as a circuit component mounted in piezoelectric gyro, piezoelectric switch, piezoelectric transducer, piezoelectric breaker or the like, and is also applicable to other purposes, as long as the piezoelectric characteristic is utilized.

EXAMPLES

Example 1

As Example 1, a multi-layer piezoelectric actuator comprising the multi-layer piezoelectric element according to the first embodiment of the present invention was fabricated as described below.

First, a calcined powder of a piezoelectric ceramic material constituted from lead titanate zirconate ($PbZrO_3$—$PbTiO_3$) having a mean particle size of 0.4 µm as the main component, a binder and a plasticizer were mixed to form a slurry which was formed into ceramic green sheets that would become the piezoelectric material 11 having a thickness of 150 µm by the doctor blade process.

An electrically conductive paste, prepared by adding silver oxide and a binder to the silver-palladium alloy made of a predetermined composition, was applied to one side of the ceramic green sheet by screen printing method to a thickness of 3 µm. Then 300 pieces of the ceramic green sheets were stacked and fired at a temperature of 1000° C. after holding at 800° C.

Then a groove measuring 50 µm in depth and 50 µm in width was formed at the end of the internal electrode located on the side face of the stack in every other layer, by means of a dicing apparatus.

Then 90% by volume of silver powder of flake-like particles having a mean particle size of 2 µm and 10% by volume of amorphous glass powder having softening point of 640° C. including silicon having a mean particle size of 2 µm as the main component were mixed, and 8 weight parts of binder and 100 weight parts in total of silver powder and glass powder were added to this mixture, so as to prepare the electrically conductive silver-glass paste by fully mixing the powders. The electrically conductive silver-glass paste thus prepared was screen printed onto a release film. After drying, the paste film was peeled off the release film to obtain a sheet of electrically conductive silver-glass paste. Density of the green sheet was measured by Archimedes method, and a value of 6.5 g/cm$^3$ was obtained.

The sheet of the silver-glass paste was transferred onto the external electrode 15 surface of the stack 13 and was baked at 650° C. for 30 minutes, thereby forming the external electrode from the porous electrically conductive material having three-dimensional mesh structure. Measurement of void ratio of the external electrode 15 by means of image analysis apparatus on a photograph of a cut surface of the external electrode showed a void ratio of 40%.

Then lead wires were connected to the external electrodes 15, and DC electric field of 3 kV/mm was applied between the positive and negative external electrodes 15 via the lead wires so as to apply polarization treatment for 15 minutes, thereby to complete the multi-layer piezoelectric actuator based on the multi-layer piezoelectric element as shown in FIG. 1.

When a DC voltage of 200 V was applied to the multi-layer piezoelectric element thus obtained, it underwent the amount of displacement shown in Table 1 in the direction of stacking.

The multi-layer piezoelectric element thus prepared and shown in Table 1 was cut to dimensions of 3 mm by 4 mm by 36 mm, and was subjected to 4-point bending strength test specified in JIS R1601. The test piece had such a structure as the electrode surface of the internal electrode 12 was disposed substantially perpendicular to the longitudinal direction of the test piece. Bending strength was measured by applying a load to the test piece substantially perpendicularly to the longitudinal direction. The load that caused the test piece to break in the interface between the piezoelectric layer 11 and the internal electrodes 12 was taken as the bonding strength between the piezoelectric layer and the internal electrode, since the bonding strength between the piezoelectric layer and the internal electrode is larger than the strength of the piezoelectric layer. Load that caused the test piece to break in the piezoelectric layer 11 was taken as the bending strength of the piezoelectric layer, since strength of the piezoelectric layer is larger than the bonding strength between the piezoelectric layer and the internal electrode.

For the purpose of comparison, the piezoelectric material was cut to dimensions of 3 mm by 4 mm by 36 mm, and was subjected to 4-point bending strength test specified in JIS R1601, to measure the bending strength with the results shown below as well.

TABLE 1

| No. | Test piece | Inorganic compound content (% by volume) | Breaking position | Bonding strength | Bending strength (MPa) | Displacement (µm) |
|---|---|---|---|---|---|---|
| *1 | Device | 75.0 | Piezoelectric layer | Strong | 104 | 8 |
| 2 | Device | 50.0 | Border | Weak | 70 | 42 |
| 3 | Device | 40.0 | Border | Weak | 50 | 49 |
| 4 | Device | 30.0 | Border | Weak | 40 | 52 |
| 5 | Device | 20.0 | Border | Weak | 30 | 54 |
| 6 | Device | 15.0 | Border | Weak | 25 | 55 |
| 7 | Device | 10.0 | Border | Weak | 20 | 56 |
| 8 | Device | 5.0 | Border | Weak | 15 | 57 |
| 9 | Device | 1.0 | Border | Weak | 10 | 58 |
| 10 | Device | 0.0 | Border | Weak | 10 | 58 |
| *11 | Piezoelectric material | — | Piezoelectric material | — | 105 | — |

*Out of the scope of the present invention.

The entry "Device" in Table 1 means the multi-layer Piezoelectric element. "Piezoelectric layer" in the column Of breaking position means that breakage occurred only in the Piezoelectric layer, and "Border" means that breakage Occurred in the border between the piezoelectric layer and The internal electrode.

Inorganic composition content is the content of the inorganic composition included in the internal electrode given in terms of percent by volume.

The column of bonding strength shows whether the bonding strength between the piezoelectric layer and the internal electrode is higher or lower than the strength of the piezoelectric layer, and the column of Displacement shows the amount of displacement of the multi-layer piezoelectric element.

From Table 1, it can be seen that the amount of displacement of the multi-layer piezoelectric element cannot be made sufficiently large when the bonding strength between the piezoelectric layer 11 and the internal electrode 12 is higher than the strength of the piezoelectric layer 11 (sample No. 1), although the amount of displacement of the multi-layer piezoelectric element can be made sufficiently large when the bonding strength between the piezoelectric layer and the internal electrode is lower than the strength of the piezoelectric layer (samples Nos. 2 through 7).

Example 2

As Example 2, a multi-layer piezoelectric actuator comprising the multi-layer piezoelectric element according to the first embodiment of the present invention was fabricated and evaluated.

The multi-layer piezoelectric element of Example 2 is different from that of Example 1 in the composition of the material of the internal electrode 12. The multi-layer piezoelectric element of Example 2 was made and evaluated similarly to Example 1, except for the composition of the material of the internal electrode 12.

Results of evaluating the bending strength are shown in Table 2. Changes in the amounts of displacement of the test pieces were also measured. Displacement (μm) of the multi-layer piezoelectric element after undergoing $1 \times 10^9$ cycles of operation was measured, and was compared with the displacement (μm) of the multi-layer piezoelectric element in the initial state before starting the continuous operation, so as to calculate the percentage change in the amount of displacement and deterioration of the multi-layer piezoelectric element. The results are shown in Table 2.

TABLE 2

| No. | Pd (% by weight) | Pt (% by weight) | Ag (% by weight) | Other metals (% by weight) | Percentage change in displacement (%) |
|---|---|---|---|---|---|
| 1 | 0 | 0 | 100 | 0 | Broken |
| 2 | 0.001 | 0 | 99.999 | 0 | 0.7 |
| 3 | 0.01 | 0 | 99.99 | 0 | 0.7 |
| 4 | 0.1 | 0 | 99.9 | 0 | 0.4 |
| 5 | 0.5 | 0 | 99.5 | 0 | 0.2 |
| 6 | 1 | 0 | 99 | 0 | 0.2 |
| 7 | 2 | 0 | 98 | 0 | 0 |
| 8 | 4 | 1 | 95 | 0 | 0 |
| 9 | 5 | 0 | 95 | 0 | 0 |
| 10 | 8 | 0 | 92 | 0 | 0 |
| 11 | 9 | 0 | 91 | 0 | 0.2 |
| 12 | 9.5 | 0 | 90.5 | 0 | 0.2 |
| 13 | 10 | 0 | 90 | 0 | 0.4 |
| 14 | 15 | 0 | 85 | 0 | 0.7 |

TABLE 2-continued

| No. | Pd (% by weight) | Pt (% by weight) | Ag (% by weight) | Other metals (% by weight) | Percentage change in displacement (%) |
|---|---|---|---|---|---|
| 15 | 20 | 0 | 80 | 0 | 0.9 |
| 16 | 30 | 0 | 70 | 0 | 0.9 |
| 17 | 0 | 0 | 0 | Cu 100% | 0.2 |
| 18 | 0.1 | 0 | 0 | Cu 99.9% | 0 |
| 19 | 0 | 0 | 0 | Ni 100% | 0.4 |

(1) Contents of Pd, Pt, Ag, etc. in the metal of the internal electrode are shown in terms of % by weight.
(2) Percentage change in displacement is the ratio of change in the amount of displacement shown after continuous operation to the initial displacement.

From Table 2, it can be seen that the multi-layer piezoelectric element of sample No. 1 where the internal electrode 12 was formed from 100% silver could not be operated continuously due to breakage caused by silver migration. Samples Nos. 15 and 16 where the metal compound of the internal electrode 12 included more than 15% by weight of group 8 to group 10 metal and less than 85% by weight of group 11 metal, which resulted in high hardness of the internal electrode 12 that led to lower durability of the multi-layer piezoelectric actuator.

Samples Nos. 2 through 14, in contrast, which were formed with such a composition as the proportion M1 (% by weight) of the group 8 to group 10 metal and the proportion M2 of the group 11 metal as the main component satisfied the relations $0 \leq M1 \leq 15$, $85 \leq M2 \leq 100$ and $M1+M2=100$, had lower hardness of the internal electrode 12 and lower specific resistance of the internal electrode 12, so as to suppress heat generation in the internal electrode 12 during continuous operation, thus enabling it to manufacture the multi-layer piezoelectric actuator having stable amount of displacement of the device.

Samples Nos. 17 through 19 also had lower hardness of the internal electrode and lower specific resistance of the internal electrode 12, so as to suppress heat generation in the internal electrode 12 during continuous operation, thus enabling it to manufacture the multi-layer piezoelectric actuator having stable amount of displacement of the device.

Example 3

In Example 3, a multi-layer piezoelectric actuator comprising the multi-layer piezoelectric element according to the second embodiment of the present invention was fabricated and evaluated as follows.

First, a calcined powder of a piezoelectric ceramic material constituted from lead titanate zirconate ($PbZrO_3$—$PbTiO_3$) as the main component, a binder and a plasticizer were mixed to form a slurry which was formed into ceramic green sheets that would become the piezoelectric material 1 having a thickness of 150 μm by the doctor blade process.

An electrically conductive paste, prepared by adding Ag and a binder to the silver-palladium alloy made of an arbitrary composition, was applied to one side of the ceramic green sheet by screen printing method to a thickness of 4 μm. Then 300 pieces of the ceramic green sheets and green sheets to make protective layers were prepared. 30 protective layers, 300 stacks and 30 protective layers were stacked in this order from below. The stack was pressed, degreased and, after being held at a temperature not lower than melting point of Ag, fired at a temperature of 1000° C. Besides this, internal electrode 2 having relatively high proportion of voids 20 was made by adding EN to the electrically conductive paste having binder added to Ag that was processed similarly. In addition, the electrically conductive paste having binder added to Cu and the electrically conductive paste having binder added to Ni were also printed similarly to a thickness of 4 μm by screen printing method. 300 sheets for the stack were prepared. In addition, green sheets to make protective layers were prepared. 30 protective layers, 300 stacks and 30 protective layers were stacked in this order from below. The stack was pressed, degreased and, after being held at a temperature not lower than melting point of the metal included in the electrically conductive paste, temperature was raised to carry out the final firing operation.

Then a groove measuring 50 μm in depth and 50 μm in width was formed at the end of the internal electrode 2 located on the side face of the stack in every other layer, by means of a dicing apparatus.

Then 90% by volume of silver powder of flake-like particles having a mean particle size of 2 μm and 10% by volume of amorphous glass powder having softening point of 640° C. including silicon having a mean particle size of 2 μm as the main component were mixed, and 8 weight parts of binder and 100 weight parts in total of silver powder and glass powder were added to this mixture, so as to prepare the electrically conductive silver-glass paste by fully mixing the powders. The electrically conductive silver-glass paste thus prepared was screen printed onto a release film. After drying, the paste film was peeled off the release film to obtain a sheet of electrically conductive silver-glass paste. Density of the green sheet was measured by Archimedes method, and a value of 6.5 g/cm$^3$ was obtained.

The sheet of the silver-glass paste was transferred onto the external electrode surface of the stack and was baked at 650° C. for 30 minutes, thereby forming the external electrode 4 from the porous electrically conductive material having three-dimensional mesh structure. Measurement of void ratio of the external electrode 4 by means of image analysis apparatus on a photograph of a cut surface of the external electrode 4 showed a void ratio of 40%.

Then lead wires were connected to the external electrodes 4, and DC electric field of 3 kV/mm was applied between the positive and negative external electrodes via the lead wires so as to apply polarization treatment for 15 minutes, thereby to complete the multi-layer piezoelectric actuator based on the multi-layer piezoelectric element as shown in FIG. 2.

When a DC voltage of 170 V was applied to the multi-layer piezoelectric element thus obtained, it underwent displacement as shown in Table 3. Operation test was conducted on this multi-layer piezoelectric element by applying an AC voltage varying between 0 V and +170 V at frequency of 150 Hz at room temperature.

Operation test of the multi-layer piezoelectric element conducted to undergo $1 \times 10^9$ cycles of operation and, at this time, a DC voltage of 170 V was applied to the multi-layer piezoelectric element and the amount of displacement was measured, so as to calculate the percentage change in the amount of displacement before and after the operation test. The percentage change in the amount of displacement before and after the operation test was calculated by dividing the absolute value of the change in the amount of displacement before and after the operation test by the amount of displacement before the operation test and multiplying by 100.

Void ratio, maximum size of the voids and angle were measured as described below.

Void ratio was determined in a section cut in the stacking direction of the multi-layer piezoelectric element. After measuring the area of the voids 20 existing in the section of the internal electrode 2, total area of the voids 20 was divided the area (including the voids) of the internal electrode 2, and 100 times the result of division is taken as the void ratio. Measurement was made at 5 or more points arbitrarily selected, and the average of the measurements was taken as the void ratio. The maximum dimension was determined by drawing a line parallel to the electrode in a section of the multi-layer piezoelectric element in the stacking direction and measuring the length of line segment lying across each of the voids 20 which were included in a cross section of the internal electrode 2, and taking the largest length. Measurement was made at 10 points arbitrarily selected, and the largest value was taken as the maximum dimension. Angle 24 which the piezoelectric layer 1 formed with tangent of the electrode portion 2a in a portion where the interface between the electrode portion 2a and the void 20 made contact with the piezoelectric layer 1 in the internal electrode 2 was determined by measuring the angle at 10 points in a section of the multi-layer piezoelectric element in the stacking direction and calculating the mean value. The results are shown in Table 3.

TABLE 3

| No. | Void ratio (%) | Maximum dimension of voids (μm) | Angle (Degrees) | Main component of internal electrode | Initial displacement (μm) | Percentage change (%) |
| --- | --- | --- | --- | --- | --- | --- |
| *1 | 4 | 1 | 40 | 95Ag—5Pd | 43 | 1.1 |
| 2 | 5 | 16 | 50 | 95Ag—5Pd | 48 | 0.8 |
| 3 | 7 | 17 | 80 | 95Ag—5Pd | 50 | 0.5 |
| 4 | 10 | 18 | 80 | 95Ag—5Pd | 53 | 0.3 |
| 5 | 29 | 19 | 80 | 95Ag—5Pd | 57 | 0.1 |
| 6 | 48 | 20 | 80 | 95Ag—5Pd | 57 | 0 |
| 7 | 60 | 22 | 80 | 95Ag—5Pd | 53 | 0.1 |
| 8 | 70 | 23 | 80 | 95Ag—5Pd | 50 | 0.4 |
| *9 | 80 | 43 | 80 | 95Ag—5Pd | 43 | 1.0 |
| 10 | 30 | 1 | 80 | 95Ag—5Pd | 50 | 0.6 |
| 11 | 30 | 2 | 80 | 95Ag—5Pd | 55 | 0.4 |
| 12 | 31 | 3 | 80 | 95Ag—5Pd | 57 | 0.3 |
| 13 | 32 | 5 | 80 | 95Ag—5Pd | 57 | 0.1 |
| 14 | 31 | 11 | 80 | 95Ag—5Pd | 57 | 0.1 |
| 15 | 31 | 20 | 80 | 95Ag—5Pd | 57 | 0 |
| 16 | 32 | 29 | 80 | 95Ag—5Pd | 57 | 0 |
| 17 | 30 | 52 | 80 | 95Ag—5Pd | 55 | 0.3 |

TABLE 3-continued

| No. | Void ratio (%) | Maximum dimension of voids (μm) | Angle (Degrees) | Main component of internal electrode | Initial displacement (μm) | Percentage change (%) |
|---|---|---|---|---|---|---|
| 18 | 31 | 100 | 80 | 95Ag—5Pd | 52 | 0.5 |
| 19 | 32 | 300 | 80 | 95Ag—5Pd | 52 | 0.5 |
| 20 | 29 | 20 | 50 | 95Ag—5Pd | 48 | 0.7 |
| 21 | 30 | 21 | 50 | 95Ag—5Pd | 54 | 0.5 |
| 22 | 30 | 22 | 70 | 95Ag—5Pd | 55 | 0.2 |
| 23 | 32 | 20 | 80 | 95Ag—5Pd | 57 | 0 |
| 24 | 30 | 22 | 90 | 95Ag—5Pd | 57 | 0.1 |
| 25 | 31 | 20 | 120 | 95Ag—5Pd | 55 | 0.2 |
| 26 | 30 | 21 | 150 | 95Ag—5Pd | 53 | 0.4 |
| 27 | 32 | 20 | 80 | 99.9Ag—0.1Pd | 55 | 0.3 |
| 28 | 30 | 19 | 80 | 99.5Ag—0.5Pd | 57 | 0.1 |
| 29 | 29 | 20 | 80 | 99Ag—1Pd | 57 | 0 |
| 30 | 30 | 22 | 80 | 95Ag—5Pd | 57 | 0 |
| 31 | 32 | 21 | 80 | 92Ag—8Pd | 57 | 0 |
| 32 | 30 | 22 | 80 | 90Ag—10Pd | 55 | 0.1 |
| 33 | 31 | 20 | 80 | 85Ag—15Pd | 55 | 0.2 |
| 34 | 32 | 21 | 80 | 80Ag—20Pd | 53 | 0.4 |
| 35 | 30 | 20 | 80 | 70Ag—30Pd | 52 | 0.5 |
| 36 | 29 | 22 | 80 | 60Ag—40Pd | 52 | 0.5 |
| 37 | 32 | 20 | 80 | 100Cu | 56 | 0.1 |
| 38 | 30 | 21 | 80 | 100Ni | 55 | 0.1 |

(1) Angle in the angle column is the angle between the tangent to the internal electrode and the piezoelectric layer.
(2) Percentage change in displacement is the ratio of change in displacement before and after continuous operation.

From Table 3, it can be seen that sample No. 1 that was Comparative Example showed very small initial displacement and small percentage change of displacement of 1.1% before and after continuous operation indicating lower durability, since the void ratio of the internal electrode 2 was less than 5% which resulted in strong force of the internal electrode 2 to restrict the piezoelectric layer 1. In sample. No. 9, since the void ratio of the internal electrode 2 was higher than 70%, desired voltage could not be applied to the piezoelectric layer 1 resulting in a small initial displacement and, when operated continuously, strength of the internal electrode 2 decreased and accordingly durability deteriorated.

Samples Nos. 2 through 8 and 10 through 38 of the present invention where the ratio of voids 20 the internal electrode 2 was in a range from 5 to 70%, in contrast, showed initial displacement of 48 μm or more, larger than those of Comparative Examples Nos. 1 and 9, thus proving excellent performance as the multi-layer piezoelectric element 10. Samples Nos. 2 through 8 and 10 through 38 of the present invention also showed percentage change of displacement of 0.8% or less before and after continuous operation, smaller than those of Comparative Examples Nos. 1 and 9, proving that the multi-layer piezoelectric element of the present invention is better also in terms of durability.

Samples Nos. 3 through 8, 10 through 19 and 21 through 38, where the maximum dimension of the voids 20 was 1 μm or more, and angle 24 which the piezoelectric layer 1 formed with tangent of the electrode portion 2a in a portion where the interface between the electrode portion 2a and the void 20 contacted the piezoelectric layer 1 in the internal electrode 2 was 60 degrees or more, showed large initial displacement of 50 μm or more, and relatively small percentage change of displacement of 0.6% or less before and after continuous operation, thus proving excellent performance as the multi-layer piezoelectric element in terms of displacement and durability.

Example 4

In Example 4, a multi-layer piezoelectric actuator comprising the multi-layer piezoelectric element according to the third embodiment of the present invention was fabricated as described below.

First, a calcined powder of a piezoelectric ceramic material constituted from lead titanate zirconate ($PbZrO_3$—$PbTiO_3$) having a mean particle size of 0.4 μm as the main component, a binder and a plasticizer were mixed to form a slurry which was formed into ceramic green sheets that would become the piezoelectric material 11 having a thickness of 150 μm by the doctor blade process.

An electrically conductive paste, prepared by adding and a binder to the silver-palladium alloy (95% by weight of silver and 5% by weight of palladium), was applied to one side of the ceramic green sheet by screen printing method to a thickness of 3 μm. Then 300 pieces of the ceramic green sheets were stacked and fired at a temperature of 1000° C. after holding at 800° C.

The internal electrodes 82 were printed so as to form in the shapes shown in FIG. 8, FIG. 9, FIG. 17, FIG. 18 and FIG. 19.

Figure 8A:
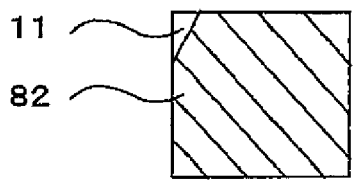
FIG. 8A is a plan view showing the internal electrode pattern of one polarity in the multi-layer piezoelectric element of Example 4 of the present invention.
Figure 8B:
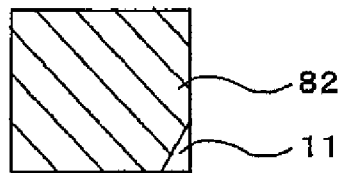
FIG. 8B is a plan view showing the internal electrode pattern of the other polarity in the multi-layer piezoelectric element of Example 4 of the present invention.
Figure 8C:
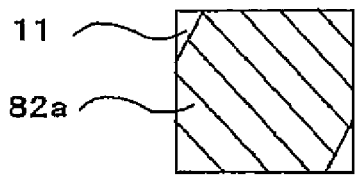
FIG. 8C shows a portion where the internal electrodes of different polarities lap over each other via the piezoelectric layer in the multi-layer piezoelectric element of Example 4 of the present invention.

FIGS. 8A through 8C show the internal electrode patterns where the portion 82a where the internal electrodes of different polarities overlap via the piezoelectric layer 11 has a configuration which is not line symmetry but is point symmetry, and the internal electrodes of different polarities are exposed on all side faces of the multi-layer piezoelectric element. FIG. 8A and FIG. 8B are plan views showing the internal electrode patterns of different polarities, and FIG. 8C shows the portion 82a where the internal electrodes of different polarities overlap via the piezoelectric layer 11.

Figure 9A:
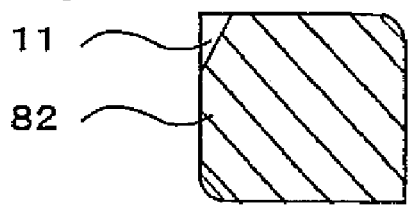
FIG. 9A is a plan view showing the internal electrode pattern of one polarity in the multi-layer piezoelectric element of Example 5 of the present invention.
Figure 9B:
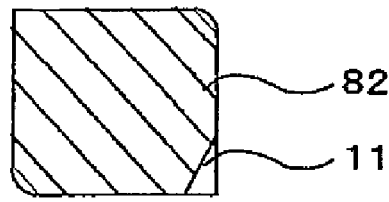
FIG. 9B is a plan view showing the internal electrode pattern of the other polarity in the multi-layer piezoelectric element of Example 5 of the present invention.
Figure 9C:
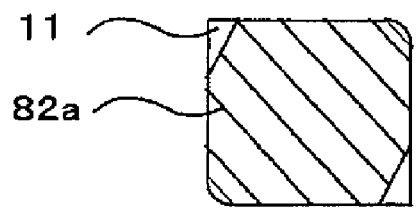
FIG. 9C shows a portion where the internal electrodes of different polarities lap over each other via the piezoelectric layer in the multi-layer piezoelectric element of Example 5 of the present invention.

FIGS. 9A through 9C show the internal electrode patterns where the portion 82a where the internal electrodes of different polarities overlap via the piezoelectric layer 11 has a configuration which is not line symmetry but is point symmetry, the internal electrodes of different polarities are exposed on all side faces of the multi-layer piezoelectric element, and the R plane is formed in the internal electrode pattern. FIG. 9A and FIG. 9B are plan views showing the internal electrode patterns of different polarities, and FIG. 9C shows the portion 82a where the internal electrodes of different polarities overlap via the piezoelectric layer 11.

Figure 17A:
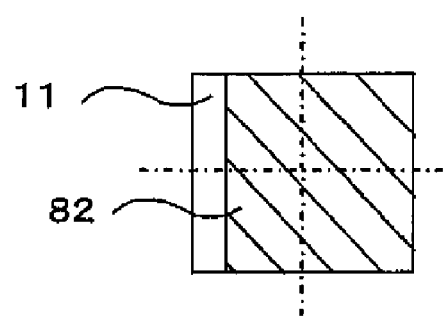
FIG. 17A is a plan view showing the internal electrode pattern of one polarity in a multi-layer piezoelectric element of Comparative Example 1.
Figure 17B:
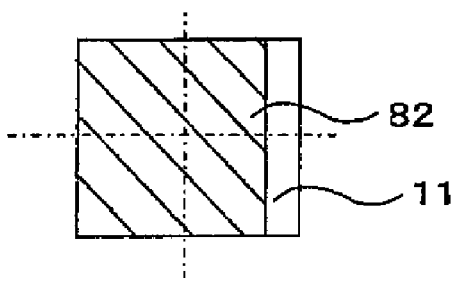
FIG. 17B is a plan view showing the internal electrode pattern of the other polarity in the multi-layer piezoelectric element of Comparative Example 1.
Figure 17C:
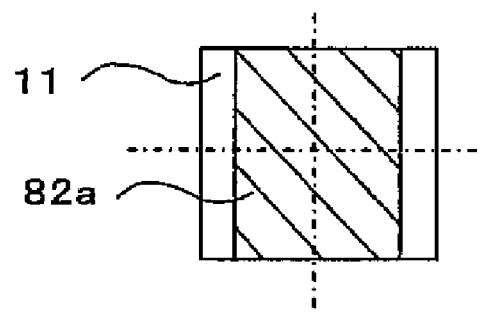
FIG. 17C shows a portion where the internal electrodes of different polarities overlap each other via the piezoelectric layer in the multi-layer piezoelectric element of Comparative Example 1.

FIGS. 17A through 17C show the internal electrode patterns where the portion 82a where the internal electrodes of different polarities overlap via the piezoelectric layer 11 has a configuration which has both features of line symmetry and point symmetry, and only one of the internal electrodes is exposed on the side faces of a part of the multi-layer piezoelectric element. FIG. 17A and FIG. 17B are plan views showing the internal electrode patterns of different polarities, and FIG. 17C is a plan view showing the portion 82a where the internal electrodes of different polarities overlap via the piezoelectric layer 11.

Figure 18A:
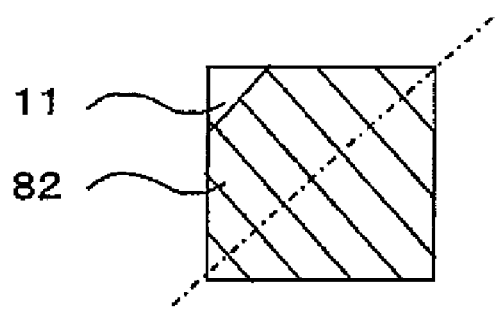
FIG. 18A is a plan view showing the internal electrode pattern of one polarity in a multi-layer piezoelectric element of Comparative Example 2.
Figure 18B:
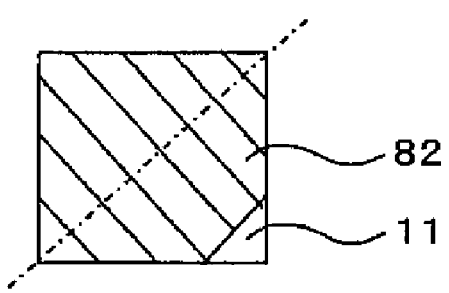
FIG. 18B is a plan view showing the internal electrode pattern of the other polarity in the multi-layer piezoelectric element of Comparative Example 2.
Figure 18C:
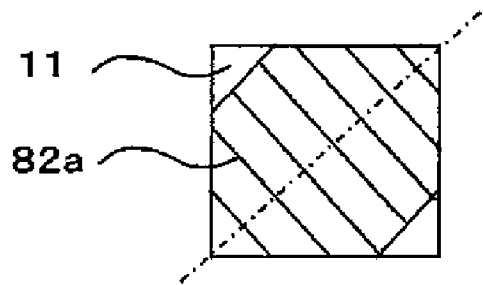
FIG. 18C shows a portion where the internal electrodes of different polarities overlap each other via the piezoelectric layer in the multi-layer piezoelectric element of Comparative Example 2.

FIGS. 18A through 18C show the internal electrode patterns of the multi-layer piezoelectric element where the portion 82a where the internal electrodes of different polarities overlap via the piezoelectric layer 11 has a configuration which has both features of line symmetry and point symmetry, and the internal electrodes of different polarities are exposed on all side faces of the multi-layer piezoelectric element. FIG. 18A and FIG. 18B are plan views showing the internal electrode patterns of different polarities, and FIG. 18C shows the portion 82a where the internal electrodes of different polarities overlap via the piezoelectric layer 11.

Figure 19A:
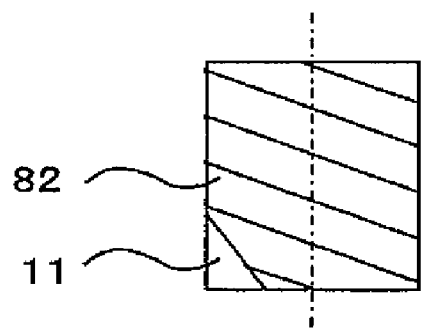
FIG. 19A is a plan view showing the internal electrode pattern of one polarity in a multi-layer piezoelectric element of Comparative Example 3.
Figure 19B:
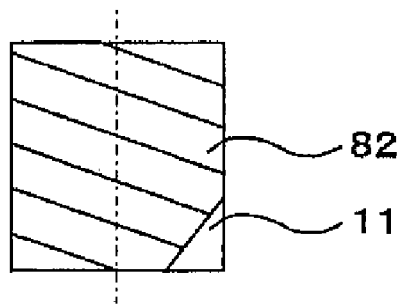
FIG. 19B is a plan view showing the internal electrode pattern of the other polarity in the multi-layer piezoelectric element of Comparative Example 3.
Figure 19C:
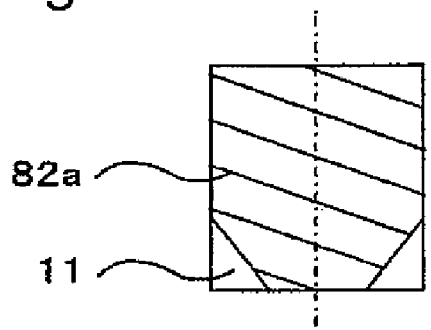
FIG. 19C shows a portion where the internal electrodes of different polarities overlap each other via the piezoelectric layer in the multi-layer piezoelectric element of Comparative Example 3.

FIGS. 19A through 19C show the internal electrode patterns of the multi-layer piezoelectric element where the portion 82a where the internal electrodes of different polarities overlap via the piezoelectric layer 11 has a configuration which has the feature of line symmetry but is not point symmetry, and the internal electrodes of different polarities are exposed on all side faces of the multi-layer piezoelectric element. FIG. 19A and FIG. 19B are plan views showing the internal electrode patterns of different polarities, and FIG. 19C shows the portion 82a where the internal electrodes of different polarities overlap via the piezoelectric layer 11.

Then to a mixture of silver powder of flake-like particles having a mean particle size of 2 µm and amorphous glass powder having softening point of 640° C. including silicon having a mean particle size of 2 µm as the main component, 8 weight parts of binder and 100 weight parts in total of silver powder and glass powder were added, so as to prepare the electrically conductive silver-glass paste by fully mixing the powders. The electrically conductive silver-glass paste thus prepared was screen printed onto a release film. After drying, the paste film was peeled off the release film to obtain a sheet of electrically conductive silver-glass paste.

The sheet of the silver-glass paste was transferred onto the surface of the external electrode 85 of the stack 80 and was baked at 700° C. for 30 minutes, thereby forming the external electrode 85.

Then lead wires were connected to the external electrodes 85, and DC electric field of 3 kV/mm was applied between the positive and negative external electrodes 85 via the lead wires so as to apply polarization treatment for 15 minutes, thereby to complete the multi-layer piezoelectric actuator based on the multi-layer piezoelectric element as shown in FIG. 5A.

When a DC voltage of 170 V was applied to the multi-layer piezoelectric element that was made as described above, displacement of 45 µm in the stacking direction was obtained in all of the multi-layer piezoelectric elements. Then operation test was conducted on this multi-layer piezoelectric actuator by applying an AC voltage varying between 0 V and +170 V at frequency of 150 Hz at room temperature. Results of the operation test with $1 \times 10^9$ cycles of operation are shown in Table 4.

TABLE 4

| No. | A | B | C | D | E | F | G | H | I | J | K |
|---|---|---|---|---|---|---|---|---|---|---|---|
| 1 | FIG. 8A FIG. 8B | FIG. 8C | x | ○ | ○ | x | 50.0 | 49.9 | — | — | — |
| 2 | FIG. 9A FIG. 9B | FIG. 9C | x | ○ | ○ | ○ | 55.0 | 55.0 | — | — | — |
| *3 | FIG. 17A FIG. 17B | FIG. 17C | ○ | ○ | x | x | 45.0 | 44.0 | Occurred | Occurred | Occurred |
| *4 | FIG. 18A FIG. 18B | FIG. 18C | ○ | ○ | ○ | x | 50.0 | 49.0 | Occurred | Occurred | Occurred |
| *5 | FIG. 19A FIG. 19B | FIG. 18C | ○ | x | ○ | x | 45.0 | 42.0 | Occurred | Occurred | Occurred |

*Out of the scope of the present invention.
The alphabet letters at the head of columns in Table 4 have the following meanings.
A: Constitution of the internal electrode
B: Shape of the portion where the internal electrodes of different polarities overlap each other
C: The portion where the internal electrodes of different polarities overlap each other have shape of line symmetry.
D: The portion where the internal electrodes of different polarities overlap each other have shape of point symmetry.
E: The internal electrodes of different polarities are exposed on all of the side faces of the device.
F: C plane or R plane is formed in the internal electrode pattern.
G: Amount of displacement in initial state (µm)
H: Amount of displacement (µm) after continuous operation ($1 \times 10^9$ cycles)
I: Peel off in stack after continuous operation ($1 \times 10^9$ cycles)
J: Noise of harmonics component occurred.
K: Beat tone occurred at frequencies of 1 kHz and higher.

From Table 4, it can be seen that samples Nos. 3, 4, 5 that are Comparative Examples have such a pattern of the internal electrode 82 as the portion 82a where the internal electrodes of different polarities overlap each other via the piezoelectric layer 11 has shape of line symmetry, points of large amount of displacement lied on the line of symmetry during continuous operation of the multi-layer piezoelectric element, so that the displacements of very large amplitude along the line of symmetry propagate to the interface of the stack between the piezoelectric layer 11 and the internal electrode 82 on the side face of the device, thus increasing the load on the interface and causing peel off, while generating beat tone and noise.

In samples Nos. 1 and 2 which are Examples of the present invention, since the pattern of the internal electrode 82 has the portion 82a where the internal electrode and the external electrode of different polarities overlap each other via the piezoelectric layer 11 has a shape not in line symmetry, the amount of displacement did not show significant decrease after continuous operation of $1 \times 10^9$ cycles, thus making it possible to manufacture the multi-layer piezoelectric actuator which exhibits the effective amount of displacement which is required for the multi-layer piezoelectric actuator and high durability without malfunction.

Sample No. 2, in particular, underwent substantially no change in the amount of displacement after continuous operation of $1 \times 10^9$ cycles since the internal electrode pattern has R plane, thus providing very high durability.

Example 5

In Example 5, percentage change in displacement of each sample was measured while changing the material composition of the internal electrode 82 of the multi-layer piezoelectric actuator of sample No. 2 of Example 4. The percentage change in displacement is comparison of the amount of displacement (μm) at the time when the number of operation cycles reached $1 \times 10^9$ cycles to the amount of displacement (μm) in the initial state of the multi-layer piezoelectric element before starting the continuous operation. The results are shown in Table 5.

TABLE 5

| No. | Pd (% by weight) | Ag (% by weight) | Cu (% by weight) | Ni (% by weight) | Percentage change in displacement (%) |
|---|---|---|---|---|---|
| 1 | 0 | 100 | 0 | 0 | Broken by migration |
| 2 | 0.001 | 99.999 | 0 | 0 | 0.7 |
| 3 | 0.01 | 99.99 | 0 | 0 | 0.7 |
| 4 | 0.1 | 99.9 | 0 | 0 | 0.4 |
| 5 | 0.5 | 99.5 | 0 | 0 | 0.2 |
| 6 | 1 | 99 | 0 | 0 | 0.2 |
| 7 | 2 | 98 | 0 | 0 | 0 |
| 8 | 4 | 95 | 1 | 0 | 0 |
| 9 | 5 | 95 | 0 | 0 | 0 |
| 10 | 8 | 92 | 0 | 0 | 0 |
| 11 | 9 | 91 | 0 | 0 | 0.2 |
| 12 | 9.5 | 90.5 | 0 | 0 | 0.2 |
| 13 | 10 | 90 | 0 | 0 | 0.4 |
| 14 | 15 | 85 | 0 | 0 | 0.7 |
| 15 | 0 | 0 | 100 | 0 | 0.2 |
| 16 | 0 | 0 | 99.9 | 0.1 | 0 |
| 17 | 0 | 0 | 0 | 100 | 0.4 |
| 18 | 20 | 80 | 0 | 0 | 0.9 |
| 19 | 30 | 70 | 0 | 0 | 0.9 |

Contents (% by weight) of Pd, Ag, Cu and Ni in the metal of the internal electrode are shown in terms of % by weight of each element. Percentage change in displacement is the ratio of the amount displacement after continuous operation to the displacement in the initial state.

As shown in Table 5, sample No. 1 the internal electrode 82 of which was formed from 100% silver could not be operated continuously due to breakage of the multi-layer piezoelectric element caused by silver migration. Sample No. 18 where the metal compound included in the internal electrode 82 included more than 15% by weight of group 8 to group 10 metal and less than 85% by weight of group 11 metal, resulted in high specific resistance of the internal electrode 82 which led to smaller amount of displacement of the multi-layer piezoelectric actuator due to heat generation during continuous operation of the multi-layer piezoelectric element.

Samples Nos. 2 through 14 where the internal electrode 82 included as the main component the metal compound having such a composition as the proportion M1 (% by weight) of the group 8 to group 10 metal and the proportion M2 of the group 1b metal satisfied the relations $0 < M1 \leq 15$, $85 \leq M2 < 100$ and $M1+M2=100$ showed low specific resistance of the internal electrode 82 and were capable of suppressing heat generation from the internal electrode 82 during continuous operation, thus making it possible to provide multi-layer piezoelectric actuator having stable amount of displacement.

Samples Nos. 15 through 17 also showed low specific resistance of the internal electrode 82 and were capable of suppressing heat generation from the internal electrode 82 during continuous operation, thus making it possible to provide multi-layer piezoelectric actuator having stable amount of displacement.

Example 6

In Example 6, a multi-layer piezoelectric actuator comprising the multi-layer piezoelectric element according to the fourth embodiment of the present invention was fabricated as described below.

First, a calcined powder of a piezoelectric ceramic material constituted from lead titanate zirconate ($PbZrO_3$—$PbTiO_3$) having a mean particle size of 0.4 μm as the main component, a binder and a plasticizer were mixed to form a slurry which was formed into ceramic green sheets that would become the piezoelectric material 11 having a thickness of 150 μm by the doctor blade process.

An electrically conductive paste, prepared by adding a binder to the silver-palladium alloy-(95% by weight of silver and 5% by weight of palladium), was applied to one side of the ceramic green sheet by screen printing method in the shapes shown in FIG. 13, FIG. 14, FIG. 20, FIG. 21, FIG. 22 and FIG. 23 to a thickness of 3 μm. Then 300 pieces of the ceramic green sheets were stacked and fired at a temperature of 1000° C. after holding at 800° C.

Figure 13A:
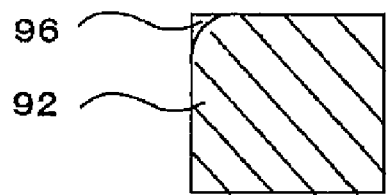
FIG. 13A is a plan view showing the internal electrode pattern of one polarity in the multi-layer piezoelectric element of Example 6 of the present invention.
Figure 13B:
FIG. 13B is a plan view showing the internal electrode pattern of the other polarity in the multi-layer piezoelectric element of Example 6 of the present invention.
Figure 13C:
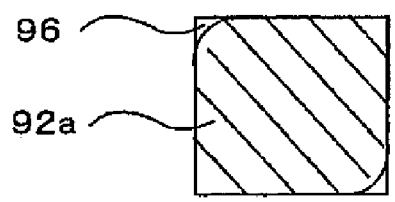
FIG. 13C shows a portion where the internal electrodes of different polarities overlap each other via the piezoelectric layer in the multi-layer piezoelectric element of Example 6 of the present invention.

FIGS. 13A through 13C show the internal electrode patterns where the border between the insulation region 96 and the internal electrode 92 is R-shaped, and the internal electrodes of different polarities are exposed on all side faces of the multi-layer piezoelectric element. FIG. 13A and FIG. 13B are plan views showing the internal electrode patterns of different polarities, and FIG. 13C shows the portion 92a where the internal electrodes of different polarities overlap via the piezoelectric layer 11.

Figure 14A:
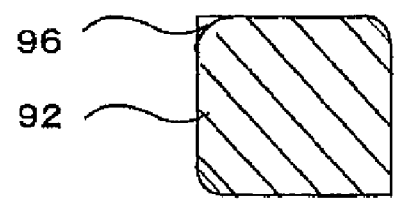
FIG. 14A is a plan view showing the internal electrode pattern of one polarity in the multi-layer piezoelectric element of Example 7 of the present invention.
Figure 14B:
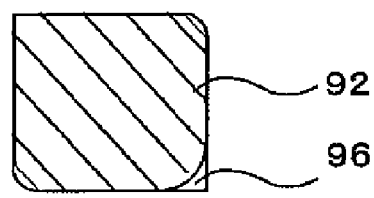
FIG. 14B is a plan view showing the internal electrode pattern of the other polarity in the multi-layer piezoelectric element of Example 7 of the present invention.
Figure 14C:
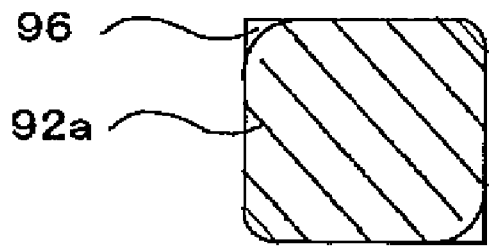
FIG. 14C shows a portion where the internal electrodes of different polarities overlap each other via the piezoelectric layer in the multi-layer piezoelectric element of Example 7 of the present invention.

FIGS. 14A through 14C show the internal electrode patterns where the border between the insulation region 96 and the internal electrode 92 is R-shaped, and the internal electrodes of different polarities are exposed on all side faces of the multi-layer piezoelectric element, and the piezoelectric layer 11 has R plane formed therein. FIG. 14A and FIG. 14B are plan views showing the internal electrode patterns of different polarities, and FIG. 14C shows the portion 92a where the internal electrodes of different polarities overlap via the piezoelectric layer 11.

Figure 20A:
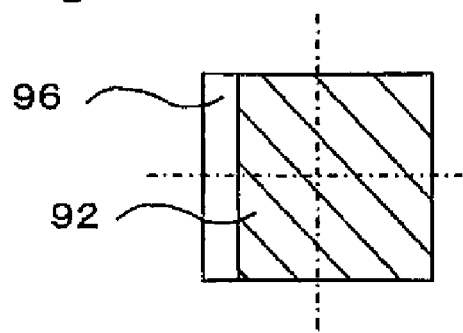
FIG. 20A is a plan view showing the internal electrode pattern of one polarity in a multi-layer piezoelectric element of Comparative Example 4.
Figure 20B:
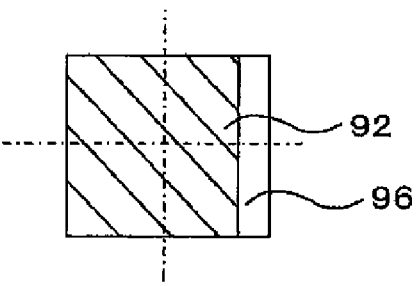
FIG. 20B is a plan view showing the internal electrode pattern of the other polarity in the multi-layer piezoelectric element of Comparative Example 4.
Figure 20C:
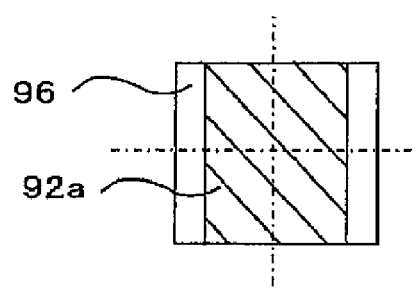
FIG. 20C shows a portion where the internal electrodes of different polarities overlap each other via the piezoelectric layer in the multi-layer piezoelectric element of Comparative Example 4.

FIGS. 20A through 20C show the internal electrode patterns where the border between the insulation region 96 and the internal electrode 92 is straight, and only one of the internal electrodes is exposed on side faces of a part of the multi-layer piezoelectric element. FIG. 20A and FIG. 20B are plan views showing the internal electrode patterns of different polarities, and FIG. 20C is a plan view showing the portion 92a where the internal electrodes of different polarities overlap via the piezoelectric layer 11.

Figure 21A:
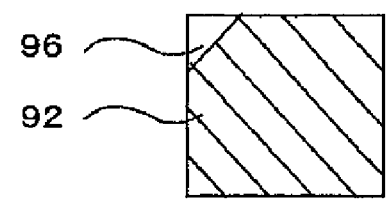
FIG. 21A is a plan view showing the internal electrode pattern of one polarity in a multi-layer piezoelectric element of Comparative Example 5.
Figure 21B:
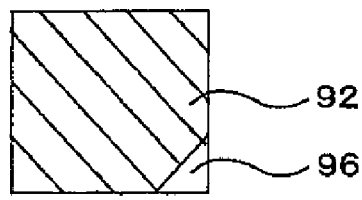
FIG. 21B is a plan view showing the internal electrode pattern of the other polarity in the multi-layer piezoelectric element of Comparative Example 5.
Figure 21C:
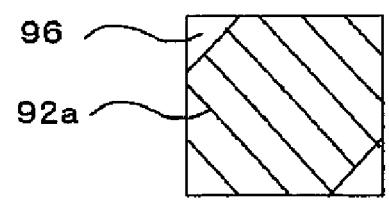
FIG. 21C shows a portion where the internal electrodes of different polarities lap over each other via the piezoelectric layer in the multi-layer piezoelectric element of Comparative Example 5.

FIGS. 21A through 21C show the internal electrode patterns of the multi-layer piezoelectric element where the border between the insulation region 96 and the internal electrode 92 is straight, and the internal electrodes of different polarities are exposed on all side faces of the multi-layer piezoelectric element. FIG. 21A and FIG. 21B are plan views showing the internal electrode patterns of different polarities, and FIG. 21C shows the portion 92a where the internal electrodes of different polarities overlap via the piezoelectric layer 11.

Figure 22A:
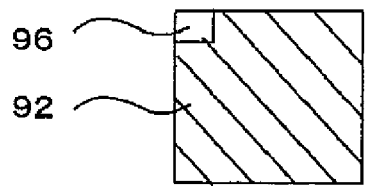
FIG. 22A is a plan view showing the internal electrode pattern of one polarity in a multi-layer piezoelectric element of Comparative Example 6.
Figure 22B:
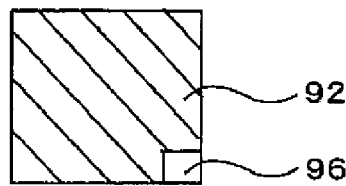
FIG. 22B is a plan view showing the internal electrode pattern of the other polarity in the multi-layer piezoelectric element of Comparative Example 6.
Figure 22C:
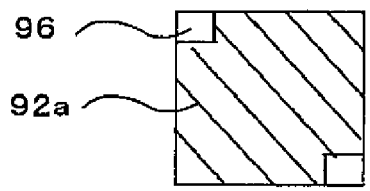
FIG. 22C shows a portion where the internal electrodes of different polarities overlap each other via the piezoelectric layer in the multi-layer piezoelectric element of Comparative Example 6.

FIGS. 22A through 22C show the internal electrode patterns of the multi-layer piezoelectric element where the border between the insulation region 96 and the internal electrode 92 is square, and the internal electrodes of different polarities are exposed on all side faces of the multi-layer piezoelectric element. FIG. 22A and FIG. 22B are plan views showing the internal electrode patterns of different polarities, and FIG. 22C shows the portion 92a where the internal electrodes of different polarities overlap via the piezoelectric layer 11.

Figure 23A:
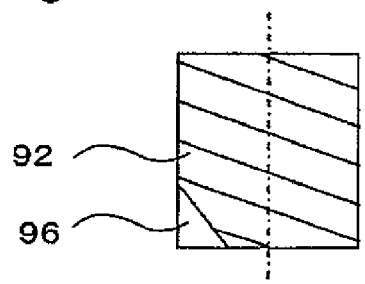
FIG. 23A is a plan view showing the internal electrode pattern of one polarity in a multi-layer piezoelectric element of Comparative Example 7.
Figure 23B:
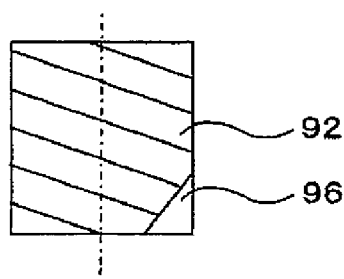
FIG. 23B is a plan view showing the internal electrode pattern of the other polarity in the multi-layer piezoelectric element of Comparative Example 7.
Figure 23C:
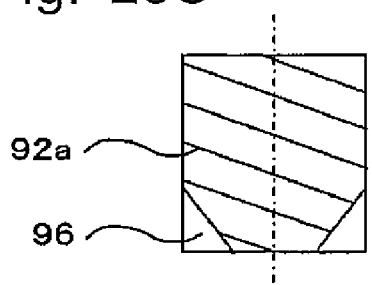
FIG. 23C shows a portion where the internal electrodes of different polarities overlap each other via the piezoelectric layer in the multi-layer piezoelectric element of Comparative Example 7.
Figure 24A:
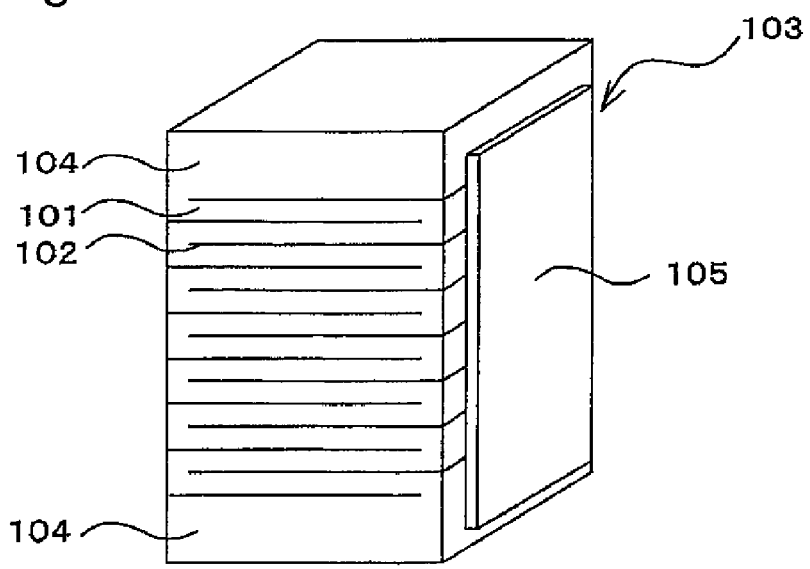
FIG. 24A is a perspective view showing a multi-layer piezoelectric element of the prior art.
Figure 24B:
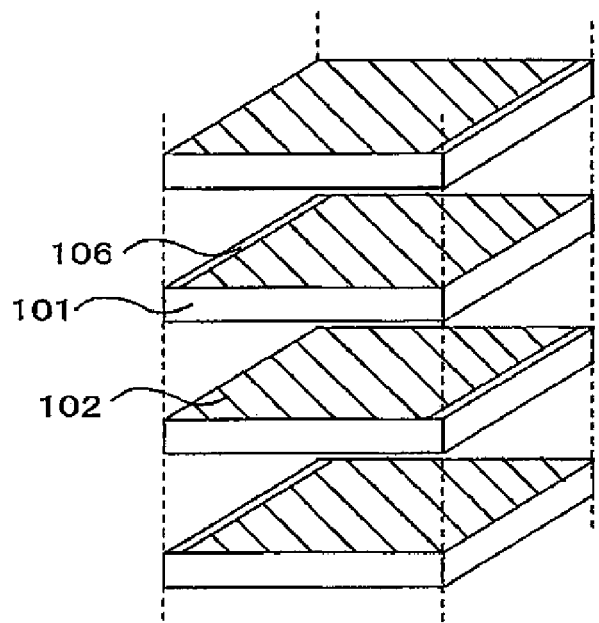
FIG. 24B is an exploded perspective view showing the piezoelectric layer and the internal electrodes being stacked in the multi-layer piezoelectric element of the prior art.

FIGS. 23A through 23C show the internal electrode patterns where the border between the insulation region 96 and the internal electrode 92 is straight, the portion 92a where the internal electrodes of different polarities overlap via the piezoelectric layer 11 has a configuration which is not point symmetry and the internal electrodes of different polarities are exposed on all side faces of the multi-layer piezoelectric element. FIG. 23A and FIG. 23B are plan views showing the internal electrode patterns of different polarities, and FIG. 23C shows the portion 92a where the internal electrodes of different polarities overlap via the piezoelectric layer 11.

Then to a mixture of silver powder of flake-like particles having a mean particle size of 2 μm and amorphous glass powder having softening point of 640° C. including silicon having a mean particle size of 2 μm as the main component, 8 weight parts of binder and 100 weight parts in total of silver powder and glass powder were added, so as to prepare the electrically conductive silver-glass paste by fully mixing the powders. The electrically conductive silver-glass paste thus prepared was screen printed onto a release film. After drying, the paste film was peeled off the release film to obtain a sheet of electrically conductive silver-glass paste.

The sheet of the silver-glass paste was transferred onto the surface of the external electrode 85 of the stack 13 and was baked at 700° C. for 30 minutes, thereby forming the external electrode 85.

Then lead wires were connected to the external electrodes 85, and DC electric field of 3 kV/mm was applied between the positive and negative external electrodes 85 via the lead wires so as to apply polarization treatment for 15 minutes, thereby to complete the multi-layer piezoelectric actuator based on the multi-layer piezoelectric element as shown in FIG. 10.

When a DC voltage of 170 V was applied to the multi-layer piezoelectric element, displacement of 45 μm in the stacking direction was obtained in all of the multi-layer piezoelectric actuators. Then operation test was conducted on this multi-layer piezoelectric actuator by applying an AC voltage varying between 0 V and +170 V at frequency of 150 Hz at room temperature. Results of the operation test with $1 \times 10^9$ cycles of operation are shown in Table 6.

TABLE 6

| No. | A | B | C | D | E | F | G | H | I |
|---|---|---|---|---|---|---|---|---|---|
| 1 | FIG. 13 | o | FIG. 13(c) | o | o | 52.0 | 51.9 | — | — |
| 2 | FIG. 14 | o | FIG. 14(c) | o | o | 56.0 | 56.0 | — | — |
| *3 | FIG. 20 | x | FIG. 20(c) | o | x | 45.0 | 44.0 | Occurred | Occurred |
| *4 | FIG. 21 | x | FIG. 21(c) | o | o | 50.0 | 49.0 | Occurred | Occurred |
| *5 | FIG. 22 | x | FIG. 22(c) | o | o | 51.0 | 49.0 | Occurred | Occurred |
| *5 | FIG. 23 | x | FIG. 23(c) | x | o | 45.0 | 42.0 | Occurred | Occurred |

The alphabet letters at the head of columns in Table 4 have the following meanings.
A: Constitution of the internal electrode
B: Whether the border between the insulation region and the internal electrode has R-shaped plane (o) or not (x)
C: Shape of the portion where the internal electrodes of different polarities overlap each other
D: Where the portion where the internal electrodes of different polarities overlap each other has a shape of point symmetry (o) or not (x)
B: Whether the internal electrodes of different polarities are exposed on all of the side faces of the device (o) or not (x).
F: Amount of displacement in initial state (μm)
G: Amount of displacement (μm) after continuous operation ($1 \times 10^9$ cycles)
H: Whether crack occurred in the stack after continuous operation ($1 \times 10^9$ cycles)
I: Whether noise of harmonics component occurred or not.

From Table 6, it can be seen that samples Nos. 3, 4, 5 and 6 that are Comparative Examples have such a pattern as the border between the insulation region 96 and the internal electrode 92 is not R-shaped and therefore stress is concentrated in the border between a portion where large piezoelectric displacement occurs and a portion where piezoelectric displacement does not occur when the multi-layer piezoelectric actuator is operated continuously, thus resulting in increased load on the border which caused crack in the insulation region 96 of the piezoelectric layer 11 and noise during operation.

In samples Nos. 1 and 2 which are Examples of the present invention, since the border between the insulation region 96 and the internal electrode 92 is R-shaped, the amount of displacement did not show significant decrease after continuous operation of $1 \times 10^9$ cycles, thus making it possible to manufacture the multi-layer piezoelectric actuator which exhibits the effective amount of displacement which is required for the multi-layer piezoelectric actuator and high durability without malfunction.

Sample No. 2 which has R plane in the piezoelectric layer 11, in particular, underwent substantially no change in the amount of displacement after continuous operation of $1 \times 10^9$ cycles, thus providing very high durability.

Example 7

Percentage change in displacement of each sample was measured while changing the material composition of the internal electrode 92 of the multi-layer piezoelectric actuator of sample No. 2 of Example 6. The percentage change in displacement is the ratio of the amount of displacement (μm) at the time when the number of operation cycles reached $1 \times 10^9$ cycles to the amount of displacement (μm) in the initial state of the multi-layer piezoelectric element before starting the continuous operation. The results are shown in Table 7.

TABLE 7

| No. | Pd (% by weight) | Ag (% by weight) | Cu (% by weight) | Ni (% by weight) | Percentage change in displacement (%) |
|---|---|---|---|---|---|
| 1 | 0 | 100 | 0 | 0 | Broken |
| 2 | 0.001 | 99.999 | 0 | 0 | 0.7 |
| 3 | 0.01 | 99.99 | 0 | 0 | 0.7 |
| 4 | 0.1 | 99.9 | 0 | 0 | 0.4 |
| 5 | 0.5 | 99.5 | 0 | 0 | 0.2 |
| 6 | 1 | 99 | 0 | 0 | 0.2 |
| 7 | 2 | 98 | 0 | 0 | 0 |
| 8 | 4 | 95 | 1 | 0 | 0 |
| 9 | 5 | 95 | 0 | 0 | 0 |
| 10 | 8 | 92 | 0 | 0 | 0 |
| 11 | 9 | 91 | 0 | 0 | 0.2 |
| 12 | 9.5 | 90.5 | 0 | 0 | 0.2 |
| 13 | 10 | 90 | 0 | 0 | 0.4 |
| 14 | 15 | 85 | 0 | 0 | 0.7 |
| 15 | 0 | 0 | 100 | 0 | 0.2 |
| 16 | 0 | 0 | 99.9 | 0.1 | 0 |
| 17 | 0 | 0 | 0 | 100 | 0.4 |
| 18 | 20 | 80 | 0 | 0 | 0.9 |
| 19 | 30 | 70 | 0 | 0 | 0.9 |

Columns headed by Pd, Ag, Cu and Ni in Table 7 show the contents of the metals of the internal electrode in terms of % by weight. The column of Percentage change shows the ratio of change (%) in displacement after continuous operation to the initial state. "Broken" of sample No. 1 means that the sample was destroyed by migration.

As shown in Table 7, sample No. 1 the internal electrode 92 of which was formed from 100% silver was broken in part of the multi-layer piezoelectric element due to silver migration. Sample No. 18 where the metal compound included in the internal electrode 92 included more than 15% by weight of group 8 to group 10 metal and less than 85% by weight of group 11 metal, resulting in high specific resistance of the internal electrode 92 which led to smaller amount of displacement of the multi-layer piezoelectric actuator due to heat generation during continuous operation of the multi-layer piezoelectric element.

Samples Nos. 2 through 14 where the internal electrode 92 included as the main component the metal compound having such a composition as the proportion M1 (% by weight) of the group 8 to group 10 metal and the proportion M2 of the group 1b metal satisfied the relations 0<M1≦15, 85≦M2<100 and M1+M2=100 showed low specific resistance of the internal electrode 92 and were capable of suppressing heat generation from the internal electrode 92 so that the internal electrode 92 had very high resilience to expand and contract, thus making it possible to provide the multi-layer piezoelectric actuator having stable amount of displacement free from cracks.

Samples Nos. 15 through 17 also showed low specific resistance of the internal electrode 92 and were capable of suppressing heat generation from the internal electrode 92 during continuous operation, thus making it possible to provide the multi-layer piezoelectric actuator having stable amount of displacement.

Example 8

In Example 8, a multi-layer piezoelectric actuator comprising the multi-layer piezoelectric element according to the fifth embodiment of the present invention was fabricated as described below.

First, a calcined powder of a piezoelectric ceramic material constituted from lead titanate zirconate ($PbzrO_3$—$PbTiO_3$) as the main component, a binder and a plasticizer were mixed to form a slurry which was formed into ceramic green sheets that would become the piezoelectric material 11 having a thickness of 150 μm by the doctor blade process.

An electrically conductive paste, prepared by adding a binder to the silver-palladium alloy made of a predetermined composition, was applied to one side of the ceramic green sheet by screen printing method to a thickness of 3 μm. Then 300 pieces of the ceramic green sheets were stacked and fired at a temperature of 1000° C.

Then a groove measuring 50 μm in depth and 50 μm in width was formed at the end of the internal electrode located on the side face of the column-shaped stack in every other layer, by means of a dicing apparatus.

Then 90% by volume of silver powder of flake-like particles having a mean particle size of 2 μm and 10% by volume of amorphous glass powder having softening point of 640° C. including silicon having a mean particle size of 2 μm as the main component were mixed, and 8 weight parts of binder and 100 weight parts in total of silver powder and glass powder were added to this mixture, so as to prepare the electrically conductive silver-glass paste by fully mixing the powders. The electrically conductive silver-glass paste thus prepared was screen printed onto a release film. After drying, the paste film was peeled off the release film to obtain a sheet of electrically conductive silver-glass paste. Density of the green sheet was measured by Archimedes method, and a value of 6.5 g/cm$^3$ was obtained.

The sheet of the silver-glass paste was transferred onto the surface of the external electrode 15 of the stack 13 and was baked at 650° C. for 30 minutes, thereby forming the external electrode 15 from the porous electrically conductive material having three-dimensional mesh structure. Measurement of void ratio of the external electrode 15 by means of image analysis apparatus on a photograph of a cut surface of the external electrode 15 showed a void ratio of 40%.

Then lead wires were connected to the external electrodes 15, and DC electric field of 3 kV/mm was applied between the positive and negative external electrodes 15 via the lead wires so as to apply polarization treatment for 15 minutes, thereby to complete the multi-layer piezoelectric element as shown in FIG. 1.

Example 9

In Example 9, percentage change in the amount of displacement before and after continuous operation was measured on the multi-layer piezoelectric actuator of the present invention made by controlling the composition of metals in the internal electrode 12 and the external electrode 15, while employing the manufacturing method described above.

When a DC voltage of 170 V was applied to the multi-layer piezoelectric actuators made as described above, displacement of 45 μm in the stacking direction was obtained in all of the multi-layer piezoelectric actuators. Then continuous operation test was conducted on this multi-layer piezoelectric actuator by applying an AC voltage varying between 0 V and +170 V at frequency of 150 Hz at room temperature to undergo $1 \times 10^9$ cycles of operation.

Thermal expansion coefficients of the internal electrode 12 and the external electrode 15 were determined by measuring the temperatures and dimensions of the internal electrode 12 and the external electrode 15 in portions which were observed under an SEM, while heating the portions. Results of measurements are shown in Table 8.

TABLE 8

| | Metals constituting internal electrode | | | Thermal expansion coefficient $\alpha_1$ ($\times 10^{-6}$/deg) |
|---|---|---|---|---|
| No. | Ag (% by weight) | Pd (% by weight) | Au (% by weight) | |
| *1 | 100 | 0 | | 17.0 |
| *2 | 100 | 0 | | 17.0 |
| 3 | 99.99 | 0.01 | | 17.0 |
| 4 | 99.9 | 0.1 | | 17.0 |
| 5 | 99 | 1 | | 16.9 |
| 6 | 98 | 2 | | 16.9 |
| 7 | 95 | 5 | | 16.7 |
| 8 | 90 | 10 | | 16.5 |
| 9 | 85 | 15 | | 16.2 |
| 10 | 80 | 20 | | 16.0 |
| 11 | 70 | 30 | | 15.4 |
| 12 | 95 | | 5 | 16.9 |
| *13 | 60 | 40 | | 14.9 |
| *14 | 70 | 30 | | 15.4 |
| *15 | 70 | 30 | | 15.4 |

| | Metals constituting external electrode | | | Thermal expansion coefficient $\alpha$ ($\times 10^{-6}$/deg) |
|---|---|---|---|---|
| No. | Ag (% by weight) | Pd (% by weight) | Au (% by weight) | |
| *1 | 70 | 30 | 0 | 15.4 |
| *2 | 100 | 0 | 0 | 17.0 |
| 3 | 100 | 0 | 0 | 17.0 |
| 4 | 100 | 0 | 0 | 17.0 |
| 5 | 100 | 0 | 0 | 17.0 |
| 6 | 100 | 0 | 0 | 17.0 |
| 7 | 100 | 0 | 0 | 17.0 |
| 8 | 100 | 0 | 0 | 17.0 |
| 9 | 100 | 0 | 0 | 17.0 |
| 10 | 100 | 0 | 0 | 17.0 |
| 11 | 100 | 0 | 0 | 17.0 |
| 12 | 100 | 0 | 0 | 17.0 |
| *13 | 100 | 0 | 0 | 17.0 |
| *14 | 70 | 30 | 0 | 15.4 |
| *15 | 0 | 0 | 100 | 14.2 |

| No. | $\alpha_1/\alpha_2$ | Proportion (% by weight) | Initial displacement A (μm) | Maximum displacement after continuous operation B (μm) | Percentage change in displacement (%) |
|---|---|---|---|---|---|
| 1 | 1.1 | 100 | 45.0 | Broken | — |
| 2 | 1.0 | 100 | 45.0 | Broken | — |
| 3 | 0.99997 | 100 | 45.0 | 44.7 | 0.7 |
| 4 | 0.9997 | 100 | 45.0 | 44.8 | 0.4 |
| 5 | 0.997 | 99 | 45.0 | 44.9 | 0.2 |
| 6 | 0.99 | 98 | 45.0 | 45.0 | 0.0 |
| 7 | 0.98 | 95 | 45.0 | 45.0 | 0.0 |
| 8 | 0.97 | 90 | 45.0 | 44.8 | 0.4 |
| 9 | 0.95 | 85 | 45.0 | 44.7 | 0.7 |
| 10 | 0.94 | 80 | 45.0 | 44.6 | 0.9 |
| 11 | 0.91 | 70 | 45.0 | 44.6 | 0.9 |
| 12 | 0.99 | 95 | 45.0 | 45.0 | 0.0 |
| 13 | 0.88 | 60 | 45.0 | 44.4 | 1.3 |
| 14 | 1.0 | 70 | 45.0 | 44.4 | 1.3 |
| 15 | 1.09 | 70 | 45.0 | Broken | — |

The column of proportion in Table 8-3 shows the proportion (% by weight) by which the main component of the external electrode constitute the internal electrode.

The column of initial displacement A (μm) shows the displacement A (μm) in the initial state before continuous operation.

The column of maximum displacement after continuous operation B (μm) shows the maximum displacement (μm) after continuous operation of $1 \times 10^9$ cycles.

The column of percentage change in displacement (%) shows the ration of maximum displacement after continuous operation B to the displacement A in the initial state ($|(A-B)/A \times 100|$).

Entry of "Broken" means that spark occurred between the internal electrode and the external electrode resulting in destruction.

From Table 8, it can be seen that samples Nos. 1, 2 and 15 that were Comparative Examples had the internal electrodes 12 having such a composition as the thermal expansion coefficient $\alpha_1$ of the metal element that constitutes the internal electrode 12 and thermal expansion coefficient $\alpha_2$ of the metal element that constitutes the external electrode 15 were set so that the ratio ($\alpha_1/\alpha_2$) was 1 or higher, and as a result underwent dimensional change of the piezoelectric porcelain in addition to thermal expansion of the internal electrode 12 after continuous operation of the multi-layer piezoelectric actuator. As a result, a large load was applied to the junction between the internal electrode 12 and the external electrode 15 that caused spark between the internal electrode 12 and the external electrode 15, thus resulting in wire breakage during continuous operation. Sample No. 14 showed smaller effective displacement of the multi-layer piezoelectric actuator due to the load acting on the junction.

In sample No. 13 that was Comparative Example, the ratio of the thermal expansion coefficient ($\alpha_1/\alpha_2$) was smaller than 0.9 and therefore contact failure occurred between the internal electrode 12 and the external electrode 15 due to large difference between the thermal expansion coefficient $\alpha_1$ of the metal element that constituted the internal electrode 12 and thermal expansion coefficient $\alpha_2$ of the metal element that constituted the external electrode 15, thus resulting in smaller effective displacement of the multi-layer piezoelectric actuator.

In samples Nos. 3 through 12 that were the multi-layer piezoelectric actuators of Example of the present invention where the ratio ($\alpha_1/\alpha_2$) of thermal expansion coefficients of the internal electrode 12 and the external electrode 15 was not lower than 0.9 and below 1, the amount of displacement did not undergo significant decrease after continuous operation of $1 \times 10^9$ cycles. Thus the multi-layer piezoelectric actuator which exhibited the effective amount of displacement required for the multi-layer piezoelectric actuator and achieved high durability without thermal excursion and malfunction was obtained.

Example 10

In Example 10, state of the intermediate layer 70 being formed was checked and the proportion by which the main component of the external electrode 15 constituted the internal electrode and percentage change in the amount of displacement before and after continuous operation of the multi-layer piezoelectric actuator were measured on the multi-layer piezoelectric actuator of the present invention made by controlling the compositions of metals in the internal electrode 12 and the external electrode 15, while employing the manufacturing method described above.

The external electrode 15 was formed by printing and baking a paste prepared by adding glass flit to the metal compound of the external electrode 15.

When a DC voltage of 170 V was applied to the multi-layer piezoelectric actuators made as described above, displacement of 45 μm in the stacking direction was obtained in all of the multi-layer piezoelectric actuators. Then continuous operation test was conducted on this multi-layer piezoelectric actuator by applying an AC voltage varying between 0 V and +170 V at frequency of 150 Hz at room temperature to undergo 1×10⁹ cycles of operation. Results of the test are shown in Table 9.

TABLE 9

| No. | Ag (% by weight) | Pd (% by weight) | Cu (% by weight) | Ni (% by weight) |
|---|---|---|---|---|
| Metals constituting internal electrode | | | | |
| 1 | 99.99 | 0.01 | 0 | 0 |
| 2 | 99.9 | 0.1 | 0 | 0 |
| 3 | 99 | 1 | 0 | 0 |
| 4 | 98 | 2 | 0 | 0 |
| 5 | 95 | 5 | 0 | 0 |
| 6 | 90 | 10 | 0 | 0 |
| 7 | 85 | 15 | 0 | 0 |
| 8 | 80 | 20 | 0 | 0 |
| 9 | 0 | 0 | 100 | 0 |
| 10 | 0 | 0 | 99.9 | 0.1 |
| 11 | 0 | 0 | 0 | 100 |
| *12 | 0 | 0 | 100 | 0 |
| *13 | 100 | 0 | 0 | 0 |
| Metals constituting external electrode | | | | |
| 1 | 100 | 0 | 0 | 0 |
| 2 | 100 | 0 | 0 | 0 |
| 3 | 100 | 0 | 0 | 0 |
| 4 | 100 | 0 | 0 | 0 |
| 5 | 100 | 0 | 0 | 0 |
| 6 | 100 | 0 | 0 | 0 |
| 7 | 100 | 0 | 0 | 0 |
| 8 | 100 | 0 | 0 | 0 |
| 9 | 10 | 0 | 90 | 0 |
| 10 | 0 | 0 | 100 | 0 |
| 11 | 0 | 0 | 10 | 90 |
| 12 | 100 | 0 | 0 | 0 |
| 13 | 0 | 0 | 100 | 0 |

| No. | Whether intermediate layer is provided (○) or not (x) | Proportion (% by weight) | Initial displacement A (μm) | Maximum displacement after continuous operation B (μm) | Percentage change in displacement (%) |
|---|---|---|---|---|---|
| 1 | ○ | 100 | 45.0 | 44.7 | 0.7 |
| 2 | ○ | 100 | 45.0 | 44.8 | 0.4 |
| 3 | ○ | 99 | 45.0 | 44.9 | 0.2 |
| 4 | ○ | 98 | 45.0 | 45.0 | 0.0 |
| 5 | ○ | 95 | 45.0 | 45.0 | 0.0 |
| 6 | ○ | 90 | 45.0 | 44.8 | 0.4 |
| 7 | ○ | 85 | 45.0 | 44.7 | 0.7 |
| 8 | ○ | 80 | 45.0 | 44.6 | 0.9 |
| 9 | ○ | 100 | 45.0 | 44.9 | 0.2 |
| 10 | ○ | 99.9 | 45.0 | 45.0 | 0.0 |
| 11 | ○ | 100 | 45.0 | 44.8 | 0.4 |
| 12 | x | 0 | 45.0 | Broken | — |
| 13 | x | 0 | 45.0 | Broken | — |

In the column of intermediate layer of Table 9-3, sample provided with the intermediate layer is indicated with (○) and sample without the intermediate layer is indicated with (x).

The column of proportion shows the proportion (% by weight) by which the main component of the external electrode constituted the internal electrode.

The column of initial displacement A (μm) shows the displacement A (μm) in the initial state before continuous operation.

The column of maximum displacement after continuous operation B (μm) shows the maximum displacement (μm) after continuous operation of 1×10⁹ cycles.

The column of percentage change in displacement (%) shows the ration of maximum displacement after continuous operation B to the displacement A (μm) in the initial state (|(A−B)/A×100|).

Entry of "Broken" means that spark occurred between the internal electrode and the external electrode resulting in destruction.

From Table 9, it can be seen that samples Nos. 12 and 13 that were Comparative Examples had such constitutions as the intermediate layer was not formed and the composition of metal constituting the internal electrode 12 and the composition of metal constituting the external electrode 15 did not resemble each other, and therefore a large load was applied to the junction between the internal electrode 12 and the external electrode 15 that caused spark between the internal electrode 12 and the external electrode 15, thus resulting in wire breakage during continuous operation.

In samples Nos. 1 through 11 that were Examples of the present invention, in contrast, since the intermediate layer was formed and the composition of metal constituting the internal electrode 12 and the composition of metal constituting the external electrode 15 resembled each other, the amount of displacement did not undergo significant decrease after continuous operation of 1×10⁹ cycles. Thus the multi-layer piezoelectric actuator which exhibited the effective amount of displacement required for the multi-layer piezoelectric actuator and achieved high durability without thermal excursion and malfunction was obtained.

Example 11

In Example 11, maximum percentage change in the amount of displacement after continuous operation of the multi-layer piezoelectric actuator was measured and the relationship between the composition of the internal electrode 12 and the degree of deterioration of the multi-layer piezoelectric actuator after continuous operation was investigated on the multi-layer piezoelectric actuators having the internal electrodes 12 formed from materials of various compositions according to the manufacturing method described above.

The degree of deterioration was determined by measuring the maximum amount of displacement when operating the multi-layer piezoelectric actuator for an arbitrary number of cycles and the amount of displacement after operating the multi-layer piezoelectric actuator for a predetermined number of cycles, and taking the ratio of the amount of displacement after continuous operation of the device to the maximum amount of displacement during continuous operation of the device as the degree of deterioration. This indicates the deterioration caused by operating the multi-layer piezoelectric actuator for a predetermined number of cycles.

When a DC voltage of 170 V was applied to the multi-layer piezoelectric actuators made as described above, displacement of 45 μm in the stacking direction was obtained in all of the multi-layer piezoelectric actuators. Then continuous operation test was conducted on this multi-layer piezoelectric actuator by applying an AC voltage varying between 0 V and +170 V at frequency of 150 Hz at room temperature to undergo 1×10⁹ cycles of operation. Results of the test are shown in Table 9.

TABLE 10

| No. | Pd (% by weight) | Ag (% by weight) | Cu (% by weight) | Ni (% by weight) | Percentage change in displacement (%) | Degree of deterioration (%) |
|---|---|---|---|---|---|---|
| 1 | 0 | 100 | 0 | 0 | Broken | — |
| 2 | 0.001 | 99.999 | 0 | 0 | 0.7 | 0.22 |
| 3 | 0.01 | 99.99 | 0 | 0 | 0.7 | 0.22 |
| 4 | 0.1 | 99.9 | 0 | 0 | 0.4 | 0.22 |

TABLE 10-continued

| No. | Pd (% by weight) | Ag (% by weight) | Cu (% by weight) | Ni (% by weight) | Percentage change in displacement (%) | Degree of deterioration (%) |
|---|---|---|---|---|---|---|
| 5 | 0.5 | 99.5 | 0 | 0 | 0.2 | 0.00 |
| 6 | 1 | 99 | 0 | 0 | 0.2 | 0.00 |
| 7 | 2 | 98 | 0 | 0 | 0 | 0.00 |
| 8 | 4 | 95 | 1 | 0 | 0 | 0.00 |
| 9 | 5 | 95 | 0 | 0 | 0 | 0.00 |
| 10 | 8 | 92 | 0 | 0 | 0 | 0.00 |
| 11 | 9 | 91 | 0 | 0 | 0.2 | 0.00 |
| 12 | 9.5 | 90.5 | 0 | 0 | 0.2 | 0.00 |
| 13 | 10 | 90 | 0 | 0 | 0.4 | 0.22 |
| 14 | 15 | 85 | 0 | 0 | 0.7 | 0.22 |
| 15 | 0 | 0 | 100 | 0 | 0.2 | 0.00 |
| 16 | 0 | 0 | 99.9 | 0.1 | 0 | 0.00 |
| 17 | 0 | 0 | 0 | 100 | 0.4 | 0.22 |
| 18 | 20 | 80 | 0 | 0 | 0.9 | 0.45 |
| 19 | 30 | 70 | 0 | 0 | 0.9 | 0.45 |

Columns of Pd (% by weight), Ag (% by weight), Cu (% by weight) and Ni (% by weight) in Table 10 show the proportions of metals of the internal electrode.

Percentage change in displacement (%) is the ratio of change in the amount of displacement shown after continuous operation to the initial displacement.

"Broken" means that the sample was destroyed by migration.

As shown in Table 10, sample No. 1 of which the internal electrode 12 was formed from 100% silver experienced silver migration which caused a large load to be applied to the junction between the internal electrode 12 and the external electrode 15 that lead to spark between the internal electrode 12 and the external electrode 15, thus resulting in wire breakage during continuous operation.

Samples Nos. 18 and 19 where the metal compound included in the internal electrode 12 included more than 15% by weight of group 8 to group 10 metal and less than 85% by weight of group 11 metal, showed increasing deterioration that resulted in low durability of the multi-layer piezoelectric actuator.

Samples Nos. 2 through 16, where the internal electrode 12 included as the main component the metal compound having such a composition as the proportion M1 (W by weight) of the group 8 to group 10 metal and the proportion M2 of the group 11 metal satisfied the relations 0<M1≦15, 85≦M2≦100 and M1+M2=100, showed low specific resistance of the internal electrode 12 and were capable of suppressing heat generation from the internal electrode 12 even when subjected to continuous operation, thus making it possible to provide the multi-layer piezoelectric actuator having stable amount of displacement.

The present invention is not limited to Example described above, and various modifications may be made within the scope of the present invention.

The invention claimed is:

1. A multi-layer piezoelectric element comprising:
   a stack formed by stacking at least one piezoelectric layer and a plurality of internal electrodes consisting of first and second internal electrodes alternately one on another;
   a first external electrode which is formed on a first side face of the stack and is connected to the first internal electrode; and
   a second external electrode which is formed on a second side face of the stack and is connected to the second internal electrode,
   wherein an opposed portion in which the first internal electrode and the second internal electrode oppose each other has a configuration not in line symmetry.

2. The multi-layer piezoelectric element according to claim 1,
   wherein the opposed portion has a configuration of point symmetry.

3. The multi-layer piezoelectric element according to claim 1,
   wherein each of the first internal electrodes has a end portion located away from one side face to be insulated from the second external electrode formed on said one side face, and
   wherein each of the second internal electrodes has a end portion located away from the other side face to be insulated from the first external electrode formed on said other side face.

4. The multi-layer piezoelectric element as in claim 1,
   wherein a distance between the first internal electrode and the second external electrode is set in a range from 0.1 to 5 mm, and a distance between the second internal electrode and the first external electrode is set in a range from 0.1 to 5 mm.

5. The multi-layer piezoelectric element as in claim 1,
   wherein a part of the first internal electrode is exposed on one side face of the stack on which the second external electrode is formed and a shortest distance between the exposed part of the first internal electrode and the second external electrode on said one side face of the stack is set in a range from 0.1 to 5 mm,
   wherein a part of the second internal electrode is exposed on the other side face of the stack on which the first external electrode is formed and a shortest distance between the exposed part of the second internal electrode and the first external electrode on said other side face of the stack is set in a range from 0.1 to 5 mm.

* * * * *